(12) United States Patent
Takahashi et al.

(10) Patent No.: US 7,825,446 B2
(45) Date of Patent: Nov. 2, 2010

(54) SEMICONDUCTOR DEVICE, SEMICONDUCTOR WAFER STRUCTURE AND METHOD FOR MANUFACTURING THE SEMICONDUCTOR WAFER STRUCTURE

(75) Inventors: Yasufumi Takahashi, Kawasaki (JP); Kenichiro Kajio, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1 day.

(21) Appl. No.: 12/175,039

(22) Filed: Jul. 17, 2008

(65) Prior Publication Data
US 2008/0277705 A1  Nov. 13, 2008

Related U.S. Application Data

(63) Continuation of application No. PCT/JP2006/300614, filed on Jan. 18, 2006.

(51) Int. Cl.
H01L 29/92 (2006.01)
(52) U.S. Cl. .............. 257/295; 257/296; 257/306; 257/E27.104; 257/278; 257/758; 257/774; 257/E21.008; 257/E29.342; 438/3
(58) Field of Classification Search .............. 257/295, 257/E29.342, E21.008, 296, 306, 758, 774, 257/E27.104; 438/3
See application file for complete search history.

(56) References Cited

U.S. PATENT DOCUMENTS

| 6,635,528 | B2 * | 10/2003 | Gilbert et al. ............... 438/253 |
| 6,870,265 | B2 | 3/2005 | Kurimoto et al. |
| 6,998,712 | B2 * | 2/2006 | Okada et al. ............... 257/758 |
| 7,288,799 | B2 | 10/2007 | Saigoh et al. |
| 2003/0071293 | A1 | 4/2003 | Otani et al. |
| 2005/0127395 | A1 | 6/2005 | Saigoh et al. |

FOREIGN PATENT DOCUMENTS

| JP | 60-241229 A | 11/1985 |
| JP | 62-261139 A | 11/1987 |
| JP | 2-235356 A | 9/1990 |

(Continued)

OTHER PUBLICATIONS

International Search Report of PCT/JP2006/300614, date of mailing Feb. 28, 2006.

*Primary Examiner*—Wael M Fahmy
*Assistant Examiner*—Marc Armand
(74) *Attorney, Agent, or Firm*—Fujitsu Patent Center

(57) ABSTRACT

There is provided a semiconductor device including, a semiconductor substrate having a circuit forming region and a peripheral region, a base insulating film formed over the semiconductor substrate, a capacitor formed of a lower electrode, a capacitor dielectric film made of a ferroelectric material, and an upper electrode in this order over the base insulating film in the circuit forming region, an uppermost interlayer insulating film formed over the capacitor, a seal ring formed over the semiconductor substrate in the peripheral region, the seal ring having a height that reaches at least the upper surface of the interlayer insulating film, and surrounding the circuit forming region, a block film formed over the seal ring and over the interlayer insulating film in the circumference of the seal ring, and an electrode conductor pattern which is formed over the interlayer insulating film in the peripheral region, the electrode conductor pattern having an electrode pad, and having a cross-section exposed to a dicing surface.

20 Claims, 44 Drawing Sheets

FOREIGN PATENT DOCUMENTS

| | | |
|---|---|---|
| JP | 5-299484 A | 11/1993 |
| JP | 7-111282 A | 4/1995 |
| JP | 9-330963 A | 12/1997 |
| JP | 2917362 B2 | 4/1999 |
| JP | 2001-274338 A | 10/2001 |
| JP | 2003-86590 A | 3/2003 |
| JP | 2003-92353 A | 3/2003 |
| JP | 2003-197878 A | 7/2003 |
| JP | 2004-296775 A | 10/2004 |
| JP | 2004-297022 A | 10/2004 |
| JP | 2005-175204 A | 6/2005 |

\* cited by examiner

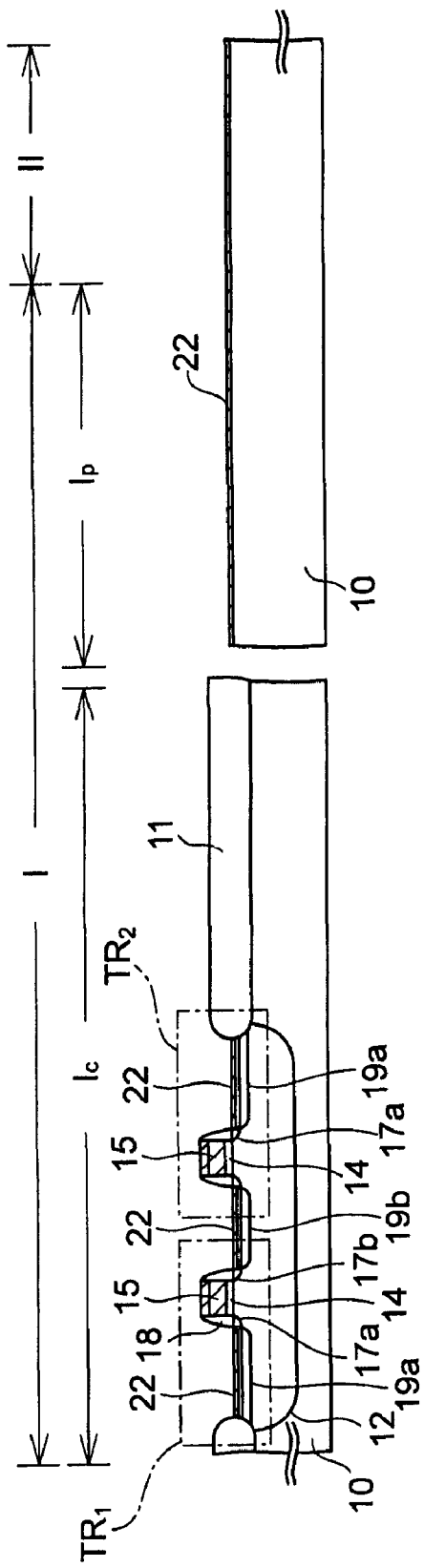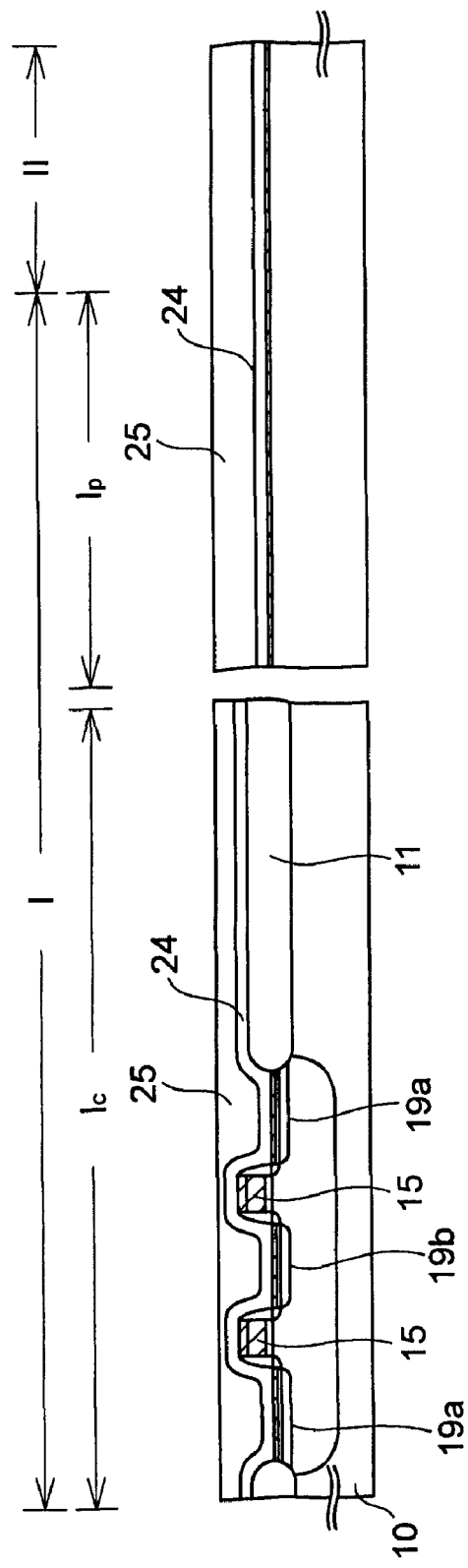

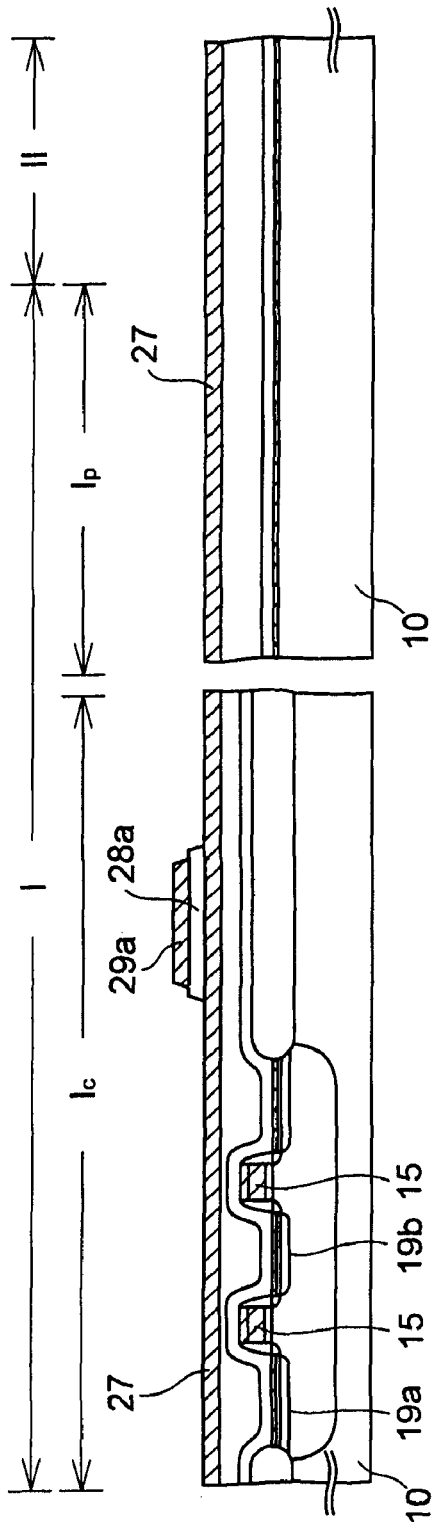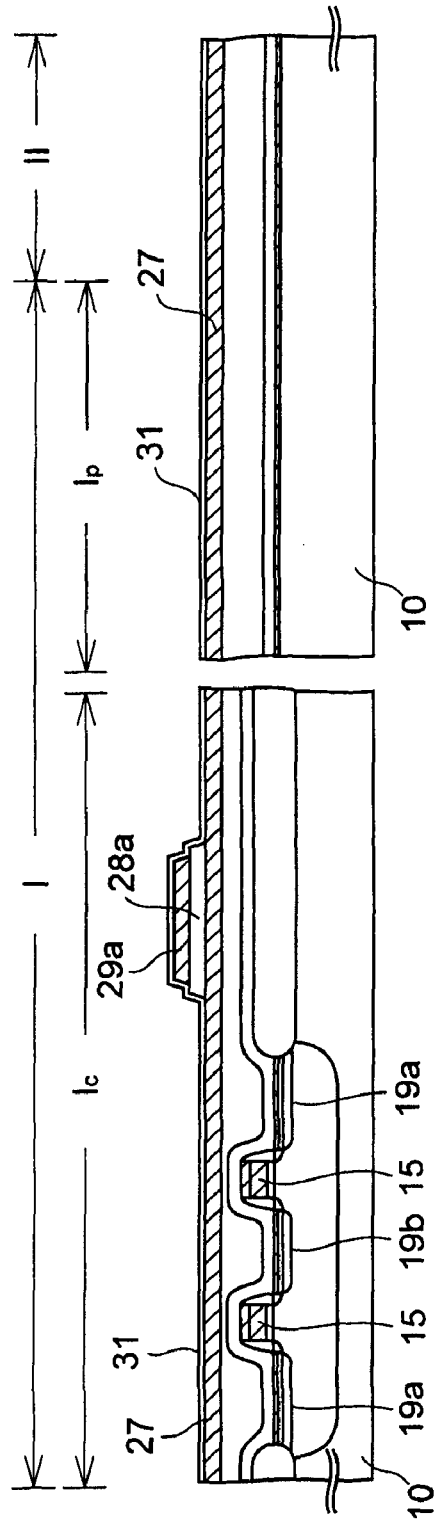

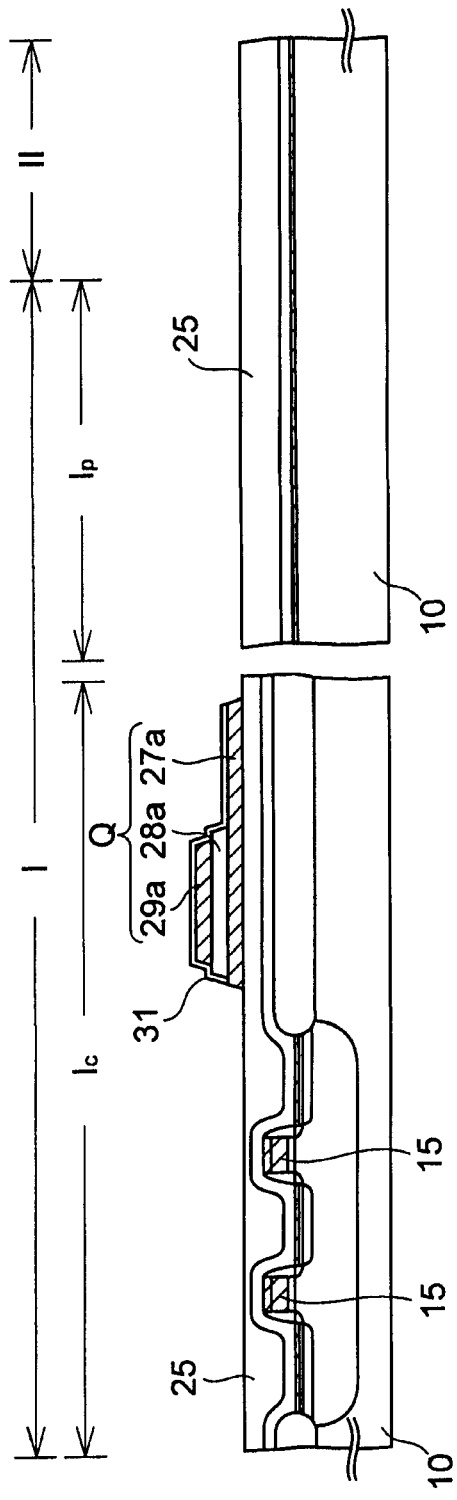
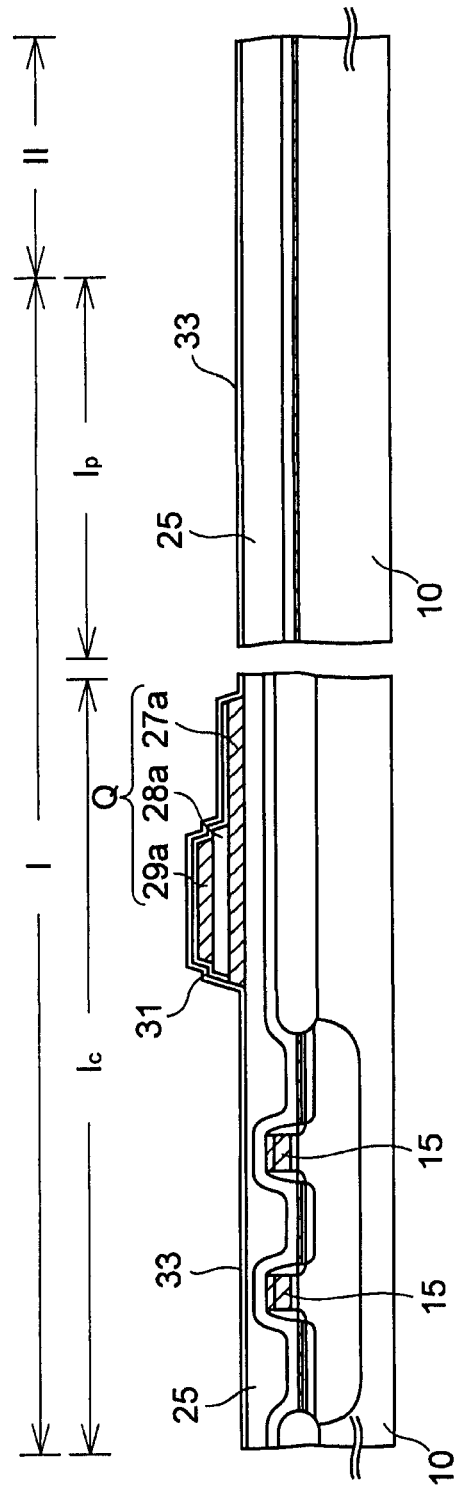
FIG. 1G
FIG. 1H

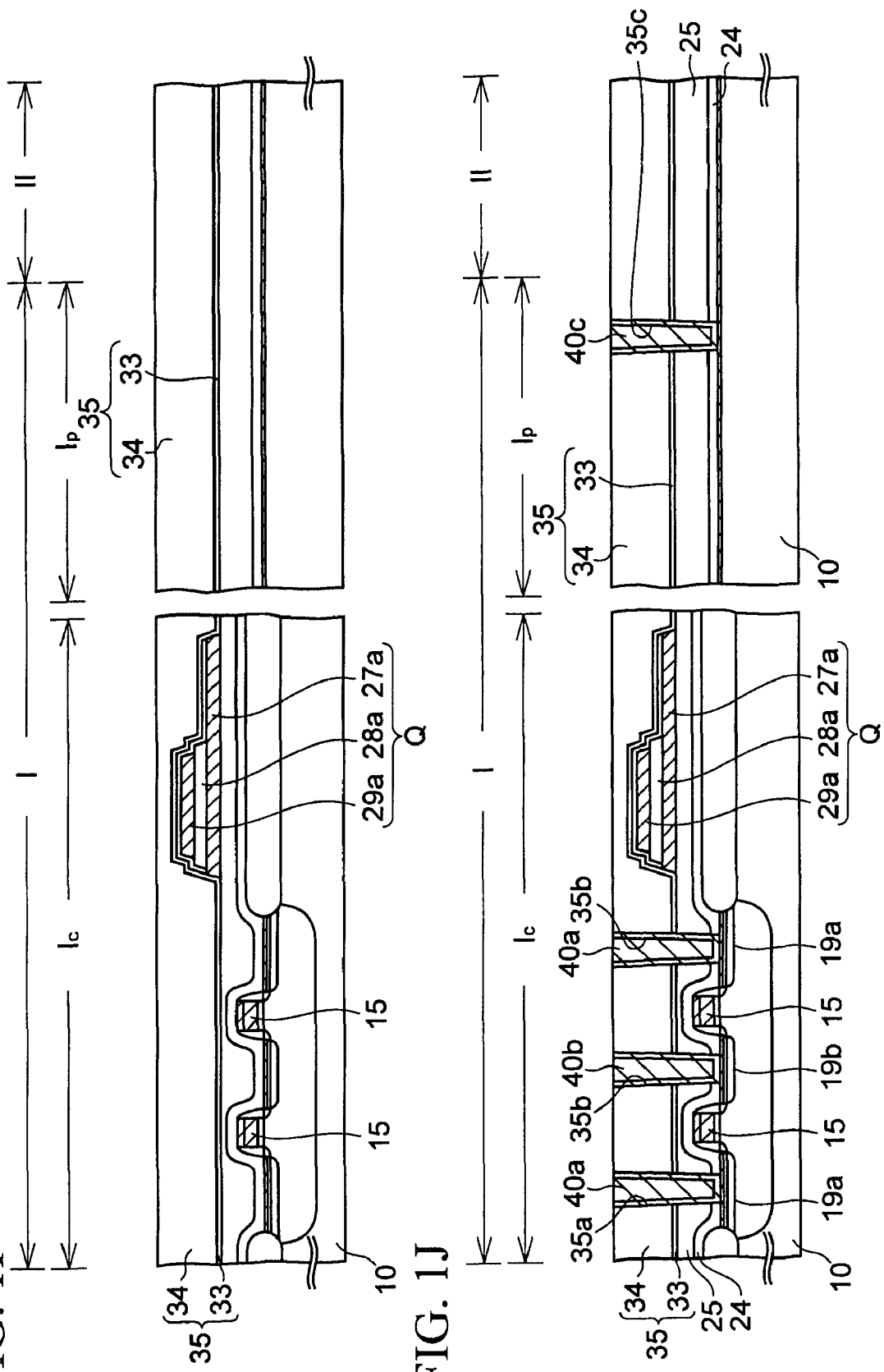

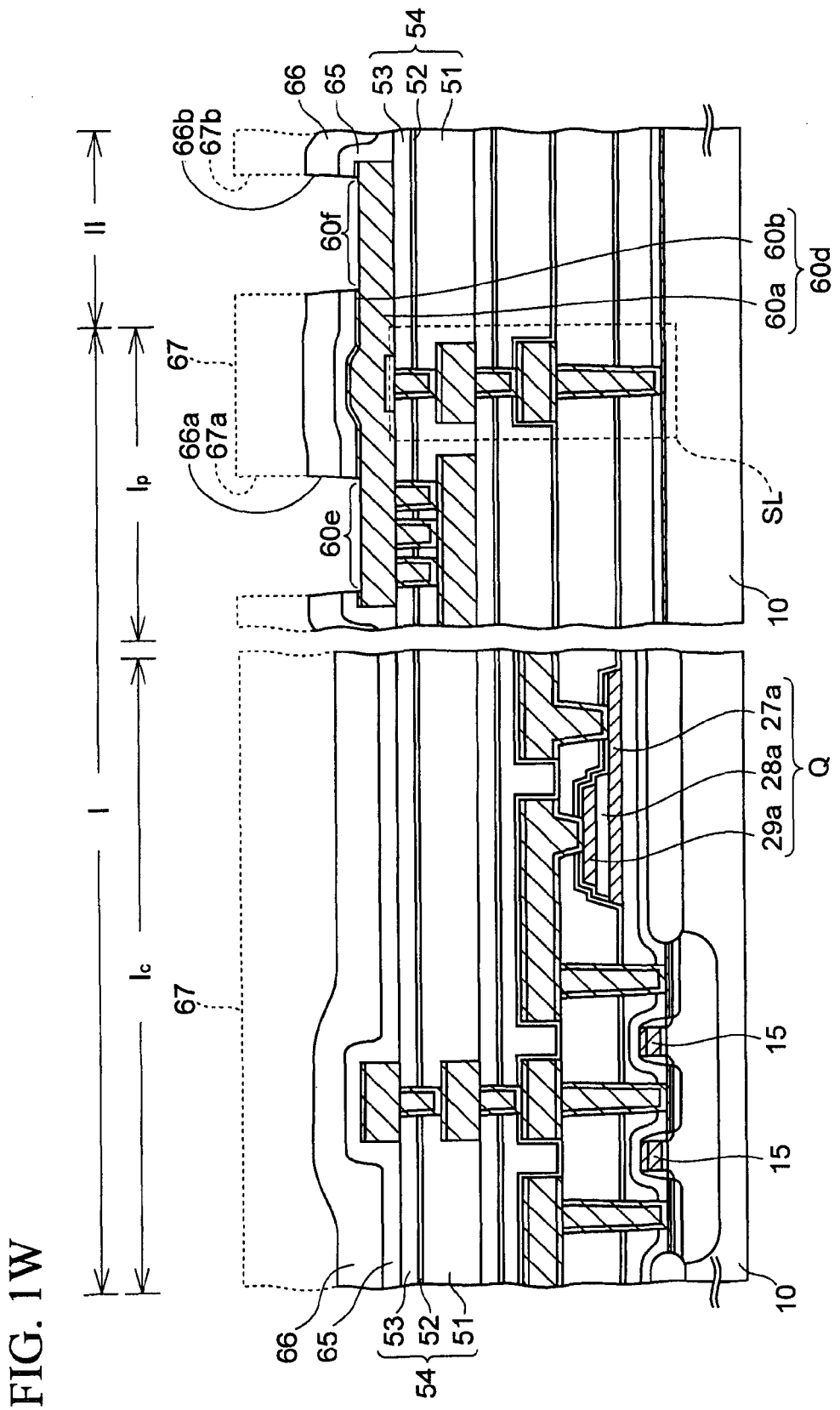

US 7,825,446 B2

SEMICONDUCTOR DEVICE, SEMICONDUCTOR WAFER STRUCTURE AND METHOD FOR MANUFACTURING THE SEMICONDUCTOR WAFER STRUCTURE

CROSS-REFERENCE TO RELATED APPLICATIONS

This application is a continuation of prior International Patent Application No. PCT/JP2006/300614, filed Jan. 18, 2006, the entire contents of which are incorporated herein by reference.

TECHNICAL FIELD

It is related to a semiconductor device, a semiconductor wafer structure, and a method for manufacturing the semiconductor wafer structure.

BACKGROUND

Flash memories and ferroelectric memories are well-known as nonvolatile memories capable of retaining stored information even after a power supply is turned off.

Of these, the flash memories include a floating gate that is embedded in a gate insulating film of an insulated gate field effect transistor (IGFET). The flash memories store information by accumulating, in this floating gate, electric charges indicating the information to be stored. However, it is required for such flash memories that a tunnel current be applied to the gate insulating film at the time of writing and erasing the information. Thus, there is a drawback that the flash memories require relatively high voltage.

On the other hand, the ferroelectric memories, which are also referred to as ferroelectric random access memories (FeRAMs), store information by utilizing the hysteresis characteristic of a ferroelectric film provided in a ferroelectric capacitor. The ferroelectric film causes polarization in response to the voltage applied between upper and lower electrodes of the capacitor, and spontaneous polarization remains even after the voltage is turned off. When the polarity of the applied voltage is reversed, the spontaneous polarization is also reversed. Directions of the spontaneous polarization are associated with "1" and "0", so that the information is written in the ferroelectric film. The voltage required for the FeRAMs to carry out writing is lower than that for the flash memories. In addition, there is also an advantage in that the FeRAMs are capable of writing at a higher rate than the flash memories. Furthermore, the FeRAM is also advantageous because high integration and high durability can be achieved.

In a ferroelectric capacitor provided to a FeRAM, a material used for the ferroelectric film of the capacitor is a ferroelectric oxide with a perovskite structure, such as a PZT(Pb (Zr, Ti) $O_3$) film or SBT($SrBi_2Ta_2O_9$), and the amount of residual polarization charge of these ferroelectric oxides are as high as approximately 10 $\mu C/cm^2$ to 30 $\mu C/cm^2$.

When the ferroelectric oxide is exposed to reducing materials, such as hydrogen or moisture, oxygen in the film is reduced to cause the shortage of oxygen. Thus, the crystallinity of the ferroelectric oxide is deteriorated, and the ferroelectric characteristic of the ferroelectric capacitor, such as the amount of residual polarization charge, is deteriorated.

In the processes of manufacturing a semiconductor device such as a FeRAM, a required circuit is formed on the semiconductor substrate, and thereafter the semiconductor substrate is subjected to dicing, so that semiconductor chips are separated. At this time, the cross-section of the interlayer insulating film is exposed to the dicing surface of the semiconductor chip, and moisture in the external atmosphere enters the semiconductor chip from the cross-section. Consequently, the ferroelectric capacitor is caused to be easily deteriorated by the moisture.

For this reason, to provide a FeRAM with high quality, it is important that reducing materials entering the semiconductor chip from the outside after dicing are effectively blocked in order not to allow the reducing materials to deteriorate the ferroelectric capacitor.

As a structure to increase moisture resistance of the semiconductor chip after dicing, there is known a so-called seal ring. The seal ring is a ring-like structure that surrounds the circuits and bonding pads in the circumference of the semiconductor chip, and functions to block moisture from the outside.

One example of such seal rings is disclosed in Japanese Patent Application Publications No. 2004-297022 (patent literature 1) and No. 2005-175204 (patent literature 2).

Incidentally, in the processes of manufacturing the semiconductor device, a test probe is brought into contact with the bonding pad to test electric characteristics in a wafer state before the semiconductor substrate is subjected to dicing to be cut into semiconductor chips.

The seal ring disclosed in the patent literatures 1 and 2 has an effect of blocking moisture to some extent. However, it is likely that damages and cracks of the bonding pad would be caused by the test probe. Thus, it is likely that a penetration path of moisture, which extends from the circumference of the bonding pad to the ferroelectric capacitor, would be formed during testing electric characteristics at a wafer level. In addition, there also causes a disadvantage that a bonding wire, such as a gold wire, is easily separated from the bonding pad due to the damages of the bonding pad.

In light of the foregoing problem, in Japanese Unexamined Patent Application Publication No. Sho 60-241229 (patent literature 3), Hei 2-235356 (patent literature 4), and No. Hei 5-299484 (patent literature 5), and Japanese Patent Application Publications No. Hei 9-330963 (patent literature 6), a test pad and a bonding pad are formed separately. Then, during the test at a wafer level, the probe is brought into contact with only the test pad, so that damages would not be caused in the bonding pad during the test.

However, in the patent literatures 3 to 6, improvement of moisture resistance of the semiconductor chip is not considered at all.

In addition to the above-described patent literatures 1 to 6, a technique relating to the present application is also disclosed in Japanese Patent Application Publication No. 2004-296775, Japanese Patent No. 2917362, and Japanese Patent Application Publication No. 2003-92353.

SUMMARY

It is an aspect of the embodiment discussed herein to provide a semiconductor device including a semiconductor substrate having a circuit forming region and a peripheral region, a base insulating film formed over the semiconductor substrate, a capacitor formed of a lower electrode, a capacitor dielectric film made of a ferroelectric material, and an upper electrode in this order over the base insulating film in the circuit forming region, an uppermost interlayer insulating film formed over the capacitor, a seal ring formed over the semiconductor substrate in the peripheral region, the seal ring having a height that reaches at least an upper surface of the interlayer insulating film, and surrounding the circuit forming region, a block film formed over the seal ring and the interlayer insulating film in the circumference of the seal ring, and an electrode conductor pattern which is formed over the interlayer insulating film in the peripheral region, the electrode conductor pattern having an electrode pad, and having a cross-section exposed to a dicing surface

DETAILED DESCRIPTION OF THE EMBODIMENTS

Embodiments will be described below in detail by referring to the accompanying drawings.

(1) First Embodiment

Figure 1C:
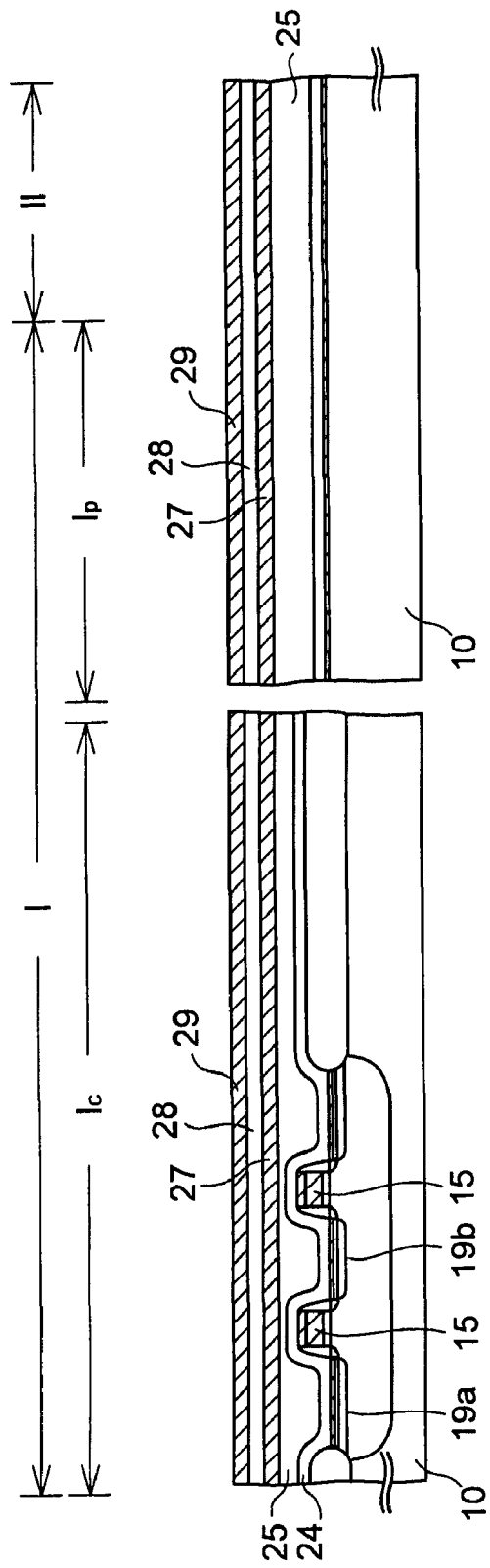
FIGS. 1A to 1X are cross-sectional views showing processes of manufacturing a semiconductor wafer structure according to a first embodiment.
Figure 1D:
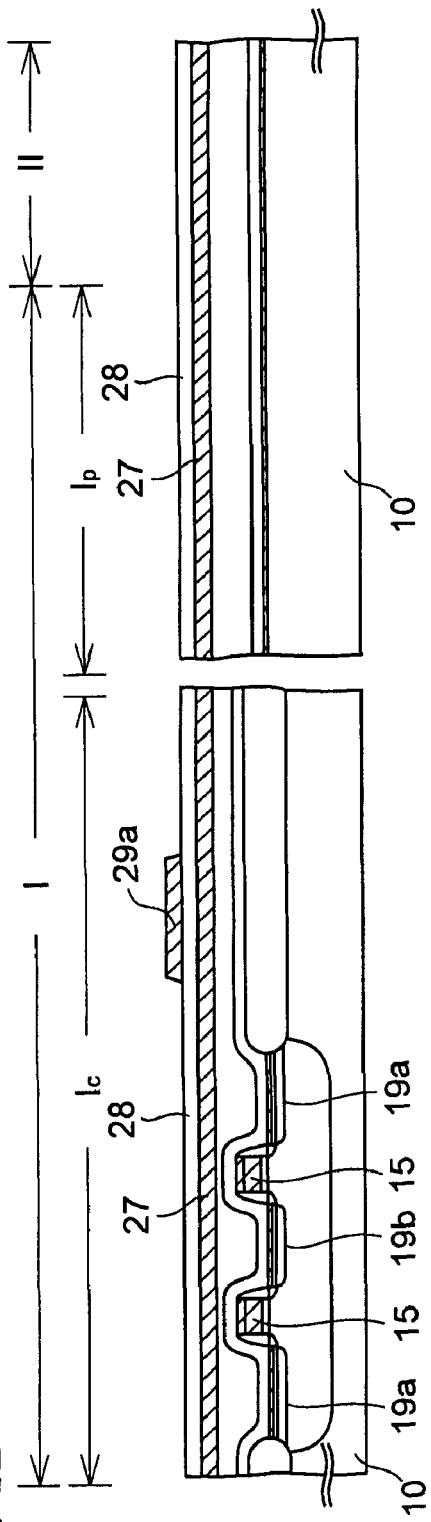
Figure 1K:
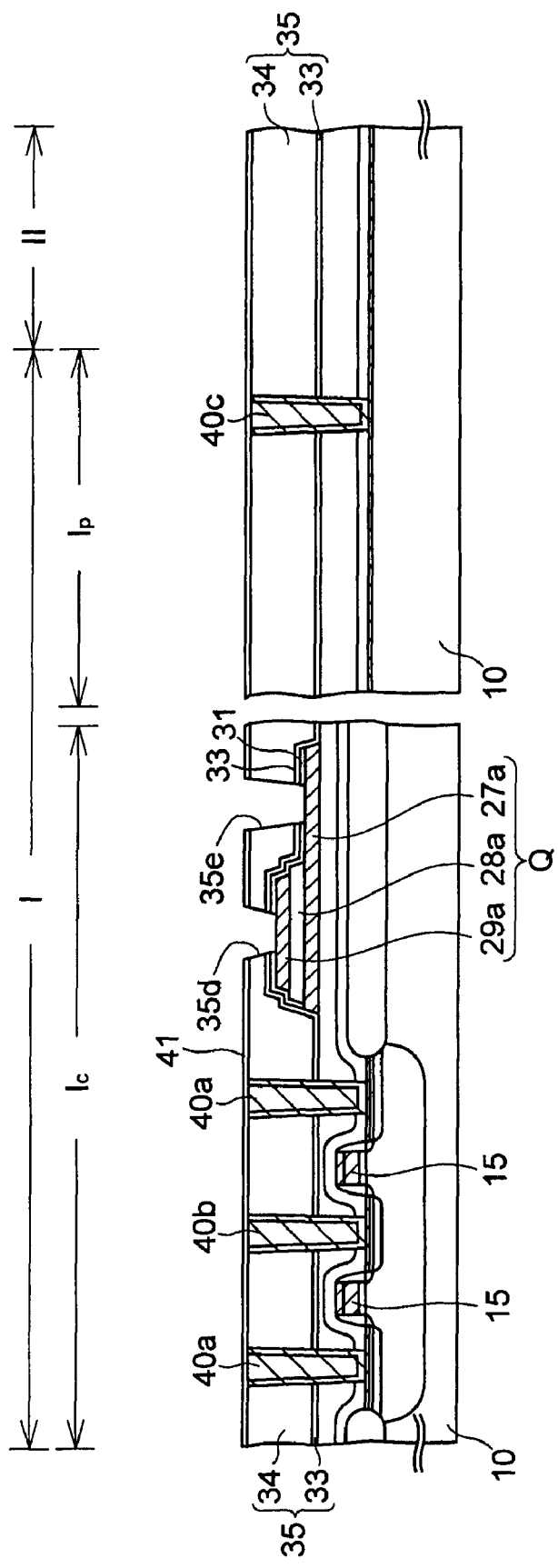
Figure 1L:
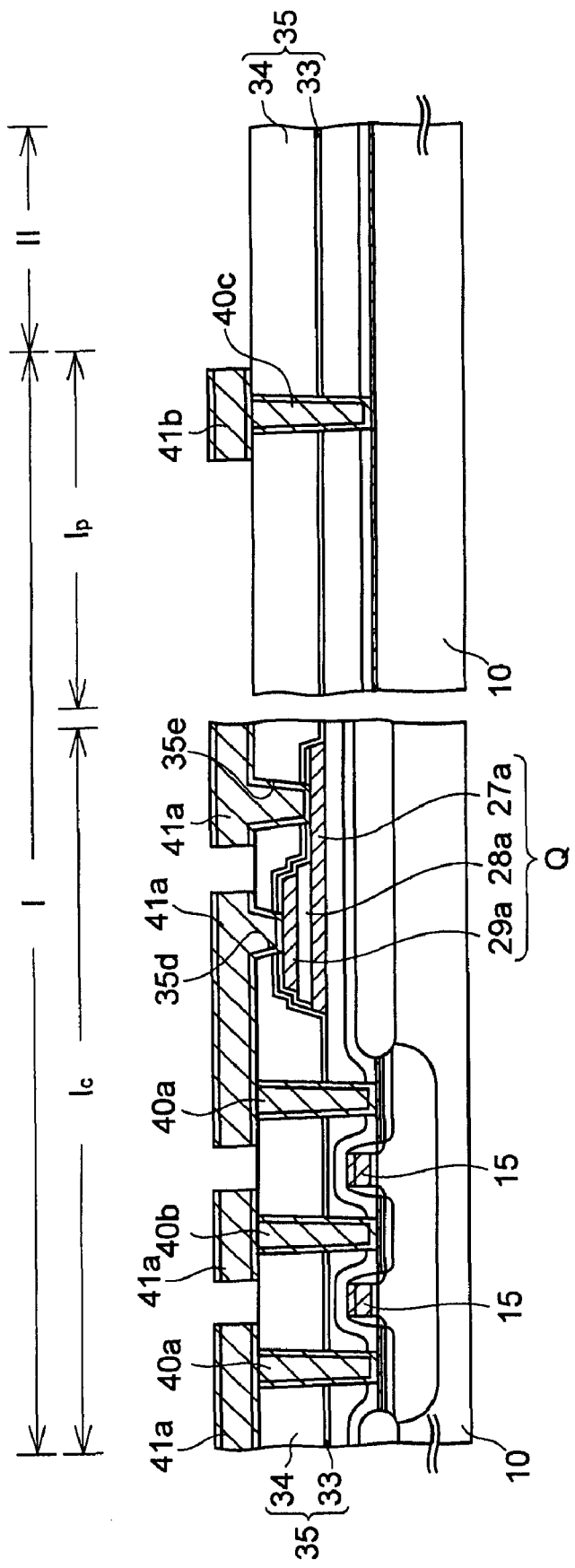
Figure 1M:
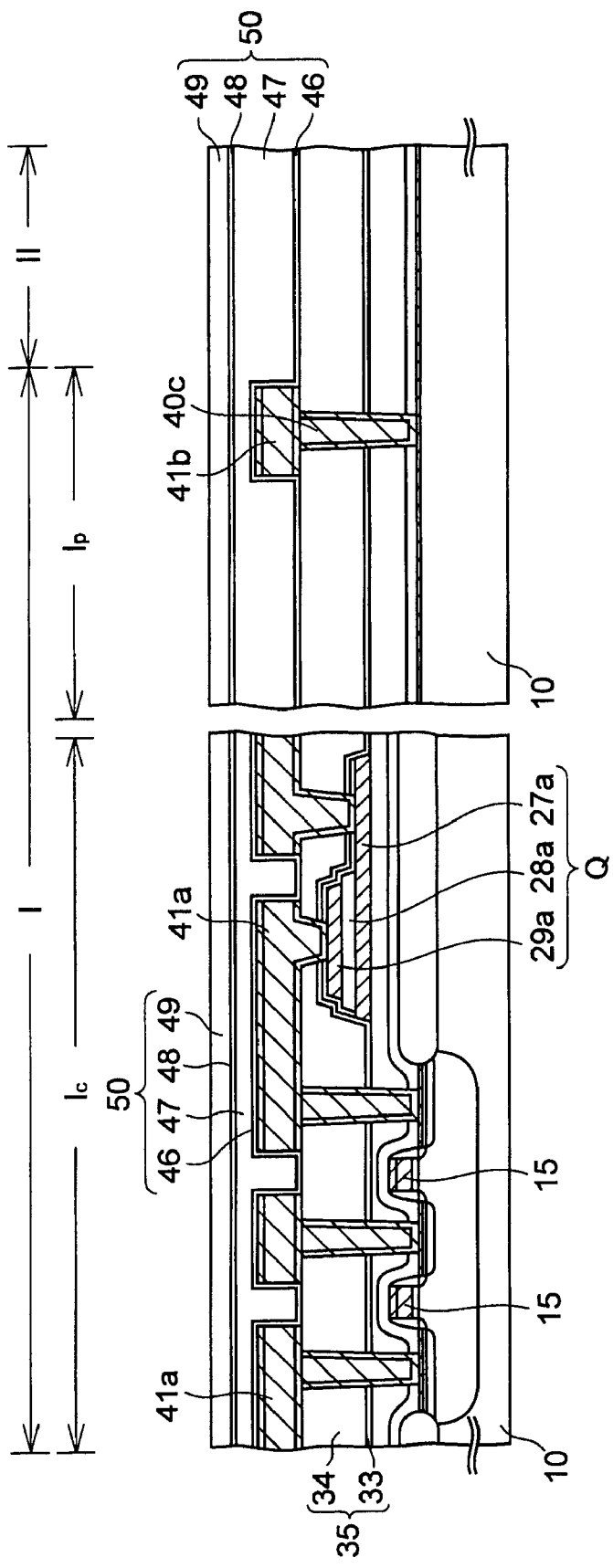
Figure 1N:
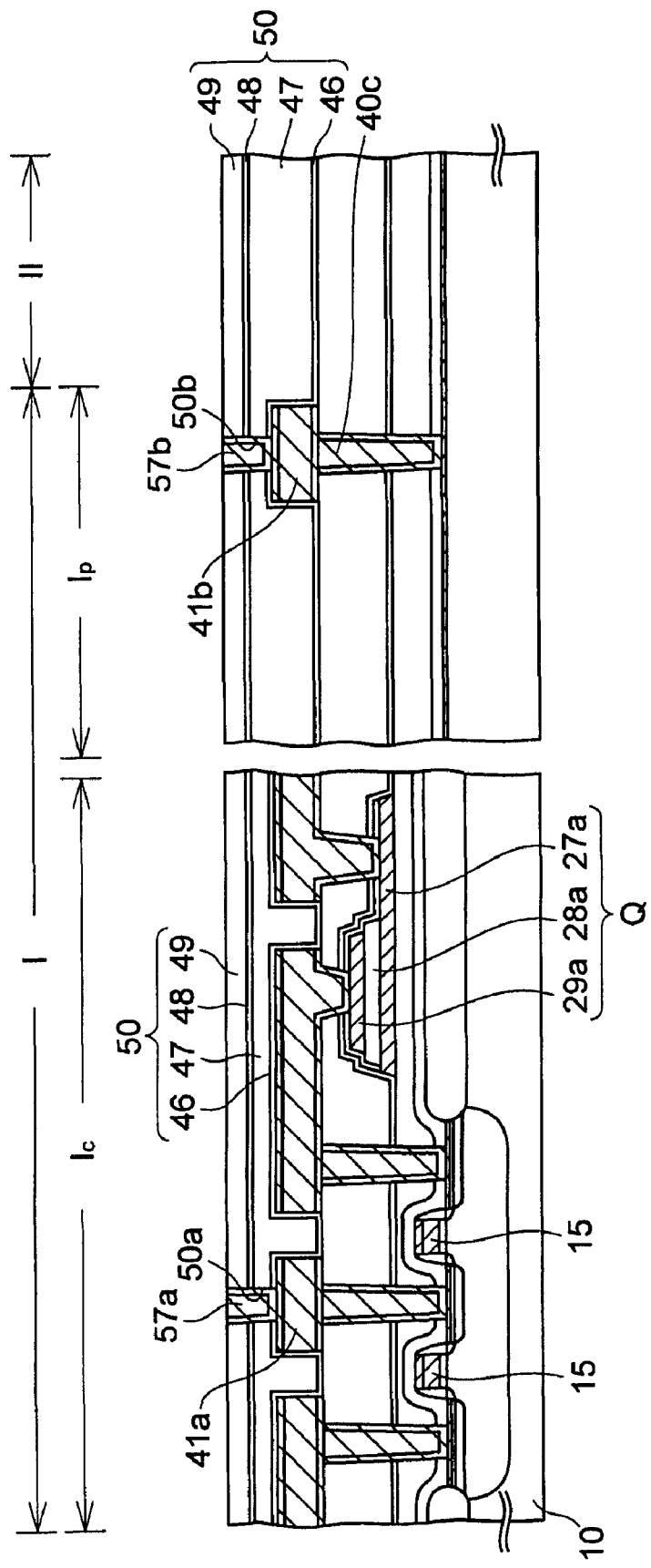
Figure 1P:
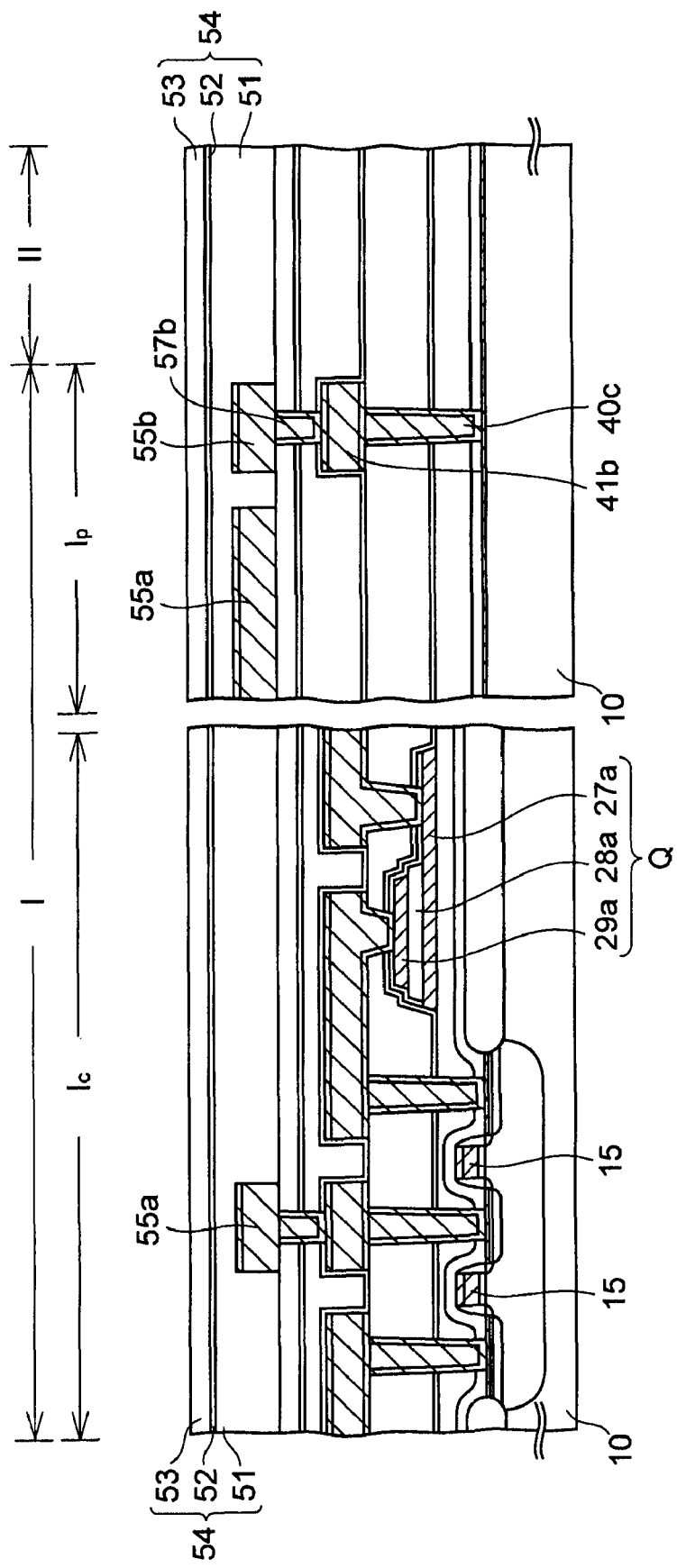
Figure 1Q:
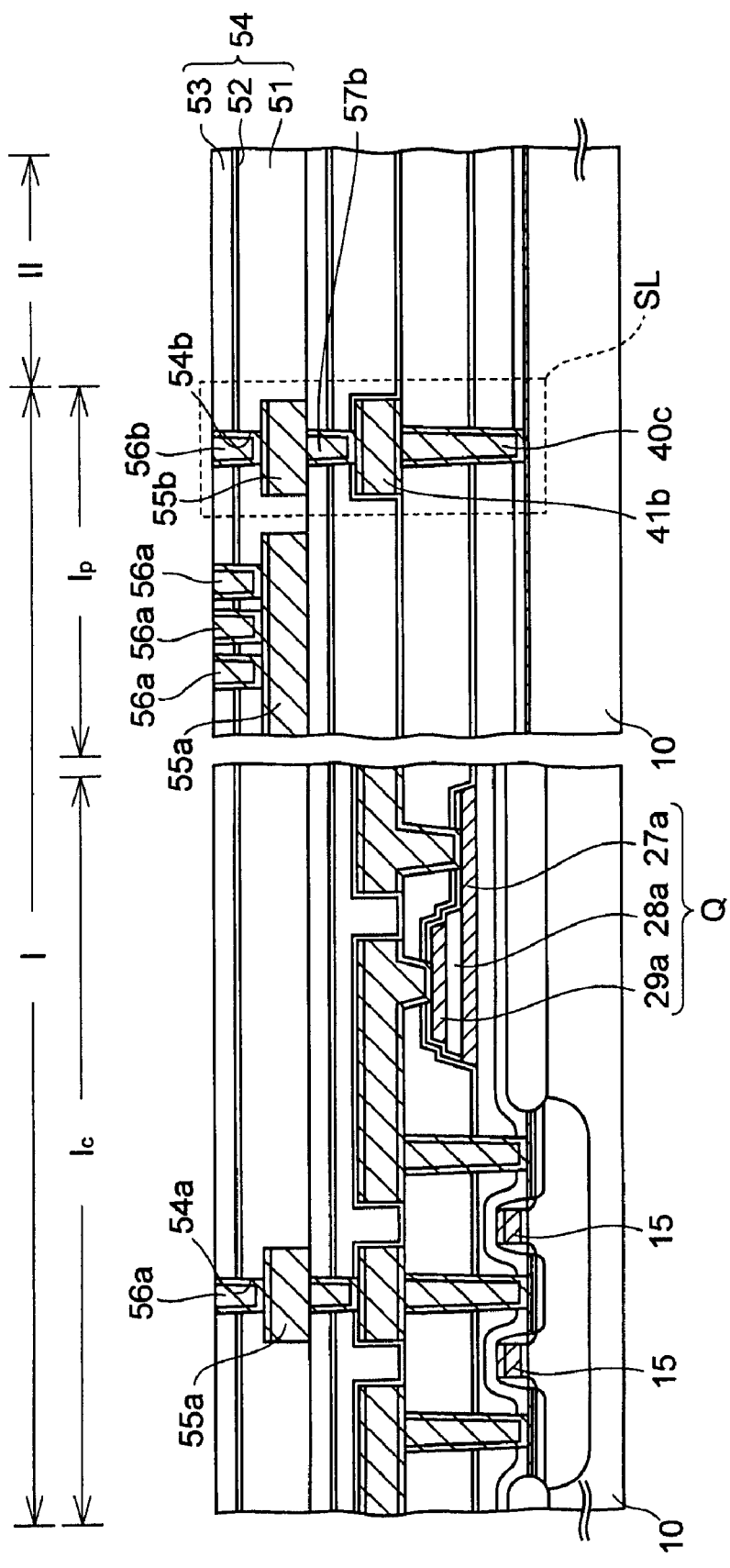
Figure 1R:
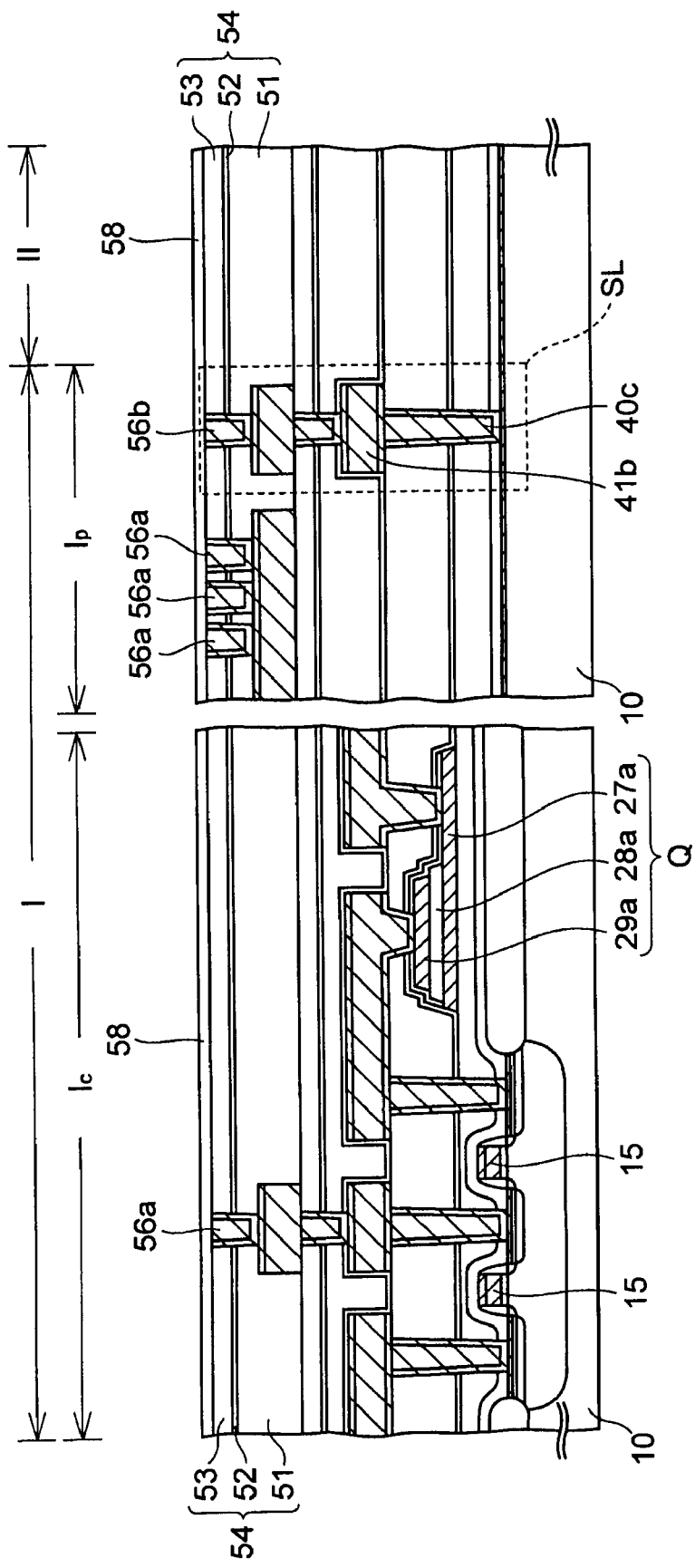
Figure 1S:
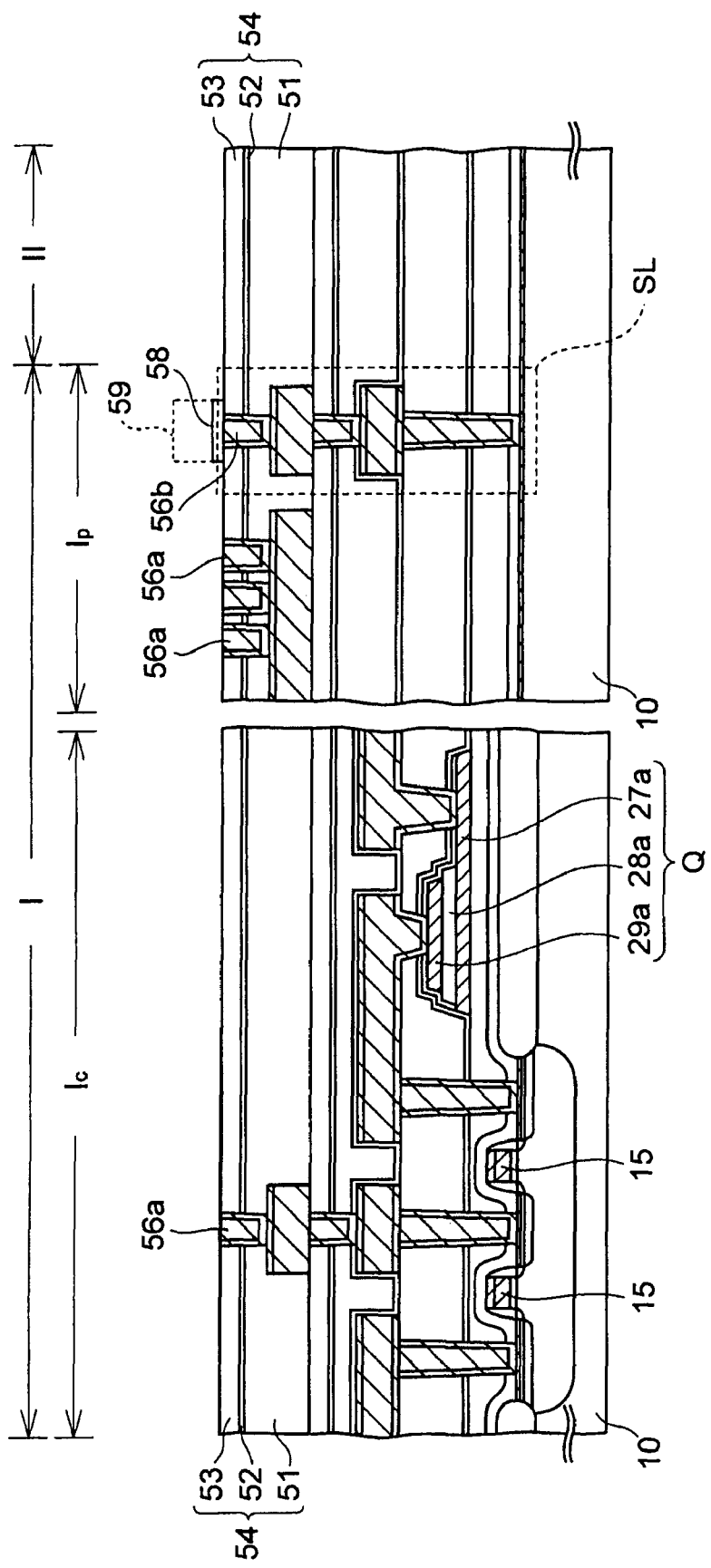
Figure 1T:
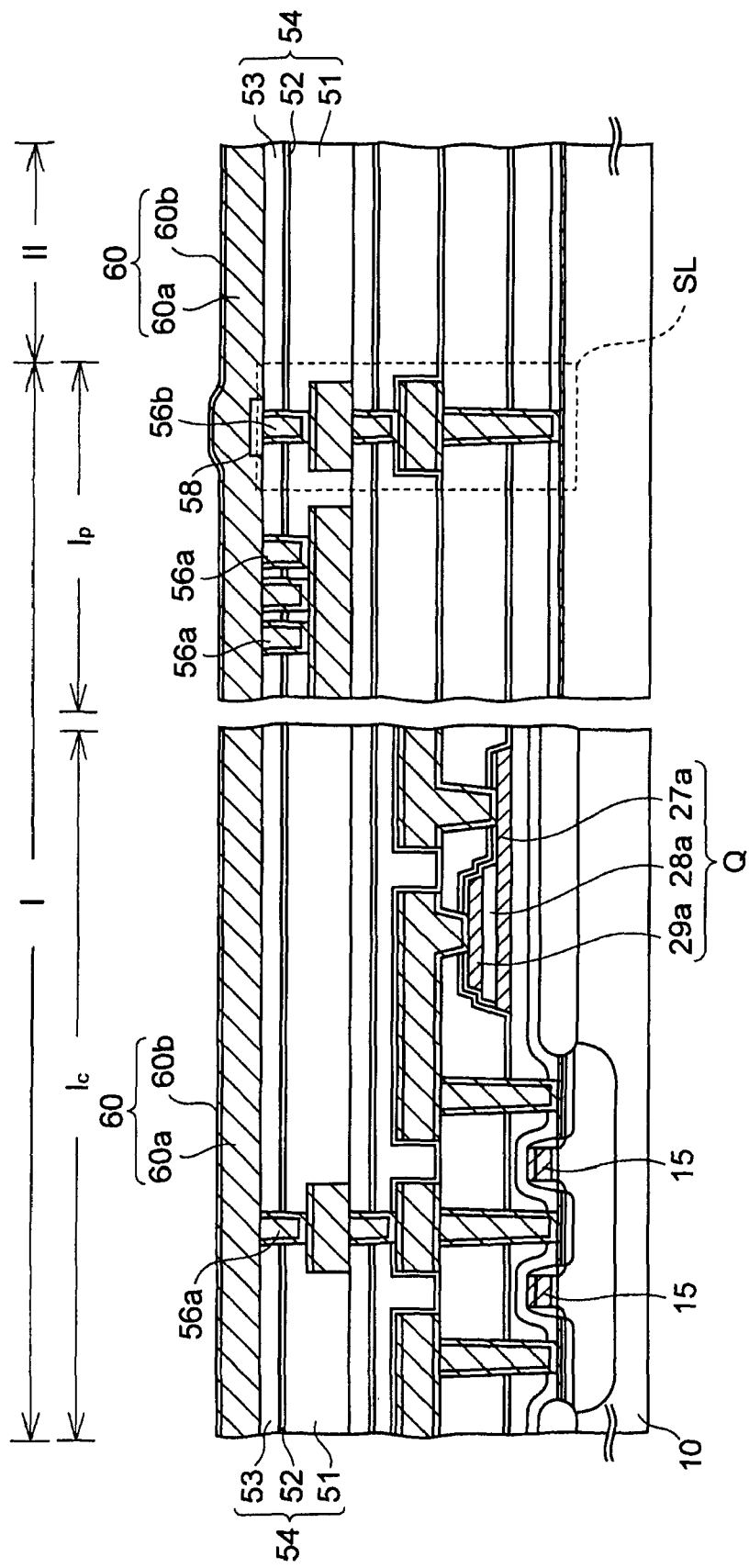
Figure 1U:
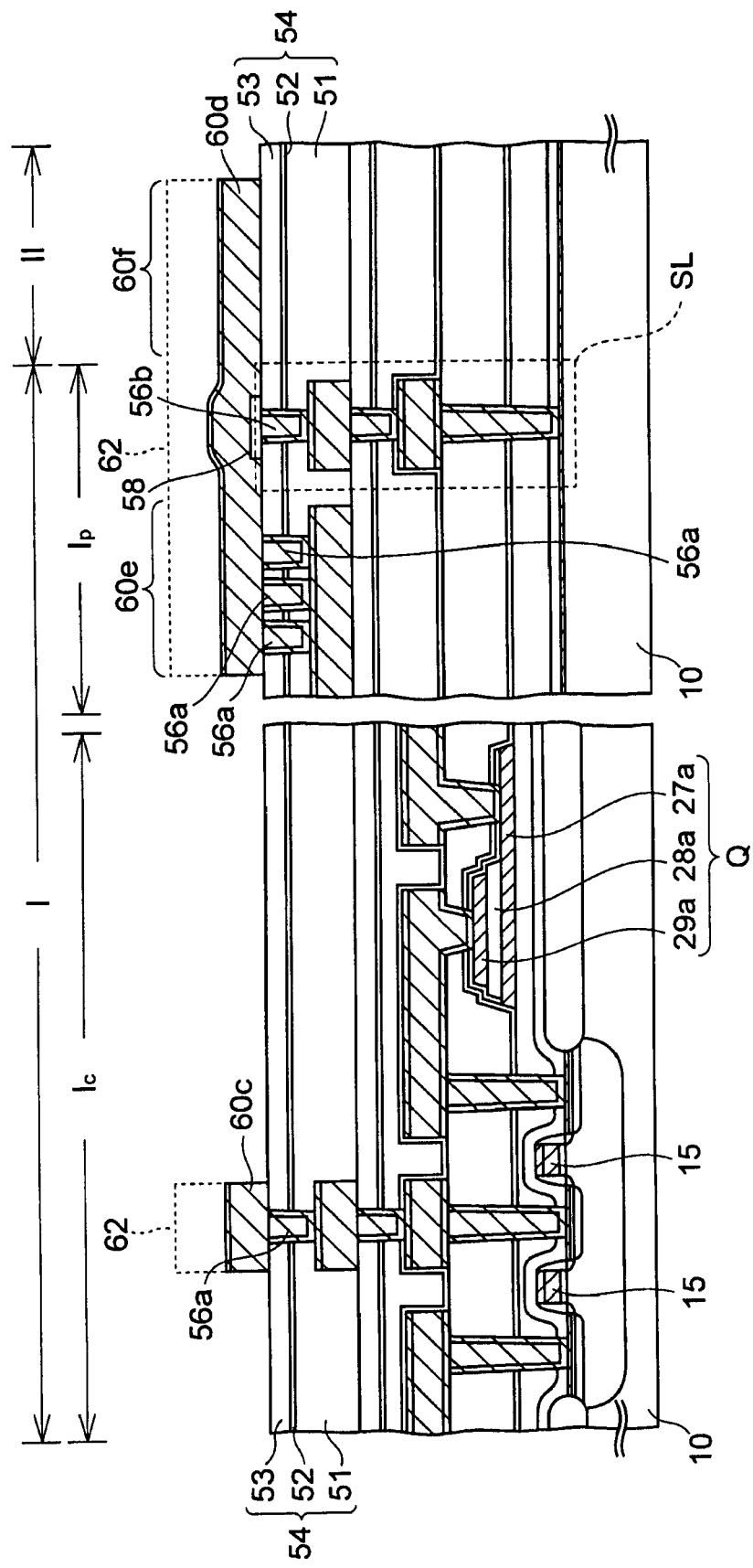
Figure 1V:
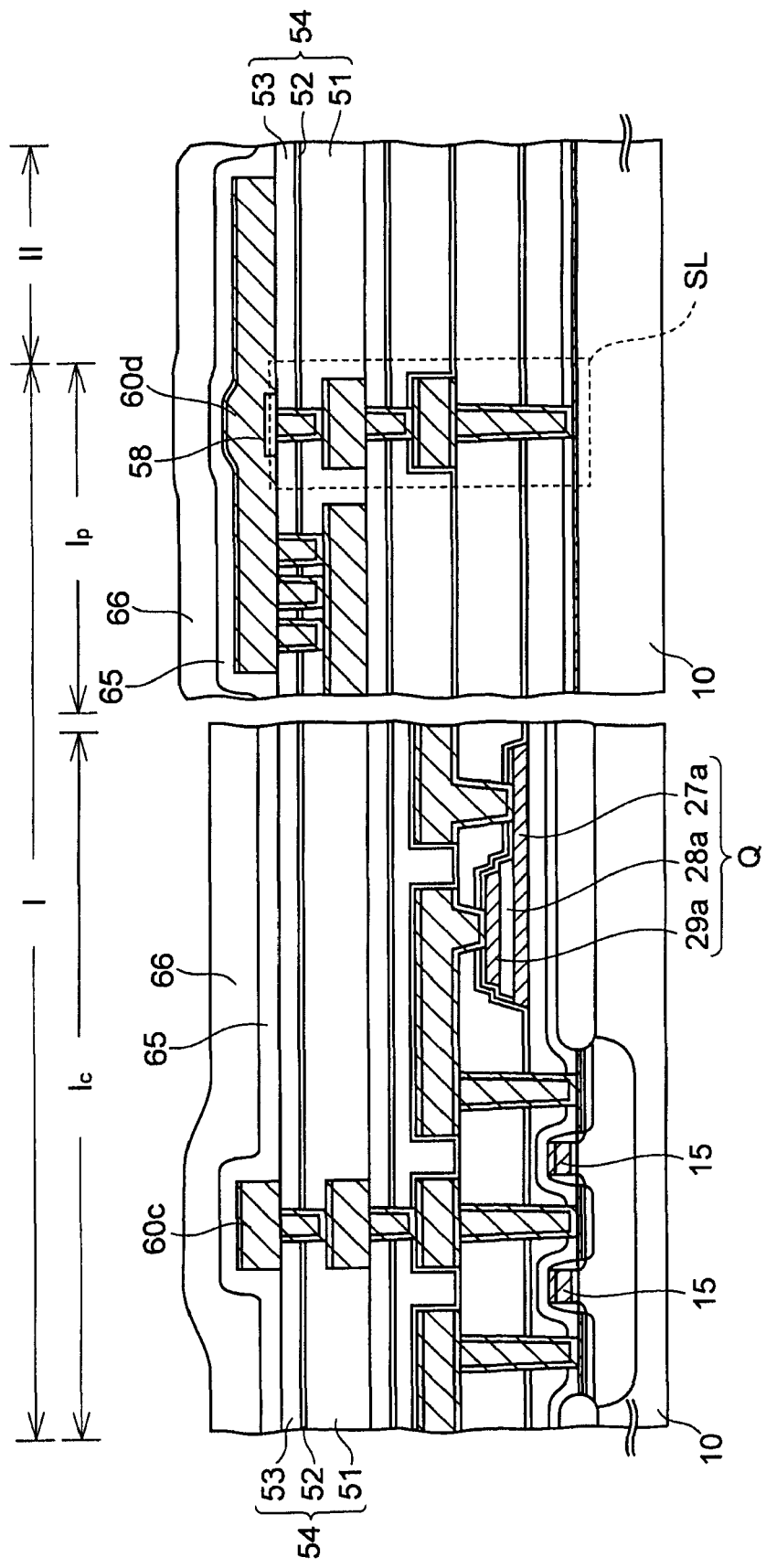
Figure 1X:
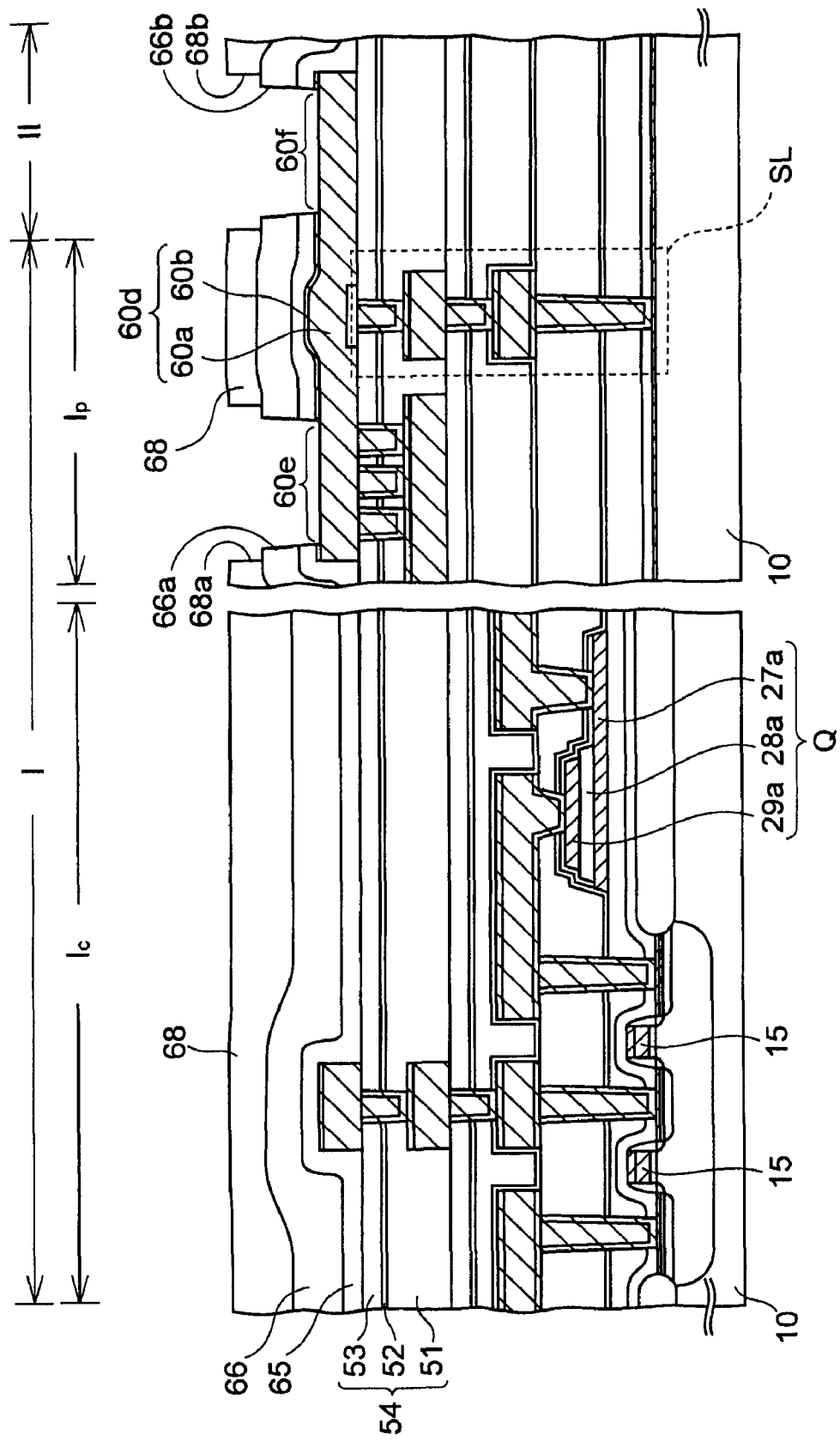

FIGS. 1A to 1X are cross-sectional views showing processes of manufacturing a semiconductor wafer structure according to a first embodiment.

Firstly, processes for obtaining a cross-sectional structure shown in FIG. 1A will be described.

A surface of an n-type or p-type silicon (semiconductor) substrate 10 is thermally oxidized to form an element isolation insulating film 11. This element isolation insulating film 11 defines active regions of transistors. Such an element isolation structure is referred to as a local oxidation of silicon (LOCOS). In place of this, shallow trench isolation (STI) may be employed.

In addition, the silicon substrate 10 is, for example, a silicon wafer with the diameter of 8 inches and has a chip region I and a scribe region II as shown in the figure. The chip region I will be broadly divided later into a circuit forming region $I_c$ where a ferroelectric capacitor or the like is formed and a peripheral region $I_p$ where a bonding pad or the like is formed.

Subsequently, a p-type impurity, for example, boron is introduced into the active region of the silicon substrate 10 to form a p-well 12. Thereafter, the surface of the active region is thermally oxidized to form a thermally-oxidized film to be a gate insulating film 14 with a thickness of approximately 6 nm to 7 nm.

After that, an amorphous silicon film with a thickness of approximately 50 nm and a tungsten silicide film with a thickness of approximately 150 nm will be sequentially formed on the entire upper surface of the silicon substrate 10. Here, a polycrystalline silicon film may be formed in place of the amorphous silicon film. Thereafter, these films are patterned by photolithography, so that gate electrodes 15 are formed on the silicon substrate 10.

Two of the gate electrodes 15 are formed so as to be parallel to each other on the p-well 12, and each of which configures a part of a ward line.

Furthermore, phosphorus, as an n-type impurity, is introduced into the silicon substrate 10 beside the gate electrodes 15 by ion implantation using the gate electrodes 15 as a mask. Thereby, first and second source/drain extensions 17a and 17b are formed.

After that, an insulating film is formed on the entire upper surface of the silicon substrate 10. Then, the insulating film is etched back to be left as insulating spacers 18 beside the gate electrodes 15. A silicon oxide film as the insulating film is formed by, for example, the chemical vapor deposition (CVD) method.

Subsequently, by using the insulating spacers 18 and the gate electrodes 15 as a mask, the ion implantation is carried out again to introduce an n-type impurity, such as arsenic, into the silicon substrate 10. Thereby, first and second source/drain regions 19a and 19b are formed on the silicon substrate 10 beside the gate electrodes 15.

Furthermore, a refractory metal film, such as a cobalt film or the like, is formed on the entire upper surface of the silicon substrate 10 by a sputtering method. Then, the refractory metal film is heated, and thereby caused to react with silicon. Accordingly, a refractory metal silicide layer 22, such as a cobalt silicide layer or the like, is formed on the silicon substrate 10 in the first and second source/drain regions 19a and 19b. Thereby, resistance of each of the source/drain regions 19a and 19b is lowered. Note that such a refractory metal silicide layer 22 is also formed on the surface layer of the silicon substrate 10 in each of the peripheral region $I_p$ and the scribe region II.

Thereafter, the refractory metal layer left unreacted on the device isolation insulating film 11 and the like is removed by wet etching.

With the processes described so far, first and second MOS transistors $TR_1$ to $TR_2$, each of which is formed of the gate insulating film 14, the gate electrode 15, the first and second source/drain regions 19a and 19b, and the like, are formed in the active regions of the silicon substrate 10.

Next, as shown in FIG. 1B, a silicon oxynitride (SiON) film is formed with a thickness of approximately 200 nm on the entire upper surface of the silicon substrate 10 by a plasma CVD method. The resultant film is set to be a cover insulating film 24.

Furthermore, a silicon oxide (SiO) film is formed, as a base insulating film 25, with a thickness of approximately 600 nm on the cover insulating film 24, by the plasma CVD method using a tetra ethoxy silane (TEOS) gas. Thereafter, the upper surface of the base insulating film 25 is polished by approximately 200 nm and planarized by a chemical mechanical polishing (CMP) method.

Next, processes for obtaining a cross-sectional structure showing FIG. 1C will be described.

Firstly, a platinum film is formed, as a lower electrode conductive film 27, on the base insulating film 25 by the sputtering method. This lower electrode conductive film 27 will be patterned later to be a capacitor lower electrode with the film thickness of approximately 155 nm.

Furthermore, a PZT film is formed with the thickness of 150 nm to 200 nm on the lower electrode conductive film 27 by the sputtering method. This PZT film is set to be a ferroelectric film 28.

As a method for forming the ferroelectric film 28, there are a metal organic CVD (MOCVD) method and a sol-gel method, in addition to the sputtering method. Furthermore, a material of the ferroelectric film 28 is not limited to the above-described PZT, and it may be formed of Bi layer structure compounds, such as $SrBi_2Ta_2O_9$, $SrBi_2(Ta_xNb_{1-x})_2O_9$, or $Bi_4Ti_2O_{12}$, PLZT($Pb_{1-x}La_xZr_{1-y}Ti_yO_3$), which is formed by doping lanthanum into PZT, or other metal oxide ferroelectrics.

Here, the PZT formed by the sputtering method is hardly crystallized just after film formation, and has therefore poor ferroelectric characteristics. For this reason, as crystallization annealing for crystallizing PZT forming the ferroelectric film 28, rapid thermal anneal (RTA) is carried out. This RTA is performed with a substrate temperature of approximately 585° C. for approximately 90 seconds in an atmosphere containing oxygen. Note that, if the ferroelectric film 28 is formed by the MOCVD method, this crystallization annealing is not needed.

Subsequently, a first iridium oxide ($IrO_2$) film is formed with a thickness of approximately. 50 nm on the above-described ferroelectric film 28 by the sputtering method. Then, RTA is carried out on this first iridium oxide film. The conditions for the RTA are not particularly limited. In the present embodiment, the RTA is carried out in the atmosphere containing oxygen with the substrate temperature of 725° C. for the processing time of 20 seconds.

Thereafter, a second iridium oxide film is formed with a thickness of approximately 200 nm on the first iridium oxide film by the sputtering method. Then, a laminated film formed of these first and second iridium oxide films is set to be an upper electrode conductive film 29.

An alumina ($Al_2O_3$) film may be formed with a thickness of, for example, as thin as approximately 20 nm, on the base insulating film 25 by the sputtering method before the above-described lower electrode conductive film 27 is formed. Thereby, the orientation performance of platinum forming the lower electrode conductive film 27 becomes preferable when compared with the case where the lower electrode conductive film 27 is directly formed on the base insulating film 25. The orientation performance of the lower electrode conductive film 27 has an effect to arrange the orientation of the PZT forming the ferroelectric film 28 in the same direction. As a result, the ferroelectric characteristics of the ferroelectric film 28 are improved.

Next, as shown in FIG. 1D, the upper electrode conductive film 29 is patterned by photolithography and etching to form an upper electrode 29a. Then, to recover damages received in the ferroelectric film 28 due to this patterning, recovery annealing is carried out on the ferroelectric film 28 in a vertical furnace. This recovery annealing is carried out in the atmosphere containing oxygen under conditions, for example, with the substrate temperature of 650° C. and the processing time of 60 minutes.

Subsequently, as shown in FIG. 1E, the ferroelectric film 28 is patterned by photolithography and etching to form a capacitor dielectric film 28a formed of a ferroelectric material, such as a PZT. The damages received in the capacitor dielectric film 28a due to this patterning are recovered by recovery annealing. This recovery annealing is carried out with the atmosphere containing oxygen in a vertical furnace, like the above-described recovery annealing. For example, the recovery annealing is carried out under conductions with the substrate temperature of 350° C. and the processing time of 60 minutes.

Next, as shown in FIG. 1F, a first alumina film 31 is formed with a thickness of approximately 50 nm on the entire upper surface of the silicon substrate 10 by the sputtering method. This first alumina film is for protecting the capacitor dielectric film 28a from reducing materials, such as hydrogen and moisture. Then, to recover damages received in the capacitor dielectric film 28a by the sputtering, recovery annealing is carried out in the atmosphere containing oxygen with the substrate temperature of 550° C. for approximately 60 minutes. This recovery annealing is carried out in, for example, a vertical furnace.

Next, as shown in FIG. 1G, the lower electrode conductive film 27 and the first alumina film 31 are patterned by photolithography and etching. Thereby, the lower electrode conductive film 27 under the capacitor dielectric film 28a is set to be a lower electrode 27a, and the first alumina film 31 is left in such a manner as to cover the lower electrode 27a.

Thereafter, to recover damages received in the capacitor dielectric film 28a during the process, recovery annealing is carried out on the capacitor dielectric film 28a in a vertical furnace with the atmosphere containing oxygen under conditions with the substrate temperature of 550° C. and the processing time of 60 minutes.

With the processes described so far, a capacitor Q is formed, in the chip region I of the silicon substrate 10, by laminating the lower electrode 27a, the capacitor dielectric film 28a, and the upper electrode 29a in this order.

Next, as shown in FIG. 1H, a second alumina film 33 for protecting the capacitor dielectric film 28a is formed with a thickness of approximately 20 nm on the entire upper surface of the silicon substrate 10 by the sputtering method. This second alumina film 33, together with the first alumina film 31 thereunder, functions to prevent reducing materials, such as hydrogen and moisture, from coming in contact with the capacitor dielectric film 28a, thereby to suppress deterioration of ferroelectric characteristics of the capacitor dielectric film 28a due to reduction thereof.

After that, under conditions with the substrate temperature of 550° C. and the processing time of 60 minutes, recovery annealing is carried out on the capacitor dielectric film 28a in a vertical furnace with the atmosphere containing oxygen.

Furthermore, as shown in FIG. 1I, a silicon oxide film is formed with a thickness of approximately 1500 nm on the above-described second alumina film 33 by the plasma CVD method using the TEOS gas. This silicon oxide film is set to be a first insulating film 34. Thereafter, the upper surface of the first insulating film 34 is polished and planarized by the CMP method.

As described above, a first interlayer insulating film 35, which is formed of the second alumina film 33 and the first insulating film 34, is formed on the capacitor Q. Note that an interlayer insulating film means herein an insulating film in which a wiring is formed on the upper surface thereof.

Next, processes for obtaining a cross-sectional structure shown in FIG. 1J will be described.

Firstly, the first interlayer insulating film 35, the base insulating film 25, and the cover insulating film 24 are patterned by photolithography and dry etching. Thereby, first and second contact holes 35a and 35b are formed in these films in the circuit forming region $I_c$ and a first groove 35c is formed in these films in the peripheral region $I_p$.

This dry etching is carried out by three-step etching in a parallel plate-type plasma etching apparatus (unillustrated). In the first step of the etching, a mixed gas of $C_4F_8$, $O_2$, and Ar is used as an etching gas so as to etch the first interlayer insulating film 35 to the base insulating film 25 by using the cover insulating film 24 as an etching stopper film.

In the second step, a mixed gas of $O_2$ and Ar is used as an etching gas to remove an etching product generated in the holes during the first step by using a sputtering effect of the mixed gas.

Then, in the third step of the etching, a mixed gas of $C_4F_8$, $CF_4$, $O_2$, and Ar is used as an etching gas to etch the cover insulating film 24.

The first and second contact holes 35a and 35b of the contact holes formed as described above are formed on the first and second source/drain regions 19a and 19b.

On the other hand, the first groove 35c is formed in a depth so as to reach the silicon substrate 10 in the peripheral region $I_p$.

Subsequently, a titanium (Ti) film with the thickness of 20 nm and a titanium nitride (TiN) film with the thickness of 50 nm are formed on each of the inner surfaces of the first and second contact holes 35a and 35b and the first groove 35c and on the upper surface of the first interlayer insulating film 35 by the sputtering method. The resultant films are set to be a glue film. Then, a tungsten film is formed on the glue film by the CVD method using a tungsten hexafluoride gas, and this tungsten film is completely embedded in the first and second contact holes 35a and 35b and the first groove 35c.

Thereafter, the excessive glue film and tungsten film on the first interlayer insulating film 35 are polished and removed by the CMP method. The glue film and tungsten film are left only inside the first and second contact holes 35a and 35b and the first groove 35c.

The glue film and tungsten film left inside the first and second contact holes 35a and 35b become first and second contact plugs 40a and 40b, which are electrically connected to the first and second source/drain regions 19a and 19b.

In contrast, the glue film and tungsten film left inside the first groove 35c in the peripheral region $I_p$ become a first fence-shaped conductive plug 40c.

FIG. 22 is an enlarged plan view showing a planar layout of this fence-shaped conductive plug 40c. The respective cross-sections of the peripheral region $I_p$ and the scribe region II in the above-described FIG. 1J correspond to the cross-sectional view taken along the F1-F1 line in FIG. 22.

Figure 4:
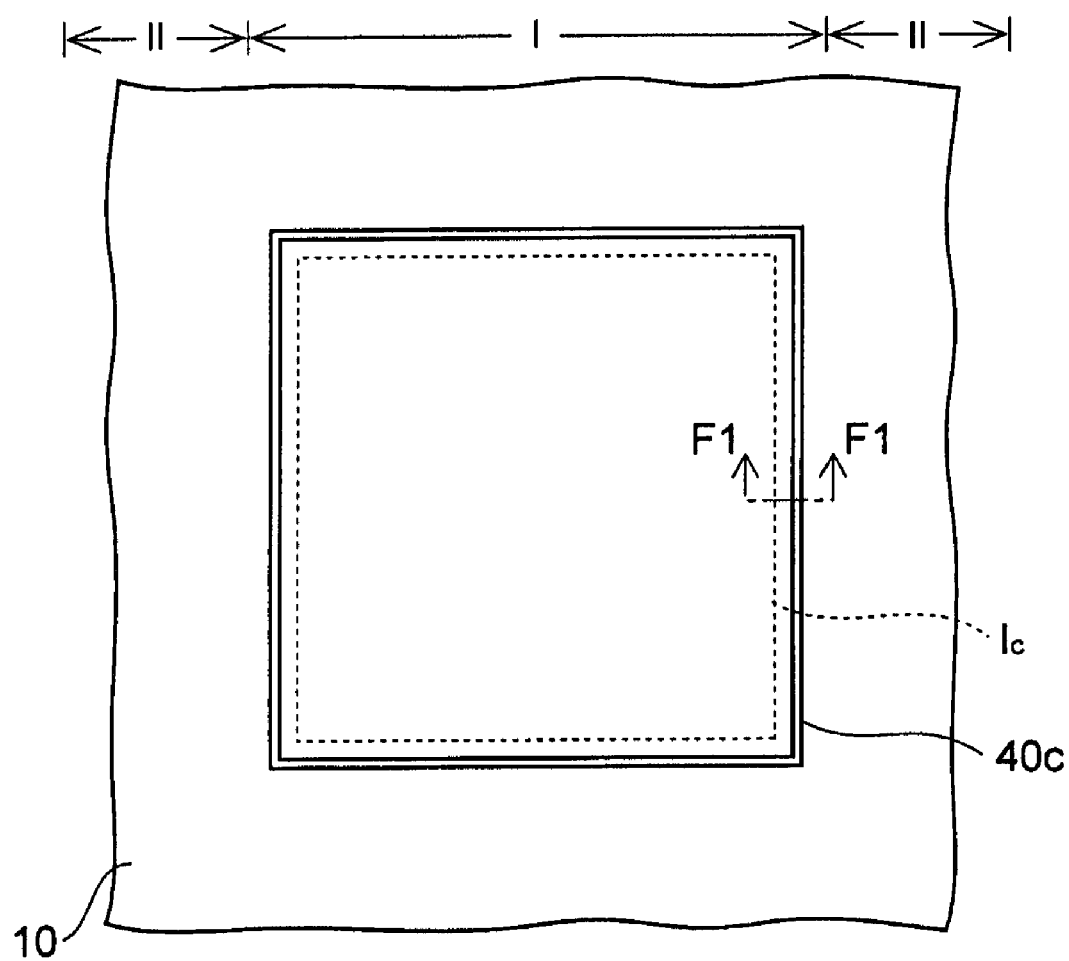
FIG. 4 is an enlarged plan view showing a planar layout of a first fence-shaped conductive plug in the semiconductor wafer device according to the first embodiment.

As shown in FIG. 4, the fence-shaped conductive plug 40c is formed in the form of a fence so as to surround the circuit forming region $I_c$.

Here, the first and second contact plugs 40a and 40b (see FIG. 1J) are mainly formed of tungsten, which is oxidized very easily. For this reason, contact defect may possibly occur in the atmosphere containing oxygen.

Accordingly, in the subsequent process, as shown in FIG. 1K, a silicon oxynitride film is formed, by the CVD method, with a thickness of approximately 100 nm as an oxidation preventive insulating film 41 on the entire upper surface of the silicon substrate 10. Thereby, this oxidation preventive insulating film 41 prevents the first and second contact plugs 40a and 40b from being oxidized.

Thereafter, the oxidation preventive insulating film 41 to the first alumina film 31 are patterned by photolithography and etching. Thereby, first and second openings 35d and 35e are formed in these insulating films on the upper electrode 29a and the lower electrode 27a, respectively.

After that, to recover damages received in the capacitor dielectric film 28a by the processes carried out so far, the silicon substrate 10 is placed in a vertical furnace with the atmosphere containing oxygen. Then, the sixth recovery annealing is carried out on the capacitor dielectric film 28a under conditions with the substrate temperature of 500° C. and the processing time of 60 minutes.

Next, processes for obtaining a cross-sectional structure shown in FIG. 1L will be described.

Firstly, a metal laminated film is formed, by the sputtering method, on each of the upper surfaces of the first interlayer insulating film 35, the first and second contact plugs 40a and 40b, and the first fence-shaped conductive plug 40c. In the present embodiment, the metal laminated film is formed by laminating a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm in this order. This metal laminated film is also formed inside the first and second openings 35d and 35e on the capacitor Q.

Then, the metal laminated film is patterned by photolithography and etching to form first layer metal wirings 41a on the first interlayer insulating film 35 in the circuit forming region $I_c$ and the first ring-shaped conductor pattern 41b on the first fence-shaped conductive plug 40c in the peripheral region $I_p$.

Among these first metal wirings 41a, ones formed on the capacitor Q are electrically connected to the upper and lower electrodes 29a and 27a through the first and second openings 35d and 35e, respectively.

Thereafter, the first interlayer insulating film 35 is dehydrated by annealing under conditions with the substrate temperature of 350° C., the $N_2$ flow rate of 20 liters per minute, and the processing time of 30 minutes, by using, for example, the vertical furnace with the nitrogen atmosphere.

Figure 5:
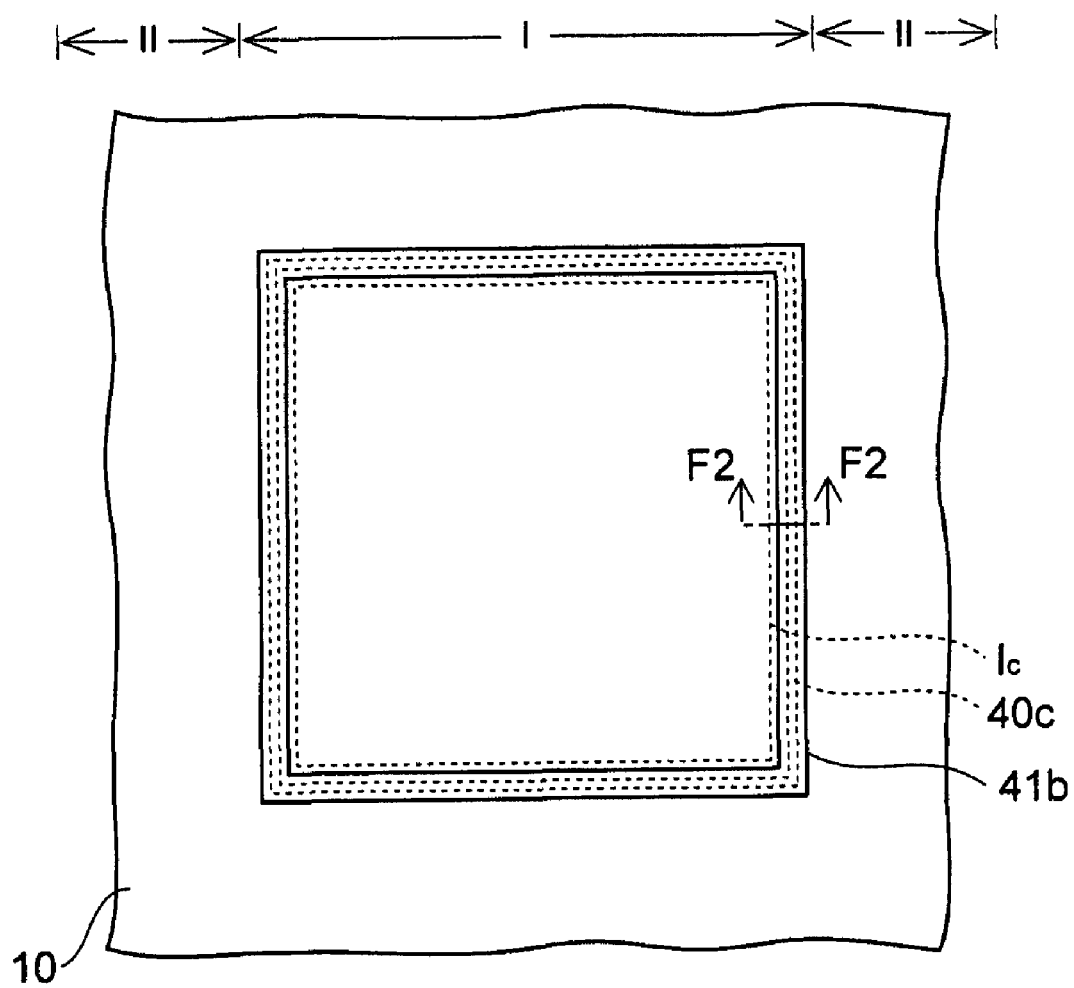
FIG. 5 is an enlarged plan view of a first ring-shaped conductor pattern in the semiconductor wafer structure according to the first embodiment.

FIG. 5 is an enlarged plan view showing a planar layout of the first ring-shaped conductor pattern 41b formed in that process. The respective cross-sections of the peripheral region $I_p$ and the scribe region II in the above-described FIG. 1L correspond to the cross-sectional view taken along the F2-F2 line in FIG. 5.

As shown in FIG. 5, the first ring-shaped conductor pattern 41b is formed in the form of a ring on the first fence-shaped conductive plug 40c.

Next, processes for obtaining a cross-sectional structure shown in FIG. 1M will be described.

Firstly, an alumina film is formed on the entire upper surface of the silicon substrate 10, by the sputtering method, as a first capacitor protection insulating film 46.

The first capacitor protection insulating film 46 has a function to protect the capacitor dielectric film 28a by blocking reducing materials, such as hydrogen and moisture. Films having such a function include a titanium oxide ($TiO_2$) film as well, in addition to the above-described alumina film.

Subsequently, a silicon oxide film is formed on the first capacitor protection insulating film 46, as a second insulating film 47, by the plasma CVD method using the TEOS gas as a reactant gas. Thereafter, the second insulating film 47 is polished and planarized by the CMP method. By this CMP, the thickness of the second insulating film 47 after planarization becomes approximately 1000 nm on the first metal wirings 45a.

Then, in order to prevent reducing materials contained in the outer atmosphere, such as hydrogen and moisture, from coming in contact with the capacitor dielectric film 28a after the second insulating film 47 is dehydrated by the $N_2O$ plasma processing, an alumina film with excellent blocking capability against these reducing materials is formed with a thickness of approximately 50 nm on the second insulating film 47, by the sputtering method. The resultant alumina film is set to be a second capacitor protection insulating film 48.

The second capacitor protection insulating film 48 is not limited to the alumina film. Like the first capacitor protection insulating film 46, the second capacitor protection insulating film 48 may be formed of a titanium oxide film.

Subsequently, a silicon oxide film is formed on the second capacitor protection insulating film 48 by the plasma CVD method using the TEOS gas. This silicon oxide film is set to be a first cap insulating film 49. The thickness of the first cap insulating film 49 is, for example, approximately 100 nm.

After that, the first cap insulating film 49 is dehydrated by the $N_2O$ plasma processing.

With the processes described so far, a second interlayer insulating film 50, which is formed of the first and second capacitor protection insulating films 46 and 48, the second insulating film 47, and the first cap insulating film 49, is formed on the first metal wirings 41a and the ring-shaped conductor pattern 41b.

Next, processes for obtaining a cross-sectional structure shown in FIG. 1N will be described.

Firstly, the second interlayer insulating film 50 is patterned by photolithography and dry etching to form a first hole 50a on the first metal wiring 41a in the circuit forming region $I_c$ and a second groove 50b on the ring-shaped conductor pattern 41b in the peripheral region $I_p$. Such dry etching is carried out in a parallel plate-type plasma etching chamber by using the mixed gas of, for example, $C_4F_8$, Ar, and $O_2$ as an etching gas.

Subsequently, a titanium nitride film is formed, by the sputtering method, with a thickness of approximately 150 nm on the second interlayer insulating film 50 and on each of the inner surfaces of the first hole 50a and the second groove 50b as a glue film.

Furthermore, a tungsten film is formed on this glue film by the plasma CVD method using a tungsten hexafluoride gas, and the first hole 50a and the second groove 50b are completely filled with this tungsten film.

Thereafter, the excessive glue film and tungsten film on the second interlayer insulating film 50 are polished and removed by the CMP method. These films are left only inside the first hole 50a and the second groove 50b. In the present process, the etching back method can be employed in place of the CMP method.

The glue film and tungsten film left inside the first hole 50a as described above become a first conductive plug 57a which is electrically connected to the first metal wiring 41a.

In addition, the glue film and tungsten film left inside the second groove 50a become a second fence-shaped conductive plug 57b.

Note that the planar shape of the second fence-shaped conductive plug 57b is similar to that of the first fence-shaped conductive plug 40c shown in FIG. 4, and thus illustration thereof will be omitted.

Figure 10:
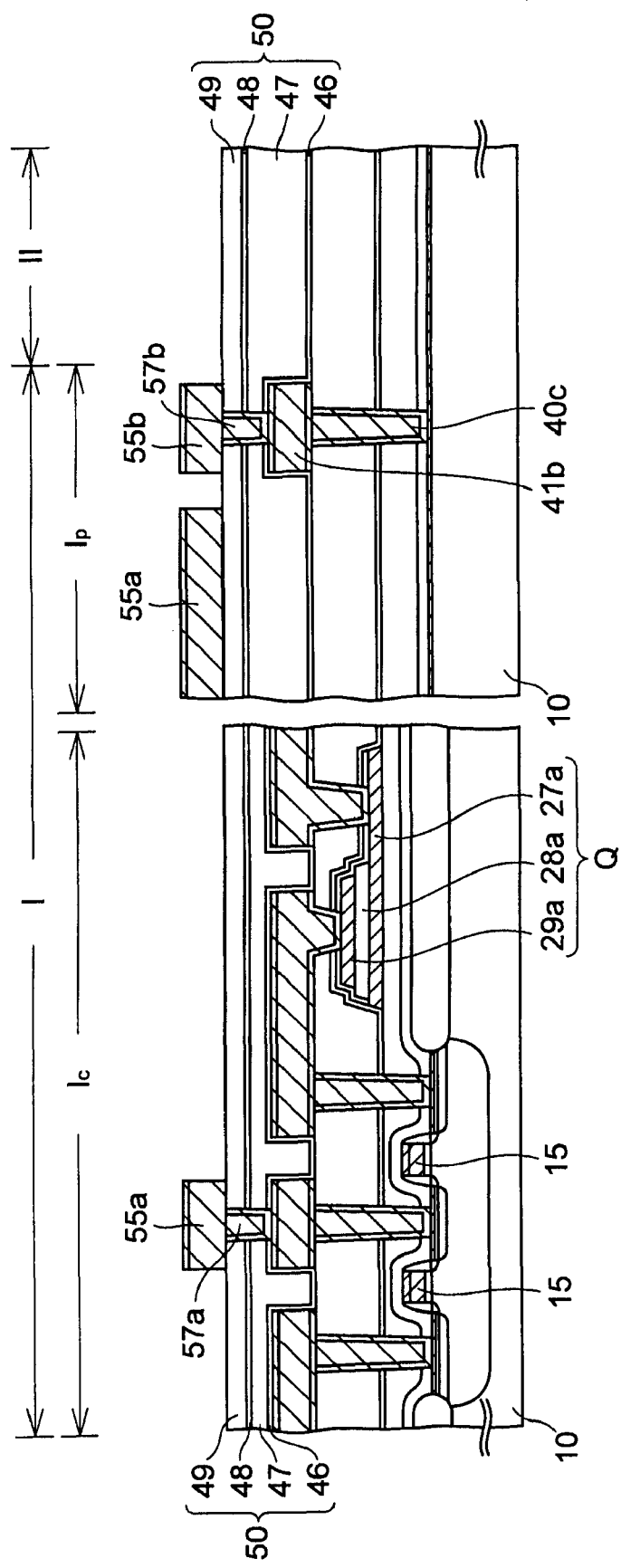
FIGS. 10A to 10K are cross-sectional views showing processes of manufacturing a semiconductor wafer structure according to a second embodiment.

Next, as shown in FIG. 10, a metal laminated film is formed, by the sputtering method, on each of the second interlayer insulating film 50, the first conductive plug 57a, and the second fence-shaped conductive plug 57b. The metal laminated film is patterned to form second metal wirings 55a and a second ring-shaped conductor pattern 55b in the chip region I.

The metal laminated film is formed of, for example, a copper-containing aluminum film with a thickness of approximately 550 nm, a titanium film with a thickness of approximately 5 nm, and a titanium nitride film with a thickness of approximately 150 nm in this order from the bottom thereof.

In addition, the planar shape of the second ring-shaped conductor pattern 55b is same as that of the first ring-shaped conductor pattern 41b described in FIG. 5, and thus illustration thereof will be omitted.

Next, as shown in FIG. 1P, a silicon oxide film is formed, by the plasma CVD method using the TEOS gas, with a thickness of approximately 2200 nm on each of the second interlayer insulating film 50, the second metal wiring 55a, and the second ring-shaped conductor pattern 55b. The resultant silicon oxide film is set to be a third insulating film 51.

Then, the upper surface of the third insulating film 51 is polished and planarized by the CMP method. Thereafter, the third insulating film 51 is dehydrated by the $N_2O$ plasma processing. The $N_2O$ plasma processing is carried out in a CVD apparatus under conditions, for example, with the substrate temperature of 350° C. and the processing time of four minutes.

Subsequently, an alumina film is formed, by the sputtering method, with a thickness of approximately 50 nm on the third insulating film 51. The alumina film is formed, as a third capacitor protection insulating film 52, for protecting the capacitor dielectric film 28a from reducing materials. Note that the third capacitor protection insulating film 52 may be formed of a titanium oxide film, in place of the alumina film.

After that, a silicon oxide film is formed with a thickness of approximately 100 nm on the third capacitor protection insulating film 52 by the plasma CVD method using the TEOS gas. The resultant silicon oxide film is set to be a second cap insulating film 53.

Thereafter, the $N_2O$ plasma processing is carried out on the second cap insulating film 53 in a CVD apparatus under conditions such as the substrate temperature of 350° C. and the processing time of two minutes to dehydrate the second cap insulating film 53.

With the processes described so far, a third interlayer insulating film 54, which is formed by laminating the third insulating film 51, the third capacitor protection insulating film 52, and the second cap insulating film 53, is formed on each of the second metal wirings 55a and the second ring-shaped conductor pattern 55b. In the present embodiment, the third interlayer insulating film 54 is the uppermost interlayer insulating film.

Next, processes for obtaining a cross-sectional structure shown in FIG. 1Q will be described.

Firstly, the third interlayer insulating film 54 is patterned by photolithography and dry etching to form a second hole 54a on the second metal wiring 55a and a third groove 54b on the second ring-shaped conductor pattern 55b.

The dry etching is carried out in, for example, a parallel plate-type plasma etching chamber by using the mixed gas of $C_4F_8$, $O_2$, and Ar as an etching gas.

Subsequently, on the third interlayer insulating film 54 and on each of the inner surfaces of the second hole 54a and the third groove 54b, a titanium nitride film is formed by the sputtering method, with a thickness of approximately 50 nm. The resultant film is set to be a glue film. After that, a tungsten film is formed on the glue film with the thickness, for example, approximately 650 nm, that the second hole 54a and the third groove 54b are completely embedded by the CVD method.

Thereafter, the excessive glue film and tungsten film on the third interlayer insulating film 54 are polished by the CMP method. These films are left only inside each of the second hole 54a and the third groove 54b.

The glue film and tungsten film left inside the second hole 54a is set to be a second conductive plug 56a which is electrically connected to the second metal wiring 55a.

On the other hand, the glue film and tungsten film left inside the third groove 54b is set to be a third fence-shaped conductive plug 56b.

The third fence-shaped conductive plug 56b serves as a seal ring SL, together with the first and second fence-shaped conductive plugs 40c and 57b, and the first and second ring-shaped conductor patterns 41b and 55b, which are formed under the third fence-shaped conductive plug 56b. After the silicon substrate 10 is subjected to dicing to be cut into chips, this seal ring SL functions to prevent reducing materials from the outside thereof, such as moisture and hydrogen, from coming in contact with the capacitor dielectric film 28a. In the present embodiment, the seal ring SL has the height that reaches the upper surface of the third interlayer insulating film 54 from the surface of the silicon substrate 10.

Next, as shown in FIG. 1R, an insulating film with excellent blocking capability against hydrogen and moisture, for example, a silicon nitride (SiN) film is formed by the CVD method with a thickness of approximately 150 nm on each of the third interlayer insulating film 54, the second conductive plugs 56a, and the third fence-shaped conductive plug 56b. The resultant film is set to be a block film 58. Such an insulating film having the above-described blocking capability includes a silicon oxynitride (SiON) film, an alumina film, and a titanium oxide film, in addition to the silicon nitride film, and any of these insulating films can be used as the block film 58. Among these films, the silicon oxynitride film is formed by the CVD method, while the alumina film and the titanium oxide film are formed by the sputtering method.

Next, as shown in FIG. 1S, a first resist pattern 59 having a ring shape is formed above the seal ring SL. After that, by using the first resist pattern 59 as a mask, the block film 58 is etched to leave the block film 58 only on the third ring-shaped conductive plug 56b and the third interlayer insulating film 54 in the circumference of the third ring-shaped conductive plug 56b.

Figure 6:
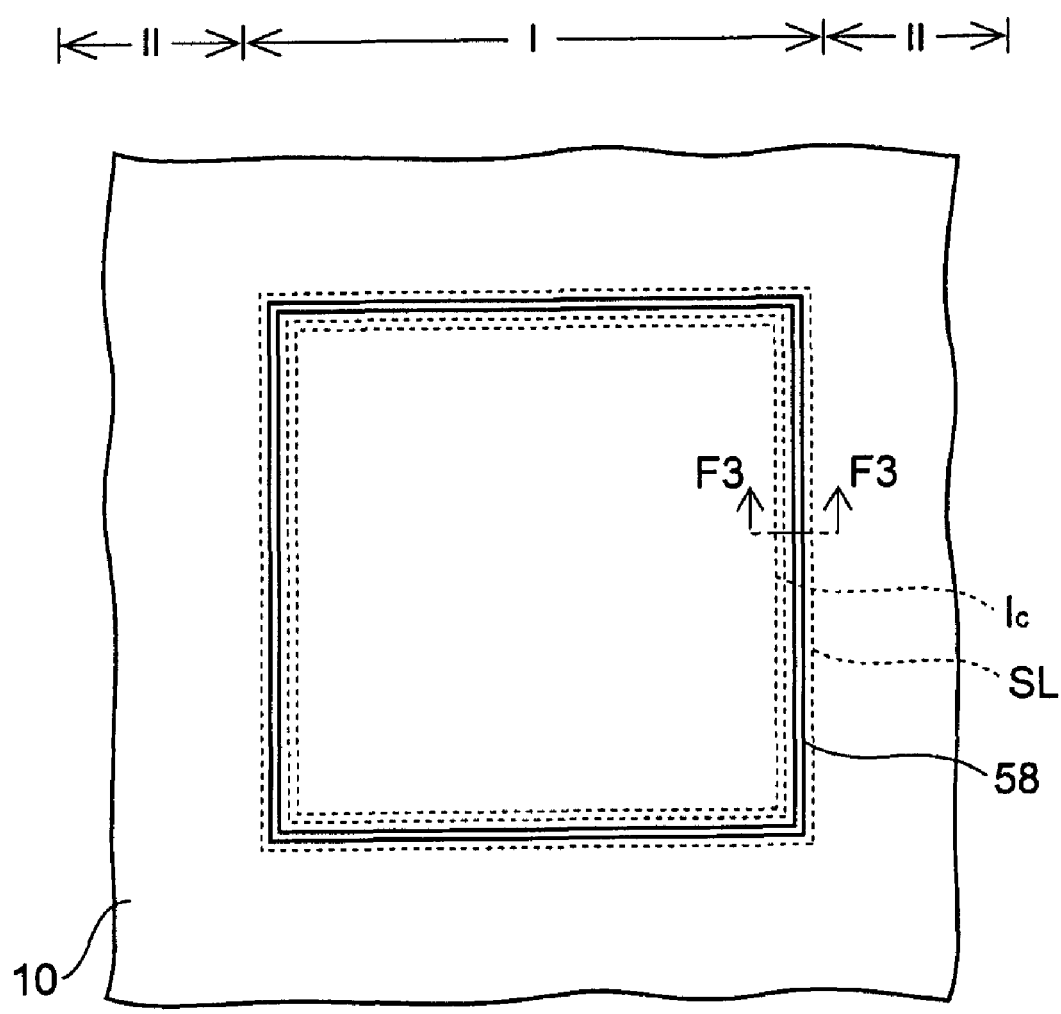
FIG. 6 is an enlarged plan view showing a planar layout of a block film in the semiconductor wafer structure according to the first embodiment.

FIG. 6 is an enlarged plan view showing a planar layout of the block film 58. The respective cross-sections of the peripheral region $I_p$ and the scribe region II in the above-described FIG. 1S correspond to the cross-sectional view taken along the F3-F3 line in FIG. 6.

As shown in FIG. 6, the planar shape of the block film 58 is in the form of a ring like the seal ring SL.

After that, the first resist pattern 59 (see FIG. 1T) used as a mask of etching is removed.

Next, as shown in FIG. 1T, an aluminum film 60a is formed, by the sputtering method, with a thickness of approximately 500 nm on each of the upper surfaces of the block film 58, the second conductive plugs 56a, and the third interlayer insulating film 54. The aluminum film 60a also contains copper.

Furthermore, a titanium nitride film 60b is formed, by the sputtering method, with a thickness of approximately 150 nm on the aluminum film 60a. The titanium nitride film 60b and the aluminum film 60a are set to be a metal laminated film 60.

Next, processes for obtaining a cross-sectional structure shown in FIG. 1U will be described.

Firstly, a second resist pattern 62 is formed on the metal laminated film 60.

Subsequently, the metal laminated film 60 is etched by using the second resist pattern 62 as a mask, so that a third metal wiring 60c is formed in the circuit forming region $I_c$ and an electrode conductor pattern 60d is formed in the peripheral region $I_p$.

Here, during the etching of the metal laminated film 60, over-etching is carried out so as not to leave etching residues of the metal laminated film 60. In spite of this over-etching, since the second cap film 53 formed under the metal laminated film 60 functions to receive the etching, the third capacitor protection insulating film 52 with the thickness of as thin as approximately 50 nm can be prevented from being etched in the present process.

After the electrode conductor pattern 60d is formed as described above, the second resist pattern 62 is removed.

Figure 7:
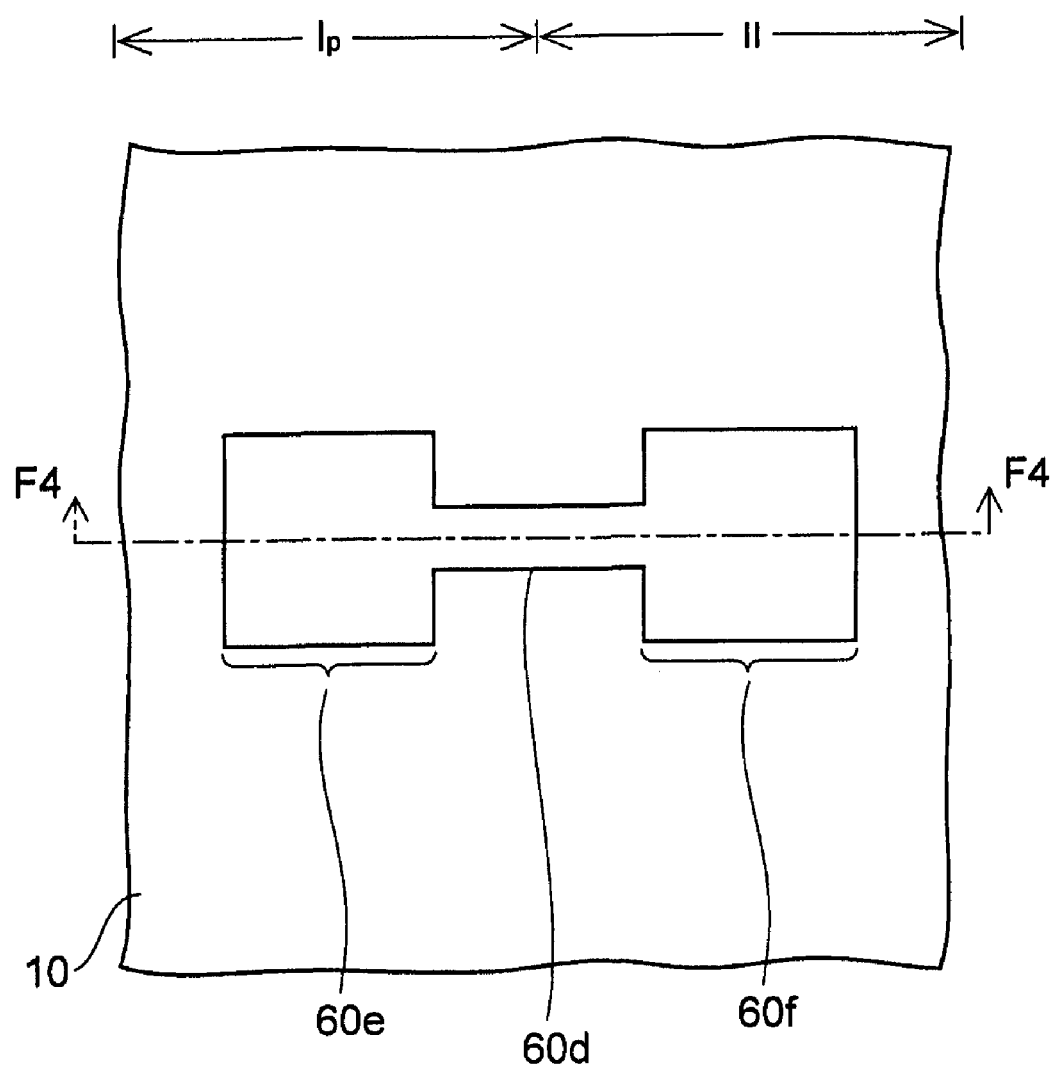
FIG. 7 is an enlarged plan view showing a planar layout of an electrode conductor pattern in the semiconductor wafer structure according to the first embodiment.

FIG. 7 is an enlarged plan view showing a planar layout of the electrode conductor pattern 60d. The respective cross-sections of the peripheral region $I_p$ and the scribe region II in the above-described FIG. 1U correspond to the cross-section taken along the F4-F4 line in FIG. 7.

As shown in FIG. 7, the electrode conductor pattern 60d extends from the peripheral region $I_p$ to the scribe region II, and includes an electrode pad 60e in the peripheral region $I_p$ and a test pad 60f in the scribe region II.

Though functions of the electrode pad 60e are not particularly limited, in the present embodiment, the electrode pad 60e is used as a bonding pad which is subject to a bonding wire, such as a gold wire. Also, the electrode pad 60e, in place of the bonding pad, may be used as a pad to which a columnar electrode, such as a solder or a gold bump, is connected.

As shown in FIG. 1U, a plurality of the second conductive plugs 56a is densely provided under the electrode pad 60e to have a structure in which the electrode pad 60e can bear the mechanical impact during wire bonding.

On the other hand, the test pad 60f is used when a test is carried out at the wafer level. The test pad 60f is brought into contact with a test probe, and it is tested if a circuit formed in the circuit forming region $I_c$ normally functions.

Subsequently, as shown in FIG. 1V, a silicon oxide film is formed, by the CVD method using the TEOS gas, with a thickness of approximately 100 nm on the entire upper surface of the silicon substrate 10. The resultant silicon oxide film is set to be a first passivation film 65.

After that, the $N_2O$ plasma processing is carried out on the first passivation film 65 to dehydrate the first passivation film 65 and nitride the surface thereof in order to prevent moisture from adhering again thereon. Such $N_2O$ plasma processing is carried out under conditions such as, for example, the substrate temperature of 350° C. and the processing time of two minutes.

Furthermore, a silicon nitride film as a second passivation film 66 is formed, by the CVD method, with a thickness of approximately 350 nm on the first passivation film 65.

Subsequently, as shown in FIG. 1W, a third resist pattern 67 provided with a first window 67a in the peripheral region $I_p$ and a second window 67b in the scribe region II is formed on the second passivation film 66.

After that, the first and second passivation films 65 and 66 are dry-etched by using the third resist pattern 67 as a mask to form third and fourth openings 66a and 66b in these films as shown in the figure. The dry etching is carried out by using, for example, a parallel plate plasma etching apparatus (unillustrated) and the mixed gas of $CHF_3$, $CF_4$, and $O_2$ as an etching gas.

Thereafter, the third resist pattern 67 is removed.

Next, processes for obtaining a cross-sectional structure shown in FIG. 1X will be described.

Firstly, a photosensitive polyimide is coated onto the second passivation film 66 and into each of the openings 66a and 66b to form a polyimide coating film with a thickness of approximately 3 μm. Subsequently, this polyimide coating film is exposed and developed. After that, the polyimide coating film is heated in a horizontal furnace with the nitrogen atmosphere to be cured. Though conditions of the curing are not particularly limited, in the present embodiment, the substrate temperature of 310° C., the flow rate of nitrogen of 100 litters per minute, and the processing time of 40 minutes are employed as the conditions.

Accordingly, as shown in FIG. 1X, the process results in formation of a protection insulating film 68 provided with fifth and sixth openings 68a and 68b above the electrode pad 60e and the test pad 60f, respectively.

Figure 8:
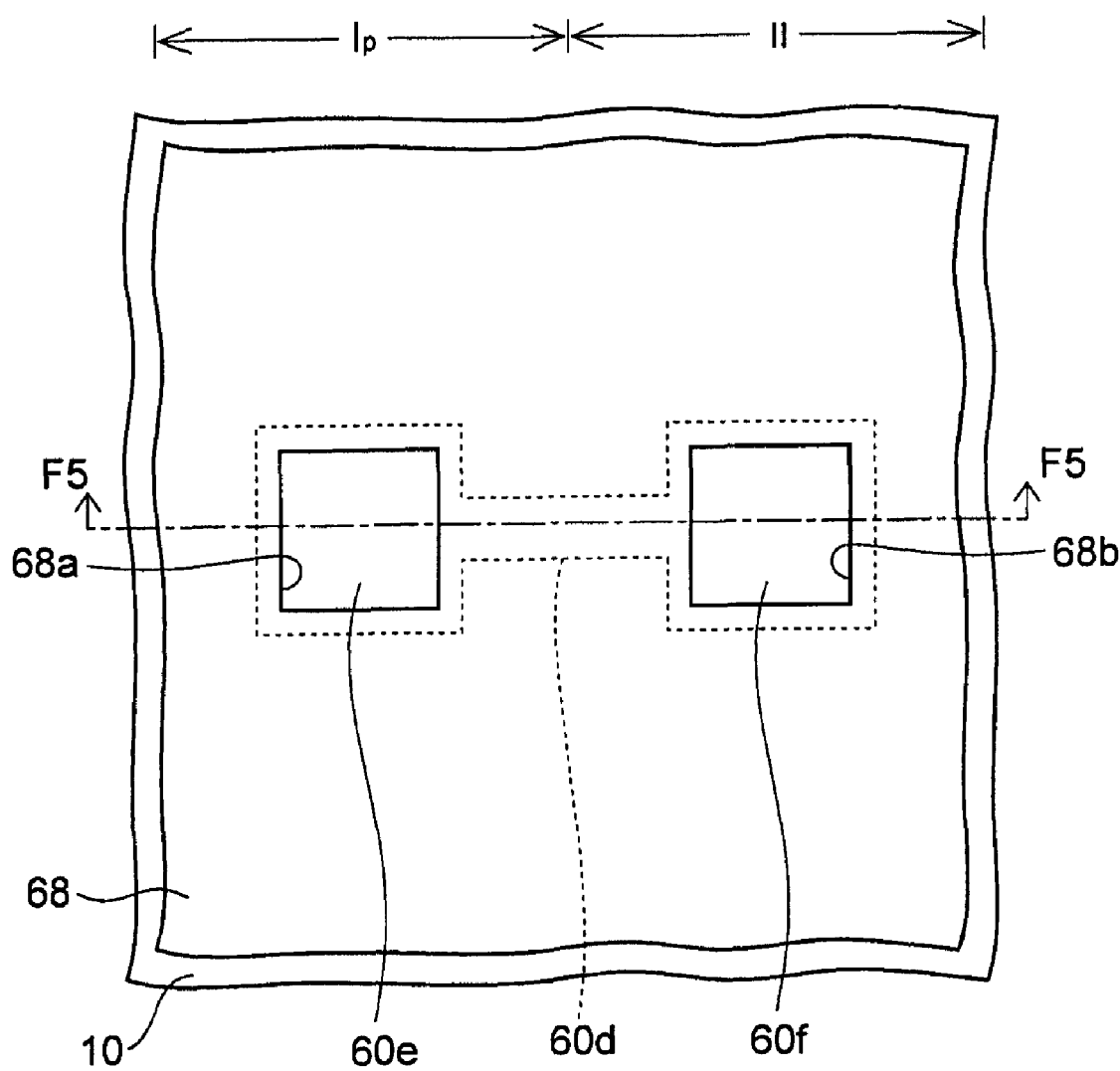
FIG. 8 is an enlarged plan view in a vicinity of the electrode conductor pattern after the process shown in FIG. 1X is finished in the first embodiment.

FIG. 8 is an enlarged plan view in a vicinity of the electrode conductor pattern 60d after the above-described process is finished. The respective cross-sections of the peripheral region $I_p$ and the scribe region II in the above-described FIG. 1X correspond to a cross-sectional view taken along the F5-F5 line in FIG. 8.

With the processes described so far, the basic structure of the semiconductor wafer structure according to the present embodiment is completed.

Figure 9:
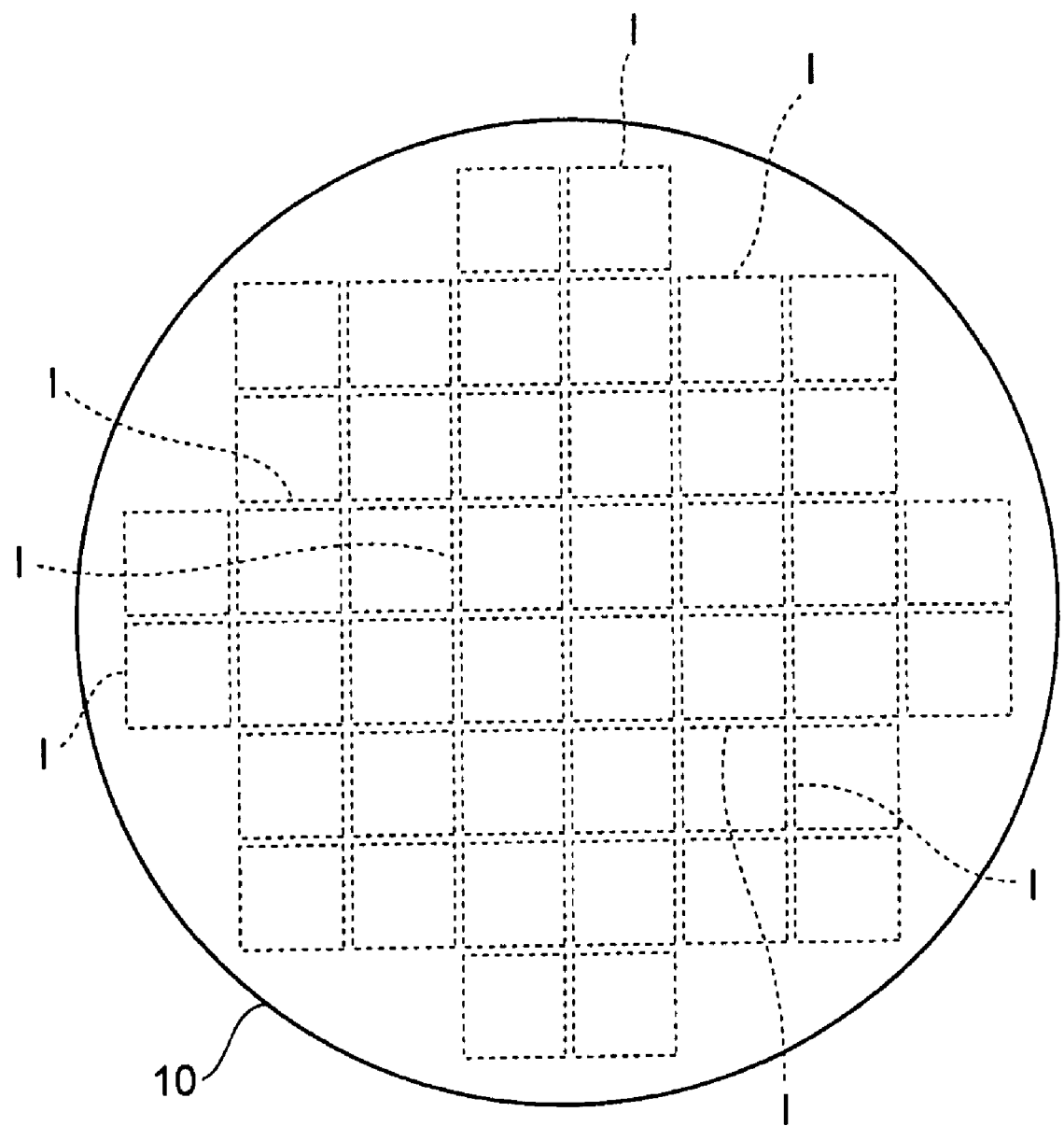
FIG. 9 is a general plan view of the semiconductor wafer structure according to the first embodiment.

FIG. 9 is a general plan view of the semiconductor wafer structure. As shown in the figure, a plurality of chip regions I are defined in the silicon substrate 10.

The process is followed by a test process and a dicing process to cut the silicon substrate 10 into each chip region I. These processes will be described by referring to FIGS. 2 and 3.

Figure 2:
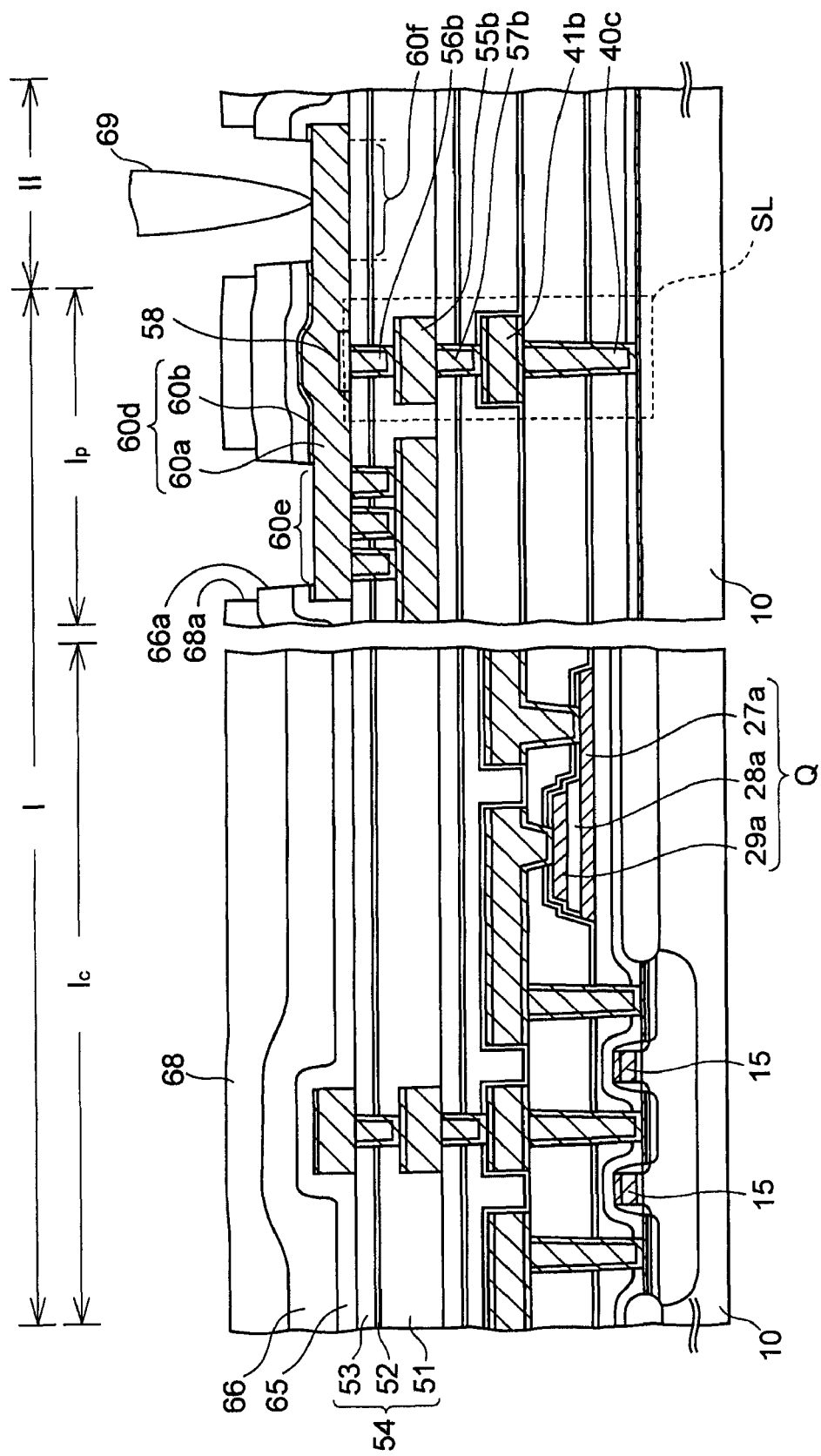
FIG. 2 is a cross-sectional view showing a process of a test on the semiconductor wafer structure according to the first embodiment.

Firstly, in the test process, as shown in FIG. 2, a probe 69 is brought into contact with the test pad 60f formed in the scribe region II so as to test at the wafer level if the circuit formed in the circuit region $I_c$ normally operates.

Figure 3:
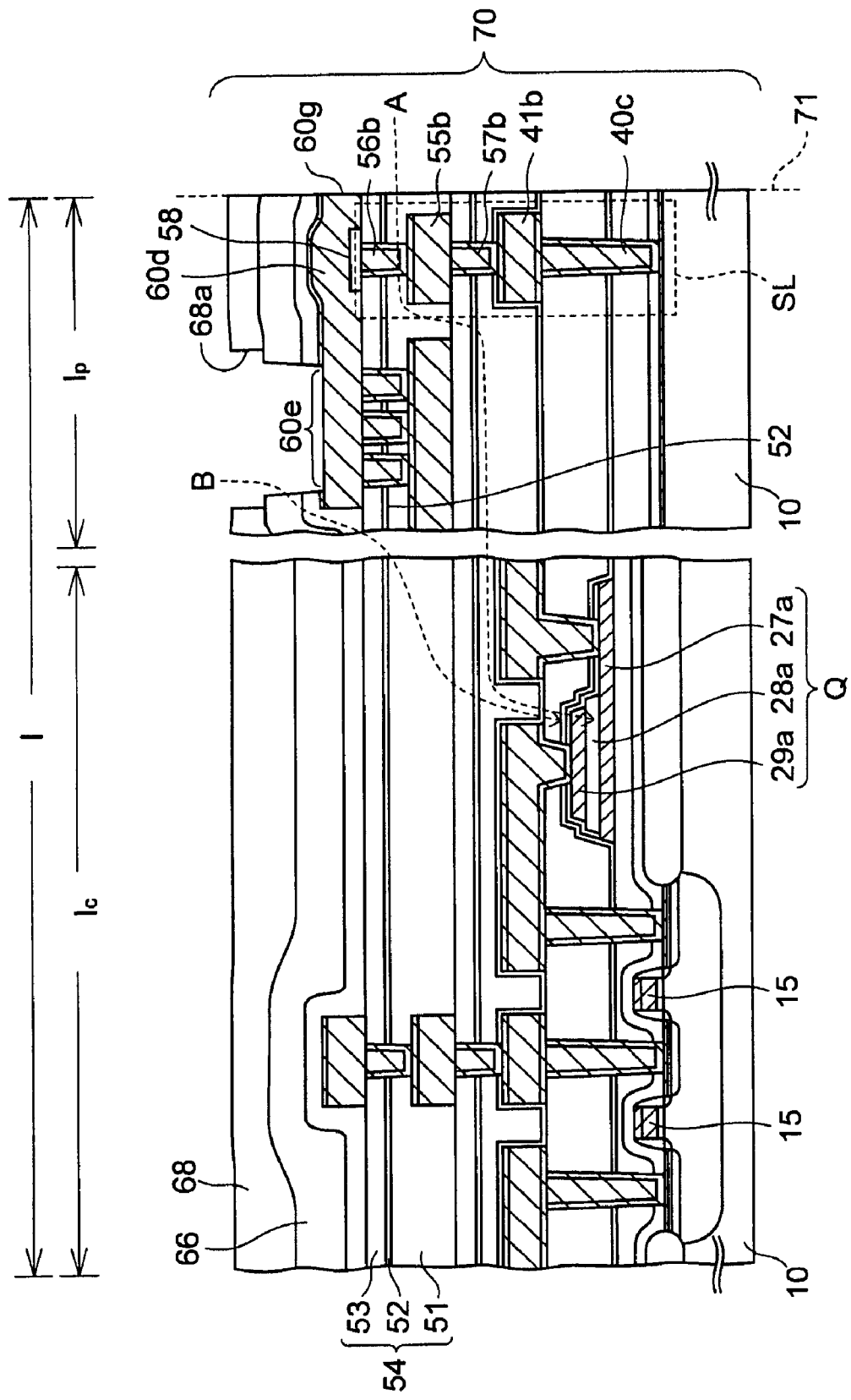
FIG. 3 is a cross-sectional view showing a process of dicing on a semiconductor wafer device according to the first embodiment.

Then, if passing the test, dicing is carried out along the scribe region II to obtain a plurality of semiconductor chips (semiconductor devices) 70 as shown in FIG. 3.

During the dicing, the test pad 60f formed in the scribe region II (see FIG. 2) is cut, and the cross-section 60g of the electrode conductor pattern 60d is exposed to a dicing surface (cut surface) 71.

As described above, the main processes of the present embodiment are finished.

According to the semiconductor wafer structure according to the above-described present embodiment, as shown in FIG. 2, the test pad 60f is provided to the electrode conductor pattern 60d in the scribe region II, in addition to the electrode pad 60e on which bonding or the like is applied. A test is carried out by bringing the probe 69 into contact with the test pad 60f.

Accordingly, even when the test pad 60f receives a mechanical impact from the probe 69 during the test, it is less likely that damages and cracks are generated in the electrode pad 60e which is formed distantly from the test pad 60f. The result does not lead to formation of a moisture-penetration path extending from the circumference of the electrode pad 60e to the capacitor dielectric film 28a, as observed in the case where damages or the like are generated in the electrode pad 60e. Therefore, the deterioration of the capacitor dielectric film 28a due to the test at the wafer level can be prevented.

In addition, there is no concern about generating damages in the electrode pad 60e as described above. Accordingly, there is no need to set the upper limitation about the number of contact of the probe 69 to the test pad 60f. With this, it is capable of contacting the probe 69 to the test pad 60f any number of times, and thus, a test can be freely carried out without limitation.

Moreover, the test pad 60f and the electrode pad 60e are formed in the same electrode conductor pattern 60d. Thereby, the number of processes required for forming the respective patterns 60f and 60e can be reduced in comparison to the case where these pads are formed of separate conductor patterns. As a result, the manufacturing cost of the semiconductor wafer structure can be made less expensive.

Furthermore, according to the semiconductor device according to the present embodiment, as shown in FIG. 3, the seal ring SL formed in the peripheral region $I_p$ is formed with the height that reaches the upper surface of the third interlayer insulating film 54 from the surface of the silicon substrate 10. In addition, the block film 58 is formed on the seal ring SL and the third interlayer insulating film 54 in the circumference of the seal ring SL.

The formation of the seal ring SL with such a height and the block film 58 results in cutting the penetration path of reducing materials such as moisture from the lateral direction of the semiconductor device as shown in the path A in FIG. 3. Thereby, after being cut into semiconductor chips, the capacitor dielectric film 28a can be prevented from deteriorating due to exposure to reducing materials.

In the present embodiment, prevention of both the damages of the test pad 60f and the penetration of reducing materials can contribute to improvement of a PT/FT yield of the semiconductor device and prolongation of a life until the semiconductor device after dicing is broken. Note that the PT/FT yield means the ratio of a yield rate PT from the test (primary test) at the wafer level and a yield rate FT from the test (final test) in the form of a chip after dicing.

In addition, in the present embodiment, the laminated film including the third capacitor protection insulating film 52 is used as the third interlayer insulating film 54. Thereby, the third capacitor protection insulating film 52 with the excellent blocking capability against reducing materials can cut the penetration path of reducing materials from above the semiconductor device as shown in a path B in FIG. 3. Thus, the deterioration of the capacitor dielectric film 28a can be surely prevented.

Moreover, the above-described block film 58 is formed of the insulating films, such as the silicon nitride film, the silicon oxynitride (SiON) film, the alumina film, and the titanium oxide film, and is formed in a size to cover the third fence-shaped conductive plug 56b. Accordingly, a structure in which the seal ring SL and the electrode conductor pattern 60d are electrically insulated is obtained. Thereby, when a test is carried out at the wafer level (see FIG. 2), a test current supplied from the probe 69 is prevented from flowing to the silicon substrate 10 through the seal ring SL. As a result, a test current with a desired current magnitude can be supplied to the circuit formed in the circuit forming region $I_c$ and the test at the wafer level can be surely carried out.

In the present embodiment, the seal ring SL is directly formed on the silicon substrate 10, but the present embodiment is not limited to this structure. For example, an element isolation insulating film 11 may be formed on the silicon substrate 10 in the peripheral region $I_p$ and then the seal ring SL may be formed on the element isolation insulating film 11. However, with a view to blocking external reducing materials, it is preferable that the seal ring SL and the silicon substrate 10, both of which are formed of a conductive material, be directly connected to each other as in the present embodiment. This is also true in the following second embodiment.

(2) Second Embodiment

FIGS. 10A to 10K are cross-sectional views of manufacturing a semiconductor wafer structure according to a second embodiment.

To manufacture a semiconductor wafer structure according to the present embodiment, the processes described in FIGS. 1A to 1Q in the first embodiment will be firstly carried out.

Figure 10A:
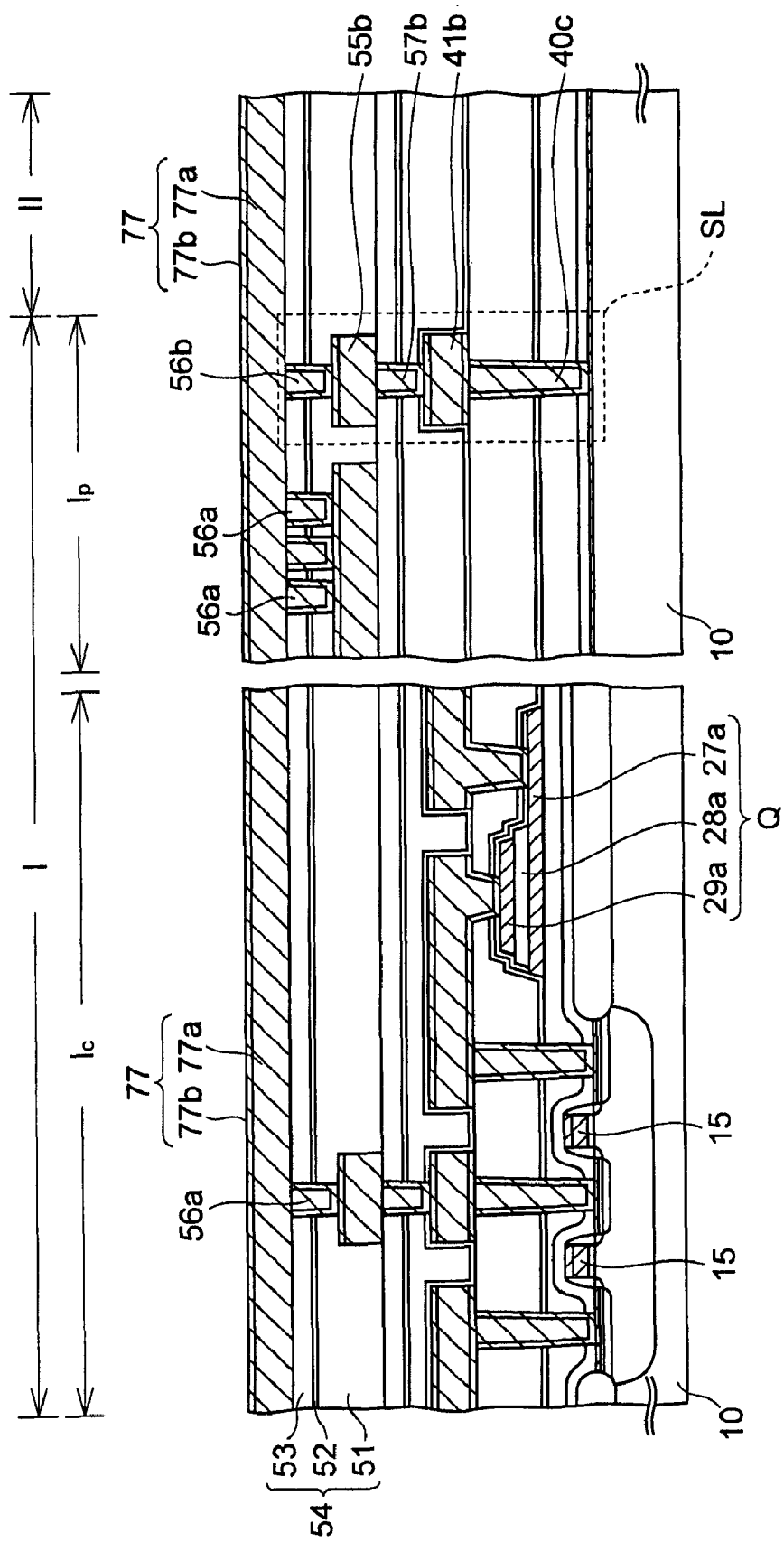

Subsequently, as shown in FIG. 10A, an aluminum film 77*a* is formed, by the sputtering method, with a thickness of approximately 500 nm on the entire upper surface of the silicon substrate 10. The aluminum film 77*a* also contains copper. After that, a titanium nitride film 77*b* is formed, by the sputtering method, with a thickness of approximately 150 nm on the aluminum film 77*a*. The titanium nitride film 77*b* and the aluminum film 77*a* are set to be a first conductive film 77.

Figure 10B:
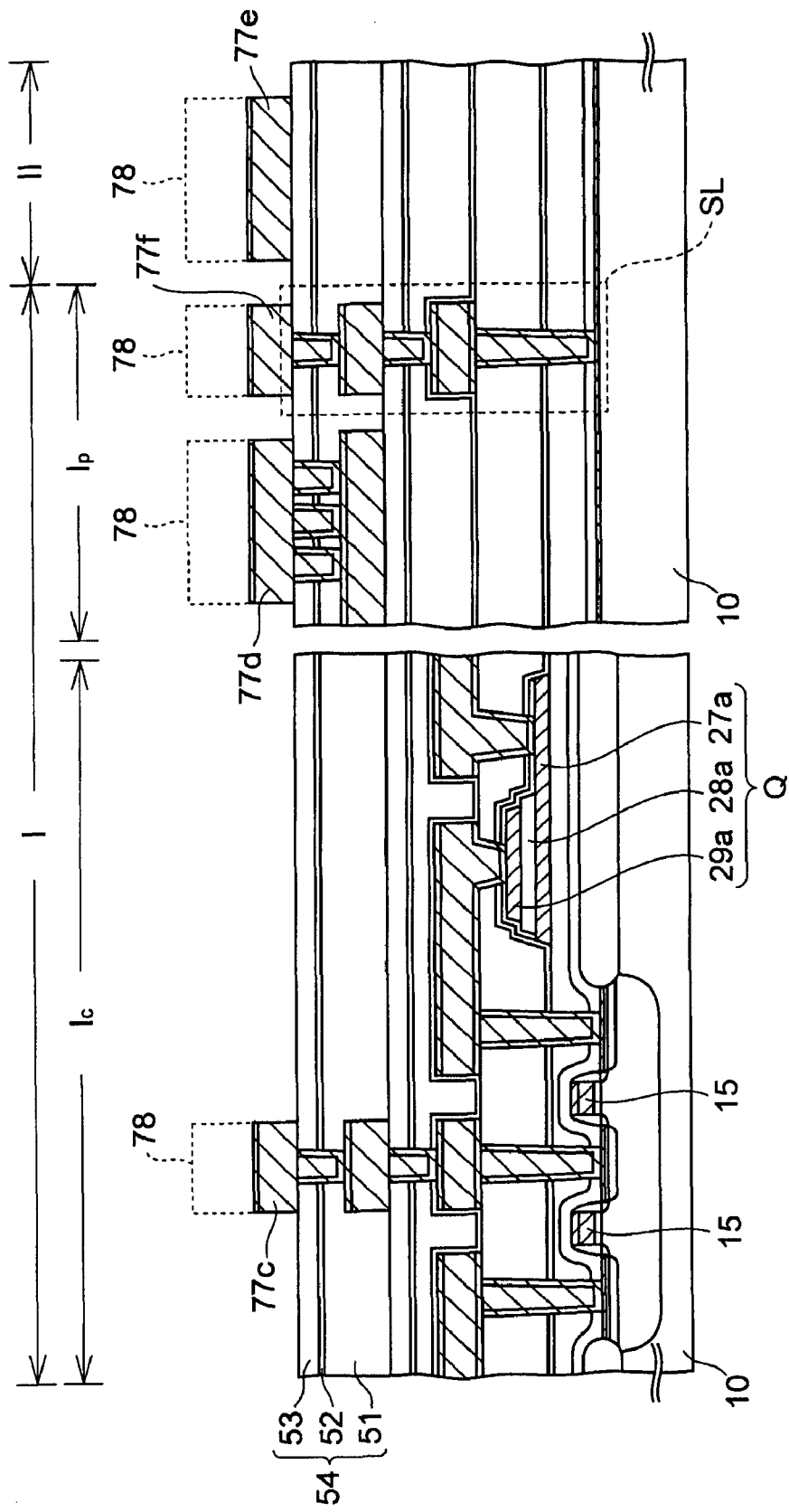

Thereafter, as shown in FIG. 10B, a fourth resist pattern 78 is formed on the first conductive film 77. Then, the first conductive film 77 is etched by using the fourth resist pattern 78 as a mask to form a third metal wiring 77*c* in the chip region $I_c$.

In addition, first and second lower conductor patterns 77*d* and 77*e* are formed in the peripheral region $I_p$ and the scribe region II by the etching, and a block conductive film 77*f*, which is electrically isolated from the lower conductor patterns 77*d* and 77*e*, is formed in the peripheral region $I_p$.

Thereafter, the fourth resist pattern 78 is removed.

Figure 13:
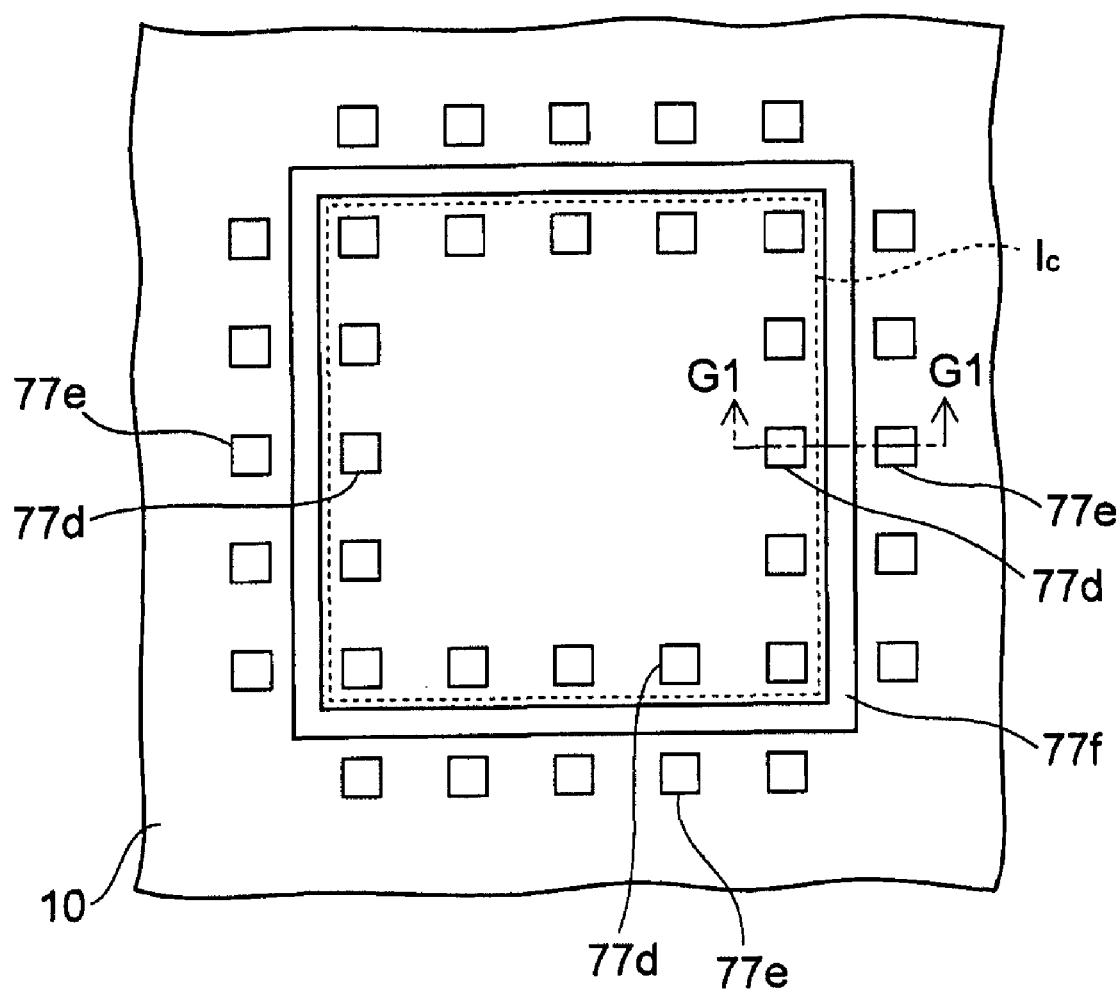
FIG. 13 is an enlarged plan view showing a planar layout of first and second conductor patterns and a block conductive film in the semiconductor wafer device according to the second embodiment.

FIG. 13 is an enlarged plan view showing a planar layout of the first and second lower conductor patterns 77*d* and 77*e*, and the block conductive film 77*f*. The respective cross-sections of the peripheral region $I_p$ and the scribe region II in the above-described FIG. 10B correspond to the cross-sectional view taken along the G1-G1 line in FIG. 13.

As shown in FIG. 13, the first and second lower conductor patterns 77*d* and 77*e* respectively formed in the regions $I_p$ and II have planar shapes in the form of islands corresponding to each of an electrode pad and test pad to be formed later in these regions.

On the other hand, the block conductive film 77*f* is formed in a ring shape like the seal ring SL formed thereunder.

Figure 10C:
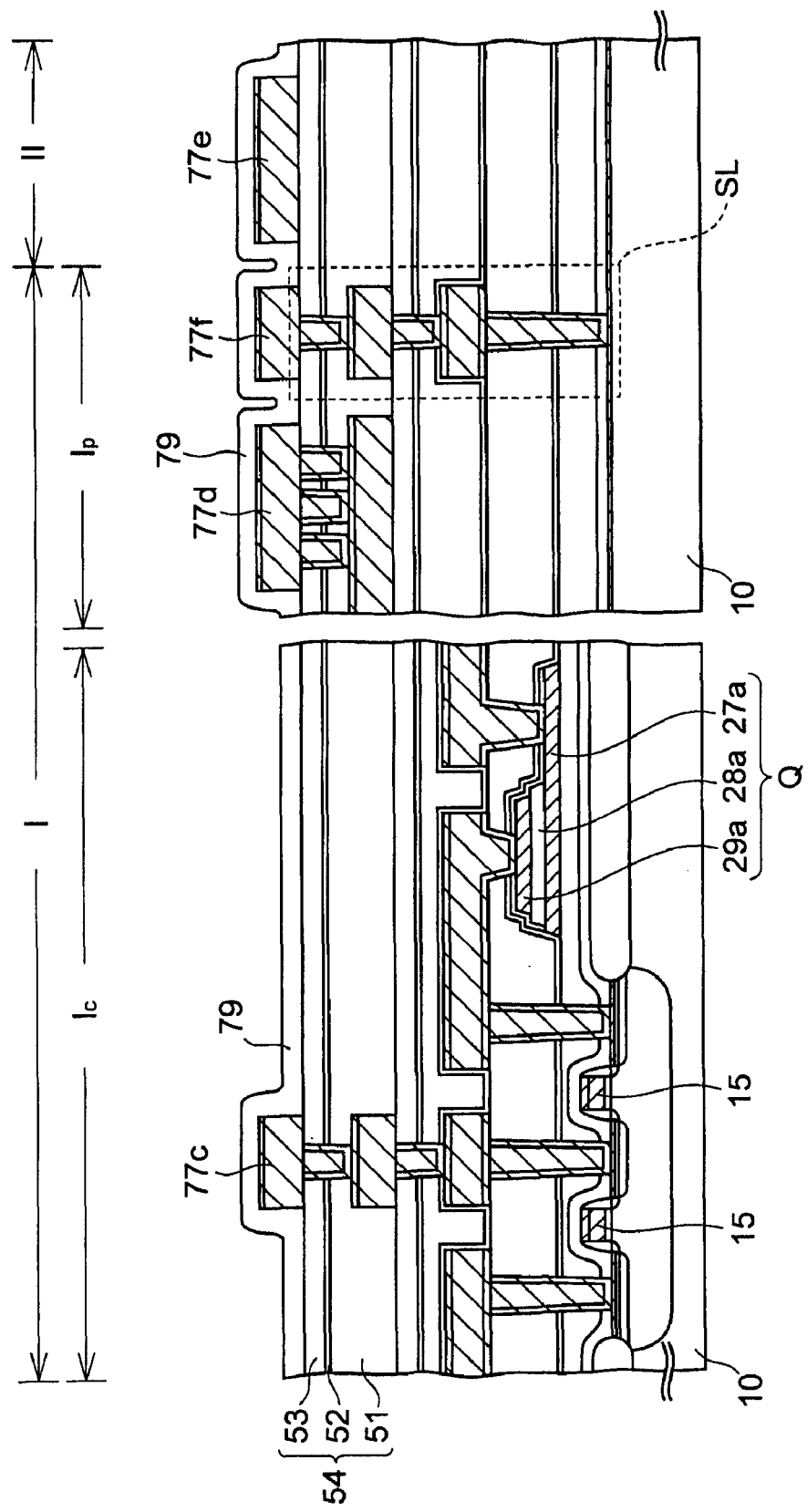

Next, as shown in FIG. 10C, a silicon oxide film is formed, by the CVD method using the TEOS gas, with a thickness of approximately 100 nm on the entire upper surface of the silicon substrate 10. The resultant silicon oxide film is set to be a first passivation film 79.

Figure 10D:
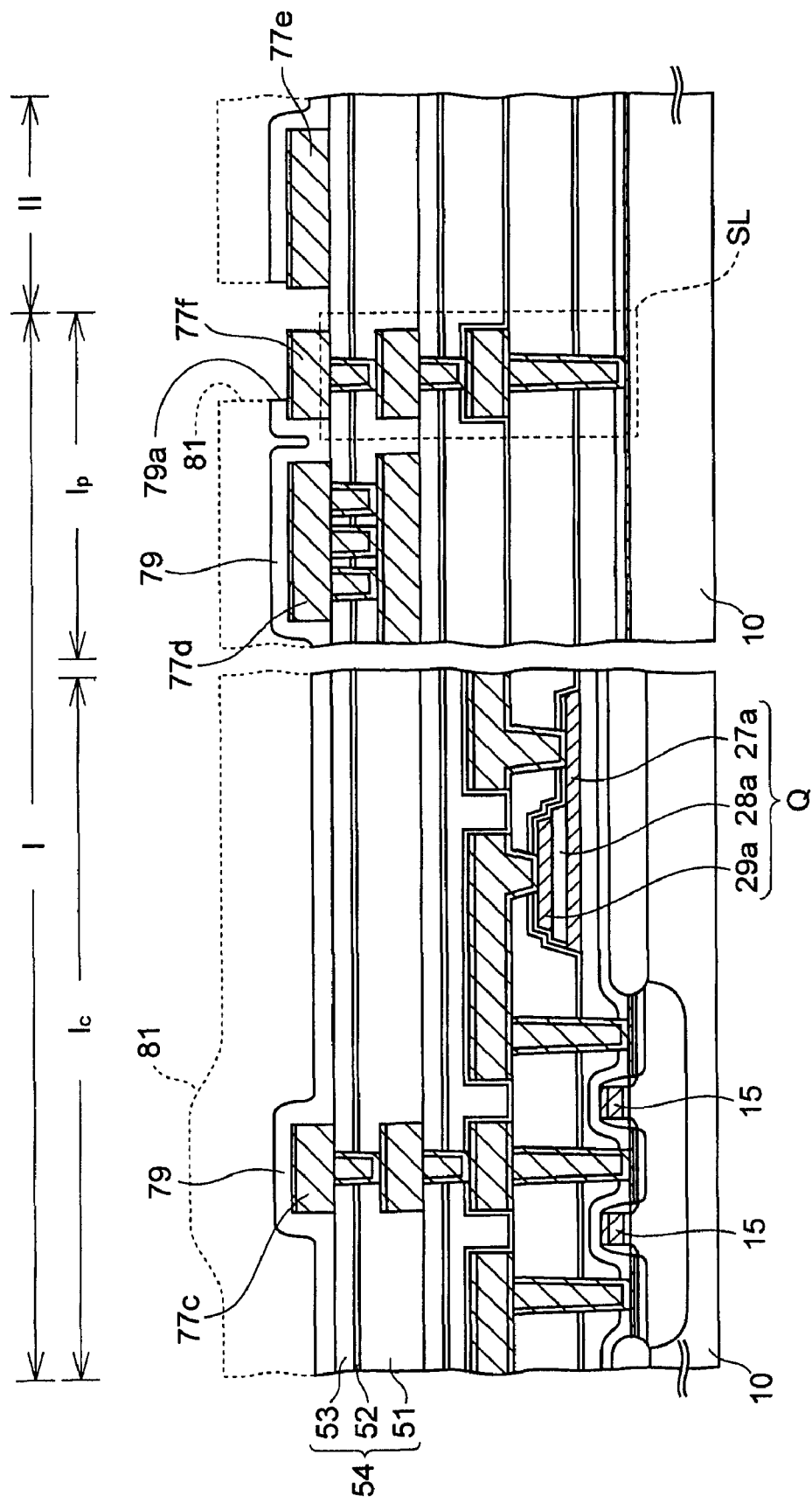

Subsequently, as shown in FIG. 10D, a fifth resist pattern 81 is formed on the first passivation film 79.

After that, the first passivation film 79 is etched by using the fifth resist pattern 81 as a mask to form a slit 79*a*.

A portion closer to the scribe region II of the upper and side surfaces of the block conductive film 77*f* are exposed from the slit 79*a*.

Thereafter, the fifth resist pattern 81 is removed.

Figure 10E:
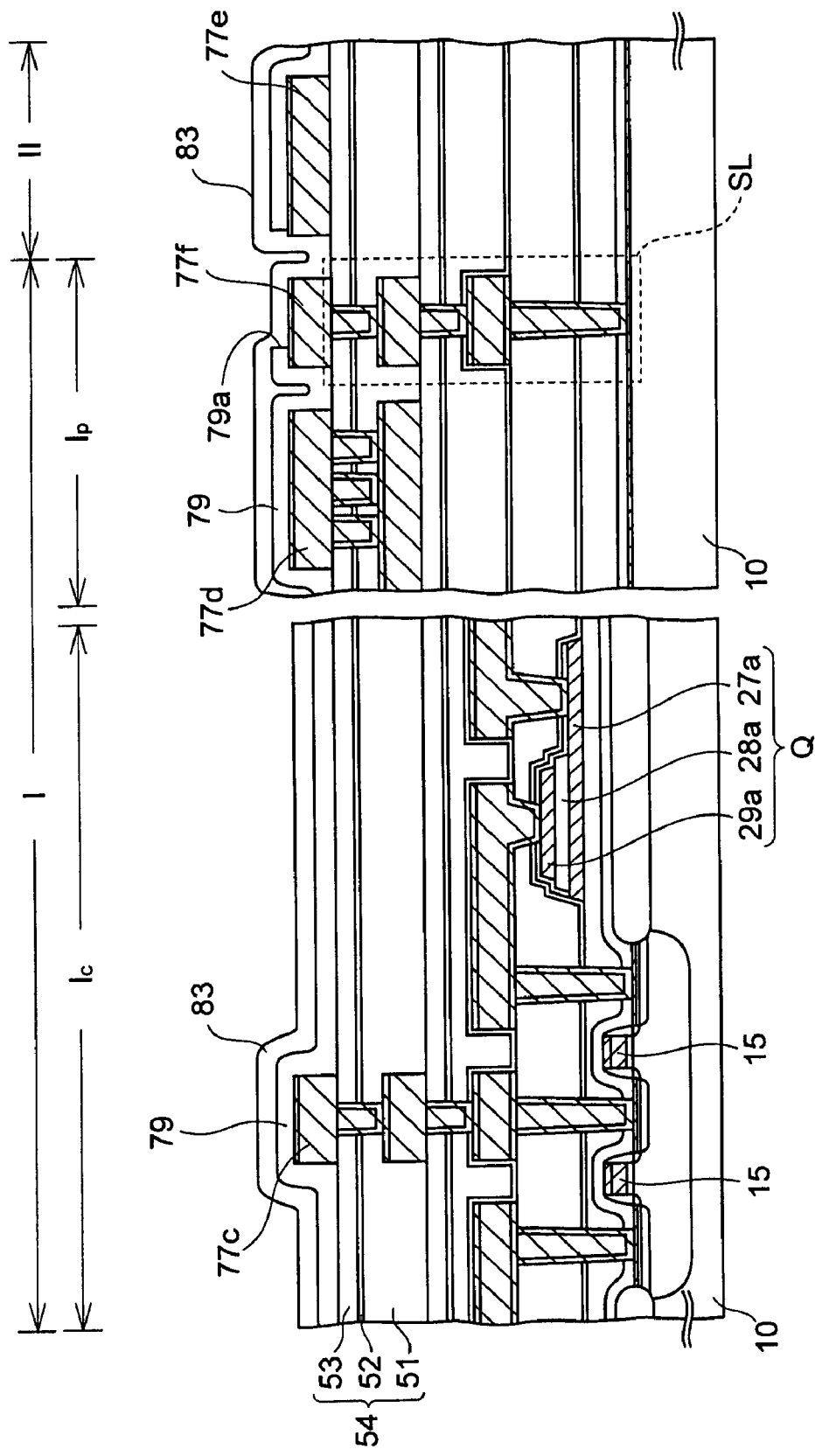

Next, as shown in FIG. 10E, a silicon oxynitride film is formed, by the CVD method, with a thickness of approximately 150 nm on the first passivation film 79. The resultant silicon oxynitride film is set to be a block insulating film 83.

The silicon oxynitride film forming the block insulating film 83 has the excellent blocking capability against penetration of reducing materials, such as hydrogen and moisture. The films having such a function include a silicon nitride film, an alumina film, and a titanium oxide film, in addition to the silicon oxynitride film, and any of these films may be used to form the block insulating film 83.

Figure 10F:
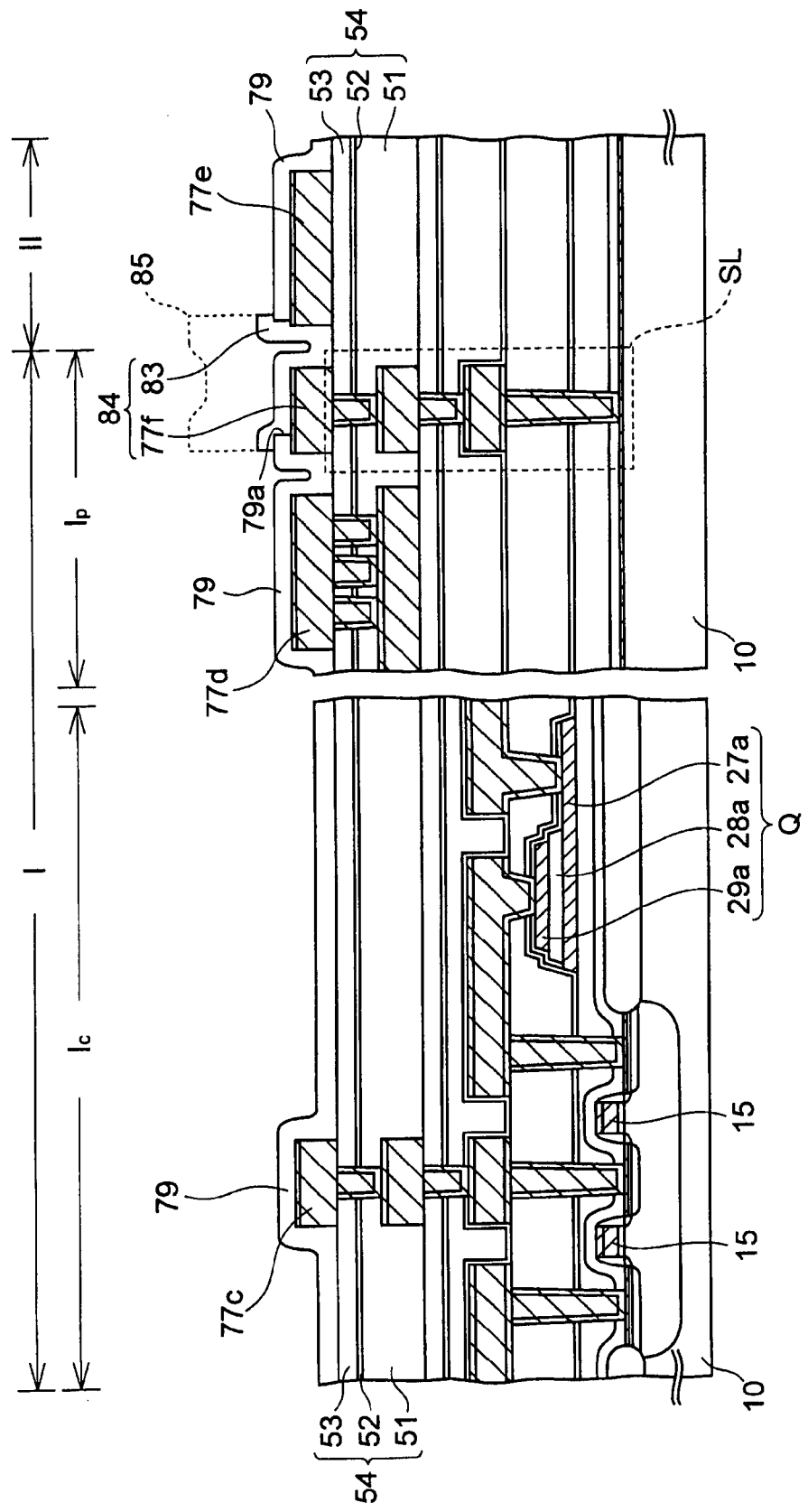

Subsequently, as shown in FIG. 10F, a sixth resist pattern 85 is formed on the block insulating film 83, and then the block insulating film 83 is selectively etched by using the sixth resist pattern 85 as a mask. Thereby, the block insulating film 83 is left only on the upper and side surfaces of the block conductive film 77*f* closer to the scribe region II, and on the third interlayer insulating film 54 beside the side surface of the block conductive film 77*f*.

The block insulating film 83 left as described above forms a block film 84, together with the block conductive film 77*f* formed thereunder. Thereby, the block insulating film 83 functions to prevent reducing materials, such as moisture, from entering from a dicing surface to be described later.

Thereafter, the sixth resist pattern 85 is removed.

Figure 14:
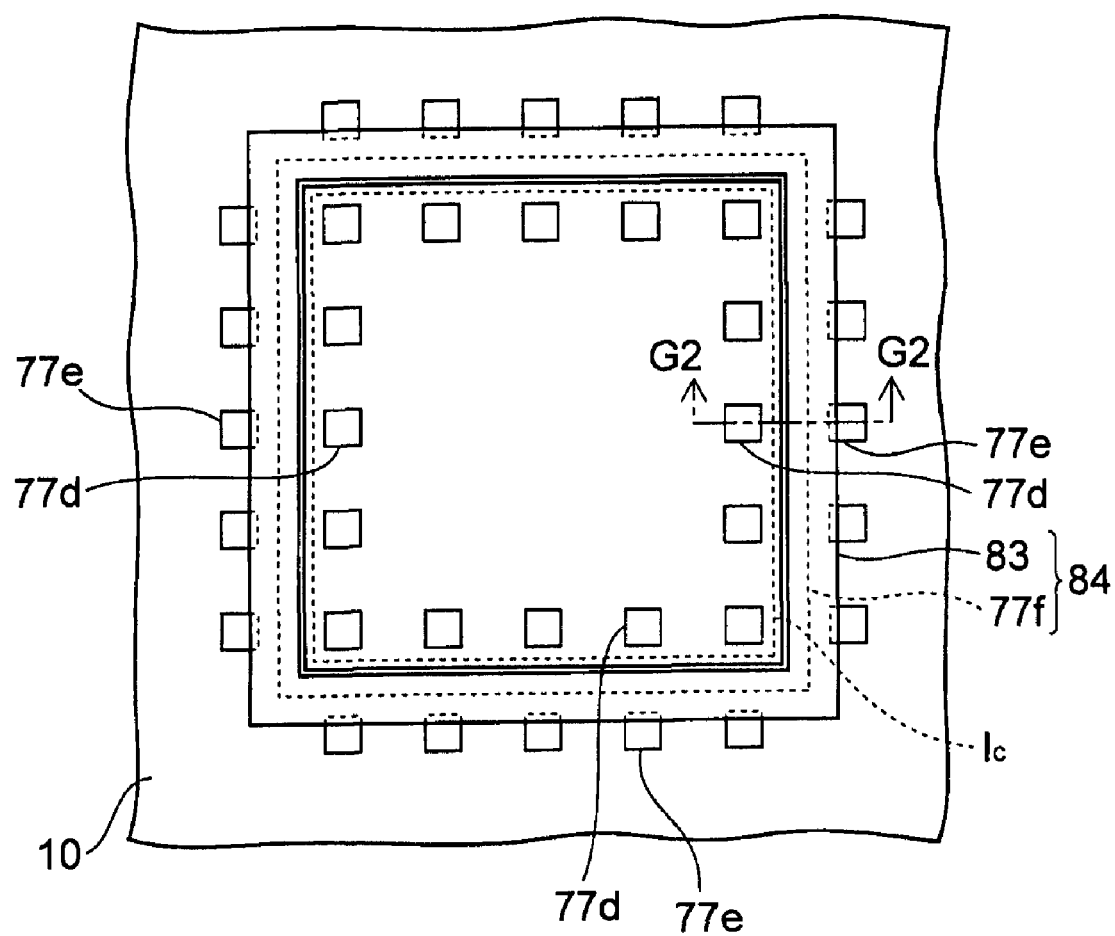
FIG. 14 is an enlarged plan view showing a planar layout of the block film in the semiconductor wafer device according to the second embodiment.

FIG. 14 is an enlarged cross-sectional view showing a planar layout of the block film 84. The respective cross-sections of the peripheral region $I_p$ and the scribe region II in the above-described FIG. 10F correspond to the cross-sectional view taken along the G2-G2 line in FIG. 14.

As shown in FIG. 14, the block film 84 has a planar shape in the form of a ring, surrounding the chip region $I_c$ like the seal ring SL.

Figure 10G:
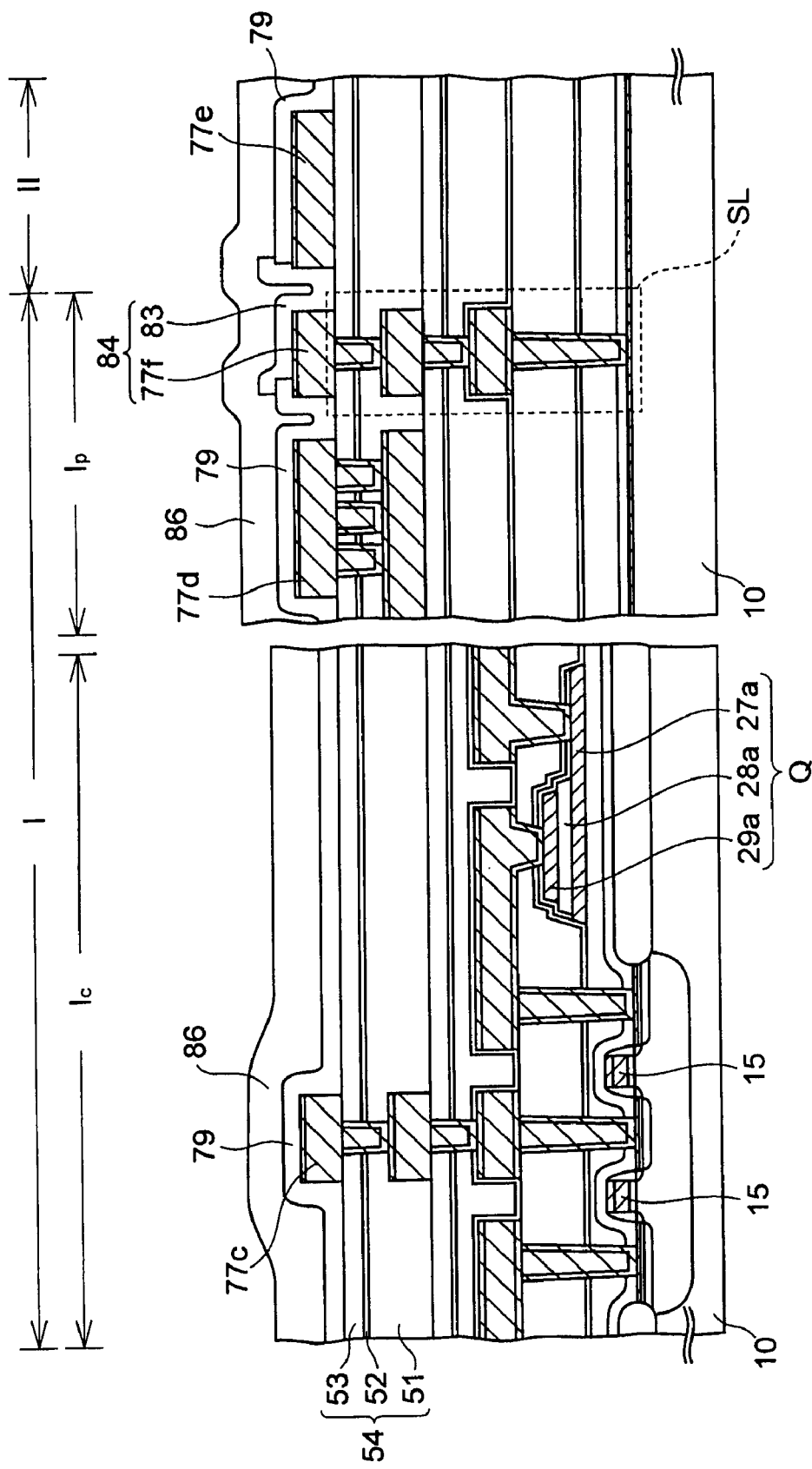

Next, as shown in FIG. 10G, a silicon nitride film is formed, by the plasma CVD method, with a thickness of approximately 350 nm on the entire upper surface of the silicon substrate 10 as a second passivation film 86.

Figure 10H:
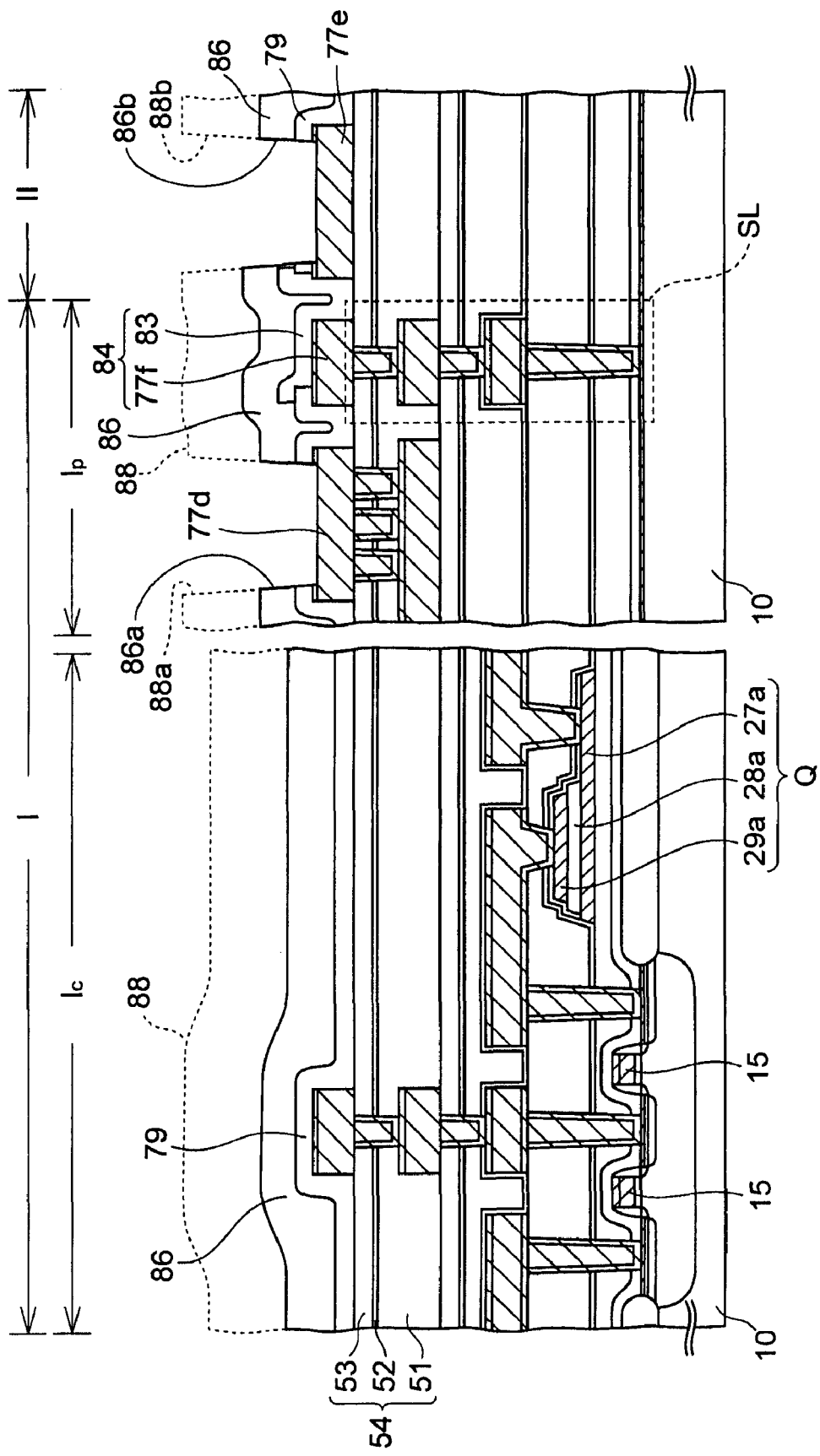

Next, processes for obtaining a cross-sectional structure shown in FIG. 10H will be described.

Firstly, the second passivation film 86 is coated with a photoresist. The coated photoresist is exposed and developed to form a seventh resist pattern 88 having first and second windows 88*a* and 88*b* in the peripheral region $I_p$ and the scribe region II, respectively.

Subsequently, by using the seventh resist pattern 88 as a mask, the mixed gas of $CHF_3$, $CF_4$, and $O_2$ is supplied to a parallel plate plasma etching device (unillustrated) as an etching gas to dry-etch the first and second passivation films 79 and 86. Thereby, third and fourth openings 86*a* and 86*b* are respectively formed in the first and second passivation films 79 and 86 on the first and second lower conductor patterns 77*d* and 77*e*.

In addition, during the dry etching, the titanium nitride film 77*b* (see FIG. 1A) forming each of the lower conductor patterns 77*d* and 77*e* is also etched. Thereby, a clean surface of the aluminum 77*a* film is exposed.

Thereafter, the seventh resist pattern 88 is removed.

Figure 10I:
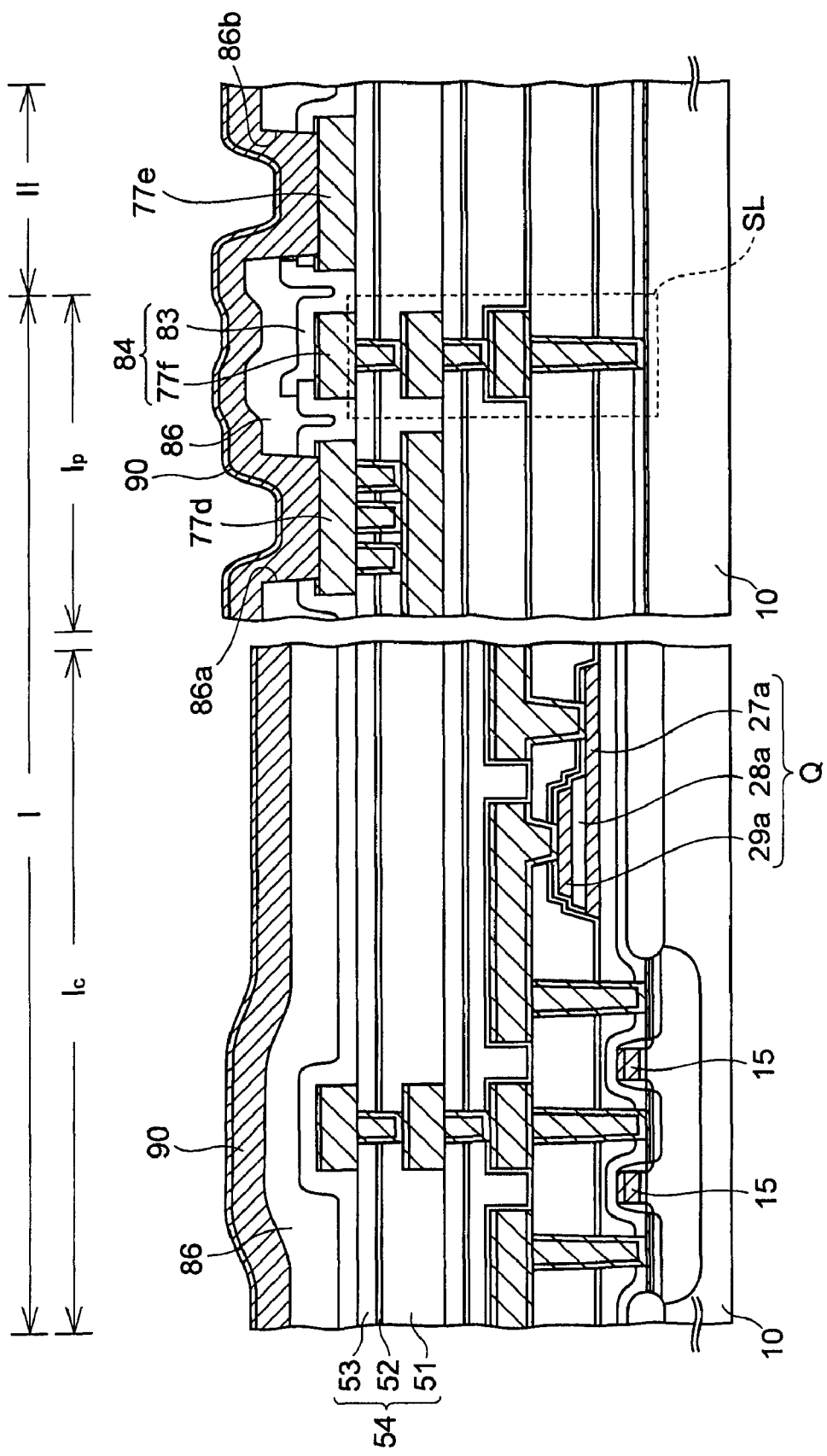

Next, as shown in FIG. 10I, a metal laminated film is formed, by the sputtering method, as a second conductive film 90 on the second passivation film 86 and inside the first and second openings 86*a* and 86*b*. The metal laminated film is formed of, for example, a copper-containing aluminum film with a thickness of approximately 500 nm and a titanium nitride film with a thickness of approximately 150 nm from the bottom thereof.

Figure 10J:
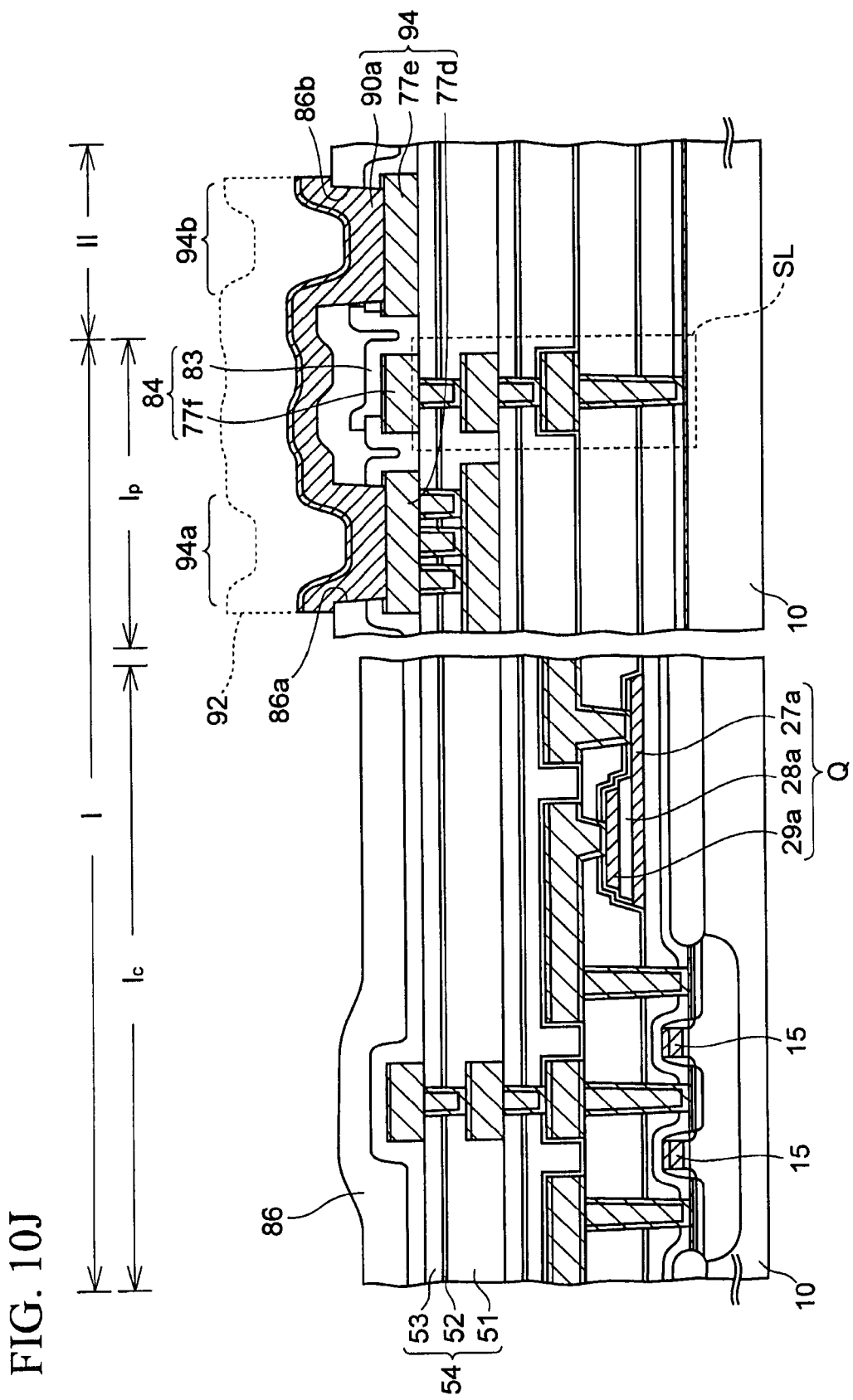

Subsequently, as shown in FIG. 10J, an eighth resist pattern 92 is formed on the second conductive film 90.

Then, an upper conductor pattern 90*a* is formed in the peripheral region $I_p$ and the scribe region II by selectively etching the second conductive film 90 using the eighth resist pattern 92 as a mask. The upper conductor pattern 90a is electrically connected to the first and second lower conductor patterns 77d and 77e.

The upper conductor pattern 90a forms an electrode conductor pattern 94, together with each of the first and second lower conductor patterns 77d and 77e formed thereunder.

Then, the electrode conductor pattern 94 in the peripheral region $I_p$ becomes an electrode pad 94a and the conductor pattern 90a in the scribe region II becomes a test pad 94b.

Thereafter, the eighth resist pattern is removed.

Figure 15:
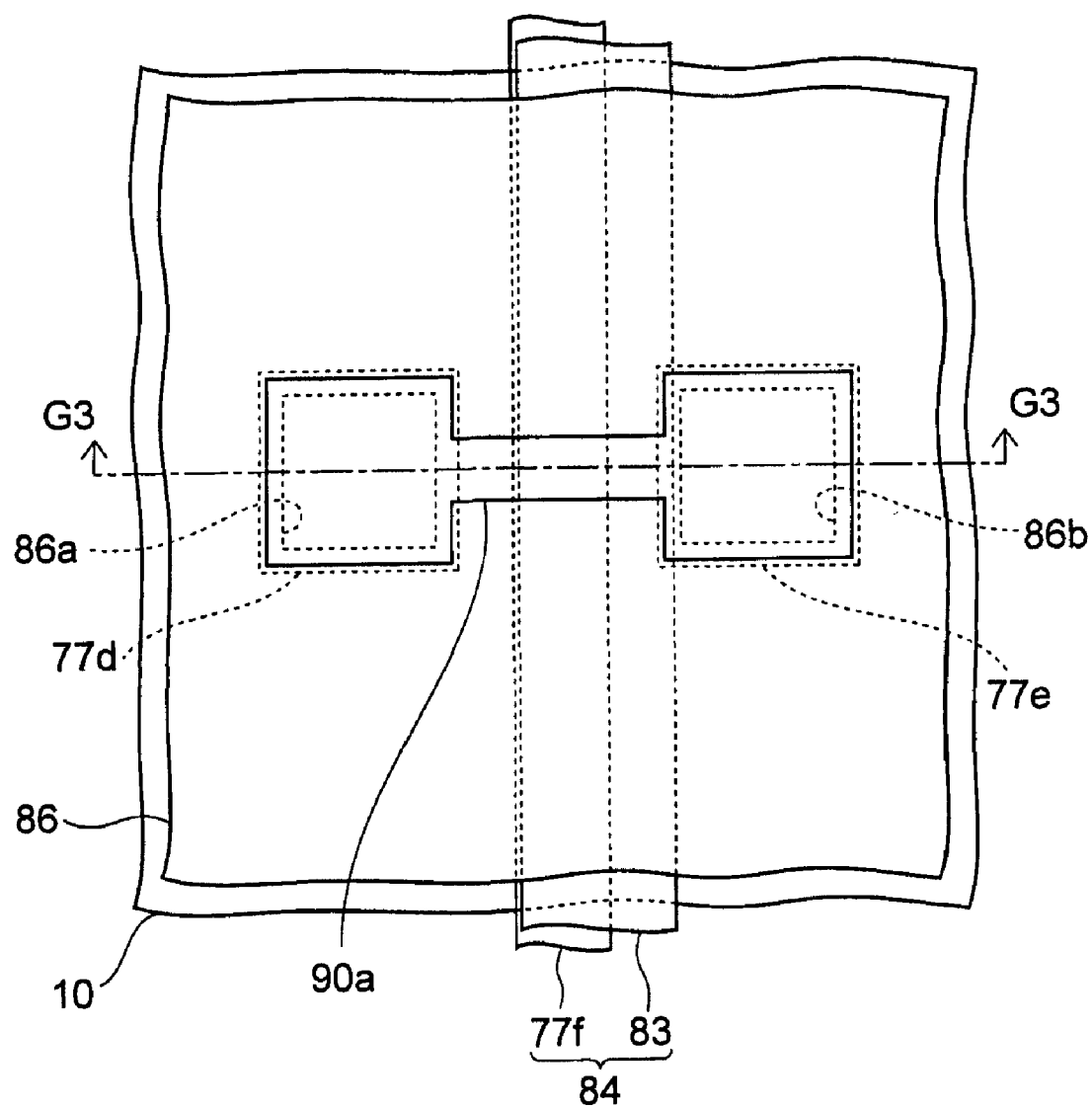
FIG. 15 is an enlarged plan view in a vicinity of the conductor pattern after the process shown in FIG. 10J is finished in the second embodiment.

FIG. 15 is an enlarged plan view in a vicinity of the conductor pattern 90a after the process is finished. The respective cross-sections of the peripheral region $I_p$ and the scribe region II in the above-described FIG. 10J correspond to the cross-sectional view taken along the G3-G3 line in FIG. 15.

Next, processes for obtaining a cross-sectional structure shown in FIG. 10K will be described.

Firstly, a photosensitive polyimide is coated onto the second passivation film 86 and into each of the first and second openings 86a and 86b to form a polyimide coating film with a thickness of approximately 3 µm. Subsequently, this polyimide coating film is exposed and developed. After that, the polyimide coating film is heated in a horizontal furnace with the nitrogen atmosphere to be cured. The conditions for curing correspond to the substrate temperature of 310° C., the flow rate of nitrogen of 100 litters per minute, and the processing time of 40 minutes.

Figure 10K:
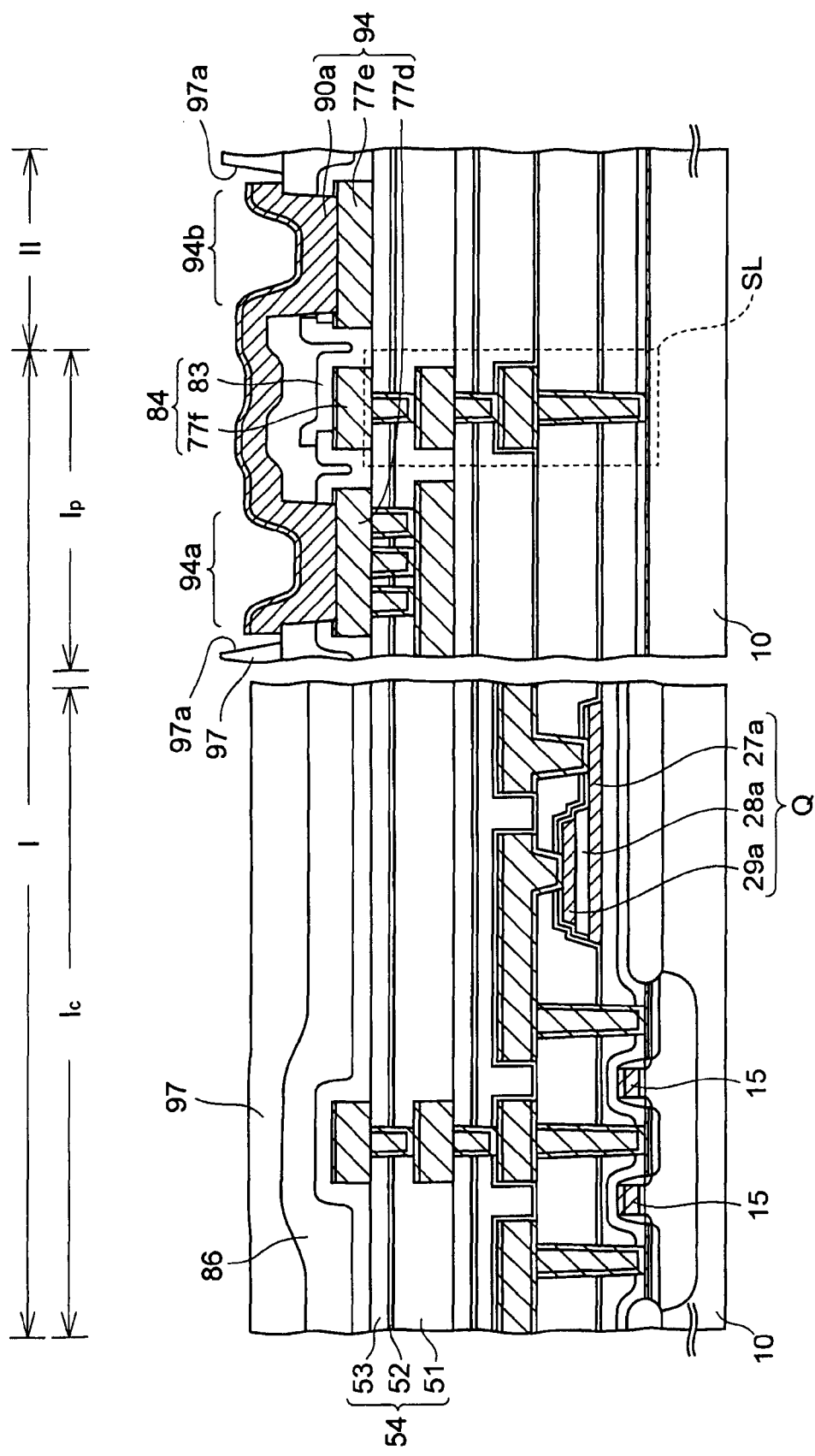

Thereby, as shown in FIG. 10K, a protection insulating film 97 provided with a fifth opening 97a is formed above each of the electrode pad 94a and the test pad 94b.

With the processes described so far, the basic structure of the semiconductor wafer structure according to the present embodiment is completed.

In the semiconductor wafer structure, similar to the case shown in FIG. 9 of the first embodiment, a plurality of chip regions I are defined in the silicon substrate 10.

From here, the process is followed by a test process and a dicing process similar to the first embodiment. These processes will be described by referring to FIGS. 11 and 12.

Figure 11:
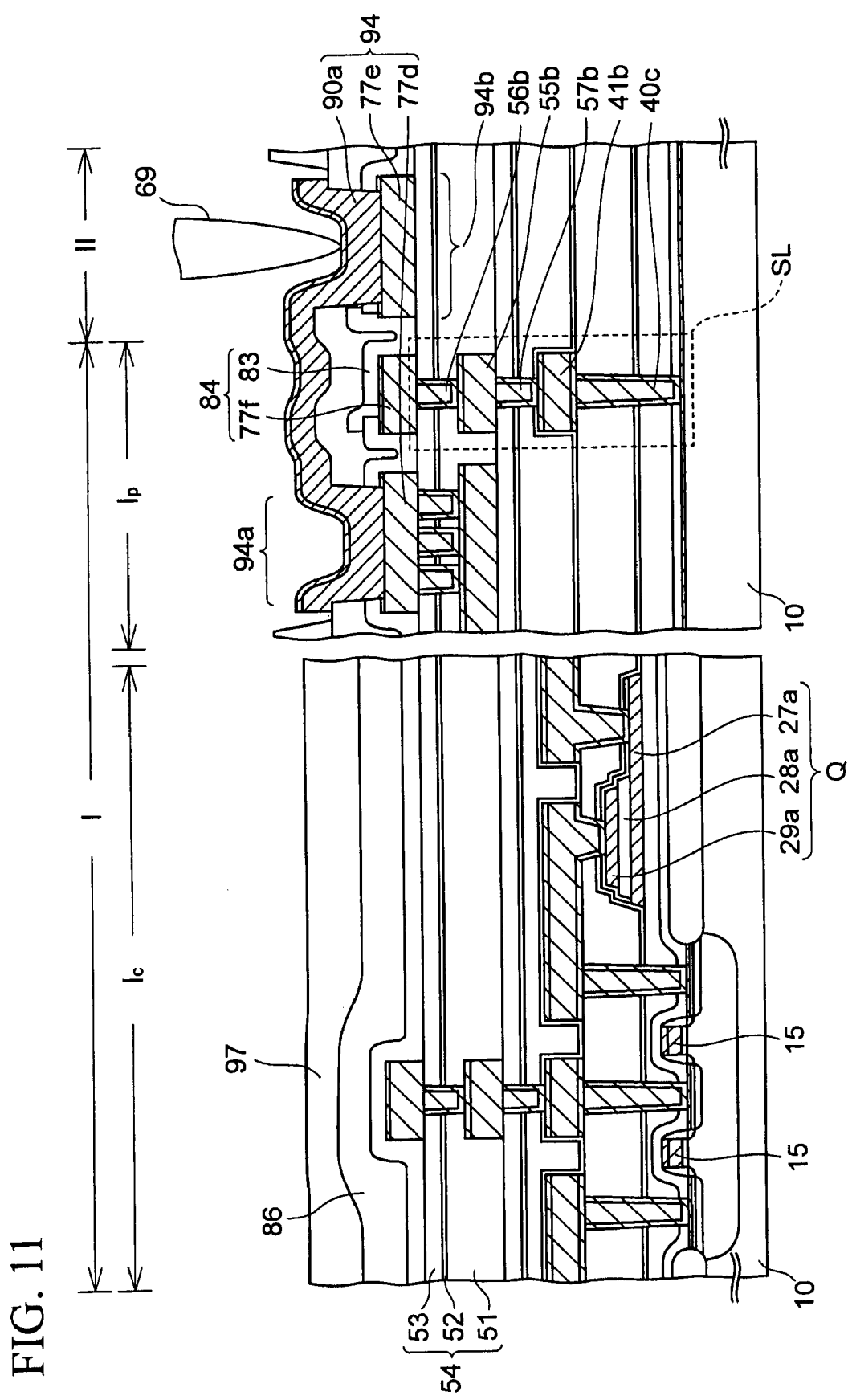
FIG. 11 is a cross-sectional view of a process of a test on the semiconductor wafer structure according to the second embodiment.

Firstly, in the test process, as shown in FIG. 11, a probe 69 is brought into contact with the test pad 94b formed in the scribe region II so as to test at the wafer level if the circuit formed in the circuit region $I_c$ normally operates.

Figure 12:
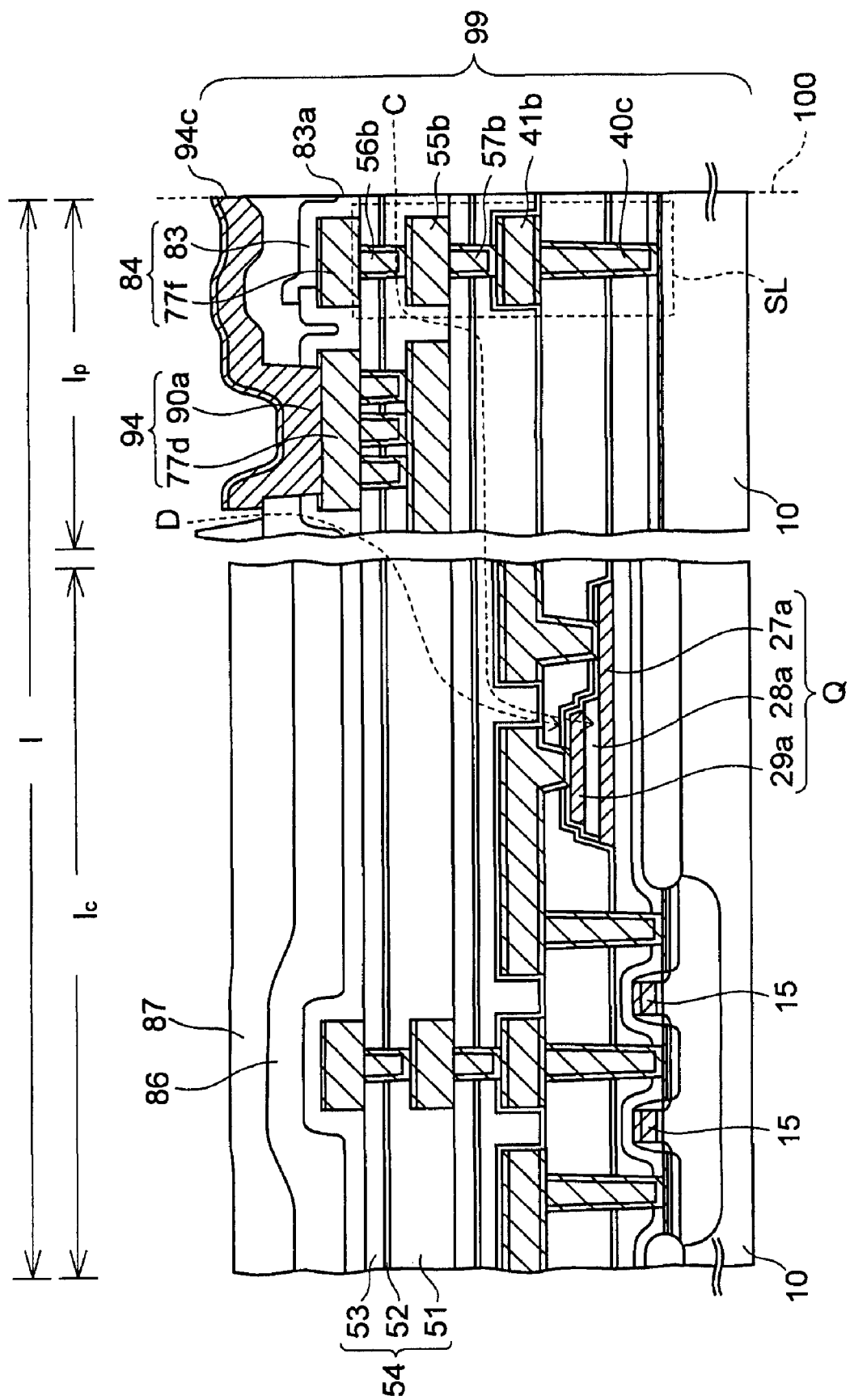
FIG. 12 is a cross-sectional view of a process of dicing on a semiconductor wafer device according to the second embodiment.

Then, if standing the test at the wafer level, dicing is carried out along the scribe region II to obtain a plurality of semiconductor chips (semiconductor devices) 99 as shown in FIG. 12.

During the dicing, the test pad 94b formed in the scribe region II (see FIG. 11) is cut, and thus the cross-section 94c of the electrode conductor pattern 94 is exposed to a dicing surface 100. In addition, the block insulating film 83 is also cut and the cross-section 83a thereof is exposed to the dicing surface 100.

As described above, the main processes of the present embodiment are finished.

According to the present embodiment, as shown in FIG. 11, the electrode conductor pattern 94 is provided with the electrode pad 94a and the test pad 94b, and the test pad 94b is brought into contact with the probe 69 at the time of testing. Accordingly, similar to the first embodiment, the electrode pad 94a does not receive mechanical damages by the probe 69, so that the electrode pad 94a does not receive damages at the time of testing. The result does not lead to formation of a moisture-penetration path extending from the circumference of the electrode pad 94a to the capacitor dielectric film 28a, as observed in the case where damages or the like are generated in the electrode pad 94a. As a result, the capacitor dielectric film 28a can be prevented from deteriorating in the test at the wafer level.

Furthermore, similar to the first embodiment, the seal ring SL is formed with the height that reaches the upper surface of the third interlayer insulting film 54. Thereby, even after the dicing is carried out like FIG. 12, the lateral penetration path like the path C, through which reducing materials enter, can be cut off.

Moreover, a laminated film including the third capacitor protection film 52 is formed as the third interlayer insulating film 54. Accordingly, reducing materials from above can be effectively prevented from coming into contact with the capacitor dielectric film 28a through the path D.

The block conductive film 77f forming the block film 84 is electrically isolated from the first and second lower conductor patterns 77d and 77e. Accordingly, even when the test is carried out like FIG. 11, a test current supplied from the probe 69 does not flow through the seal ring SL, and a desired test current can be supplied to the circuit in the circuit forming region $I_c$.

(3) COMPARATIVE EXAMPLE

Figure 16:
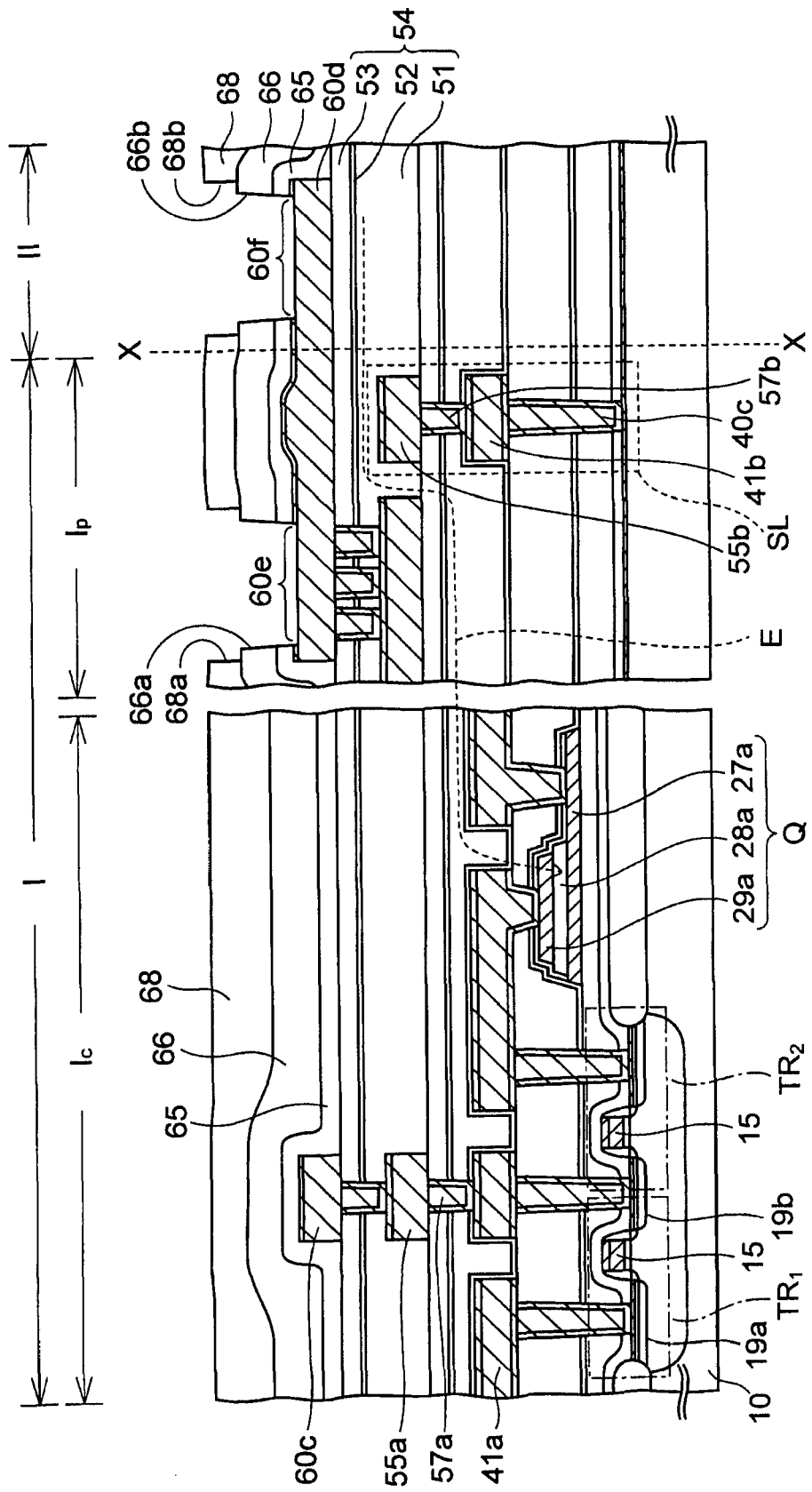
FIG. 16 is a cross-sectional view of a semiconductor wafer structure according to a comparative example.

FIG. 16 is a cross-sectional view of a semiconductor wafer structure according to a comparative example. Note that, in FIG. 16, the same reference numerals are given to denote the same components as those of the first embodiment, and the description thereof will be omitted.

As shown in FIG. 16, in this comparative example, the height of a seal ring SL is lower than the upper surface of a third interlayer insulating film 54.

Accordingly, in the dicing process, when a semiconductor wafer structure is subjected to dicing along the X-X line in the figure, reducing materials, such as moisture, come in contact with a capacitor dielectric film 28a by entering from the cross-section of the third interlayer insulating film 54 exposed to a dicing surface through a path E. As a result, the capacitor dielectric film 28a is reduced and deteriorated.

In contrast, in the above-described first and second embodiments, the seal ring SL is formed with the height that reaches the upper surface of the third interlayer insulating film 54 being the uppermost interlayer insulating film. Thus, the penetration path E as shown in FIG. 16 is not generated, and the deterioration of the capacitor dielectric film 28a after dicing can be prevented.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
    a semiconductor substrate having a circuit forming region and a peripheral region;
    a base insulating film formed over the semiconductor substrate;
    a capacitor formed of a lower electrode, a capacitor dielectric film made of a ferroelectric material, and an upper electrode in this order over the base insulating film in the circuit forming region;
    an uppermost interlayer insulating film formed over the capacitor;

a seal ring formed over the semiconductor substrate in the peripheral region, the seal ring having a height that reaches at least an upper surface of the interlayer insulating film, and surrounding the circuit forming region;
a block film formed over the seal ring and the interlayer insulating film in the circumference of the seal ring; and
an electrode conductor pattern which is formed over the interlayer insulating film in the peripheral region, the electrode conductor pattern having an electrode pad, and having a cross-section exposed to a dicing surface,
wherein the block film is separated from the electrode pad.

2. The semiconductor device according to claim 1, wherein the seal ring is formed by alternately laminating a fence-shaped conductive plug and a ring-shaped conductor pattern, and the seal ring has the fence-shaped conductive plug in an uppermost layer.

3. The semiconductor device according to claim 1, wherein the block film is in the form of a ring surrounding the chip region.

4. The semiconductor device according to claim 1, wherein the block film is formed of a single-layer insulating film.

5. The semiconductor device according to claim 1, wherein the block film is formed by forming a block conductive film and a block insulating film in this order.

6. The semiconductor device according to claim 1, wherein the interlayer insulating film is formed of a laminated film including a capacitor protection insulating film.

7. The semiconductor device according to claim 2, wherein the fence-shaped conductive plug contains tungsten and the ring-shaped conductor pattern contains aluminum.

8. The semiconductor device according to claim 4, wherein the block film is one of a silicon nitride film, a silicon oxynitride film, an alumina film, and a titanium oxide film.

9. The semiconductor device according to claim 4, wherein the electrode conductor pattern is also formed over the block film.

10. The semiconductor device according to claim 4, wherein the electrode conductor pattern is formed of a metal laminated film including an aluminum film.

11. The semiconductor device according to claim 5, wherein the block film is also formed on a side surface of the block conductive film and on the interlayer insulating film beside the side surface, where the side surface being closer to the dicing surface among side surfaces of the block insulating film, and a cross-section of the block insulating film is exposed to the dicing surface.

12. The semiconductor device according to claim 5, wherein the block conductive film is formed of a metal laminated film including an aluminum film, and the block insulating film is any one of a silicon nitride film, a silicon oxynitride film, an alumina film, and a titanium oxide film.

13. The semiconductor device according to claim 5, further comprising:
a lower conductor pattern formed over the interlayer insulating film;
a passivation film formed over the interlayer insulating film and the block film, the passivation film having an opening over the lower conductor pattern; and
an upper conductor pattern formed over the passivation film and over the lower conductor pattern in the opening,
wherein the electrode conductor pattern is formed of the lower conductor pattern and the upper conductor pattern.

14. The semiconductor device according to claim 6, wherein the capacitor protection insulating film is one of an alumina film and a titanium oxide film.

15. The semiconductor device according to claim 13, wherein each of the lower conductor pattern and the upper conductor pattern is formed of a metal laminated film including an aluminum film.

16. A semiconductor wafer structure comprising:
a semiconductor substrate having a chip region and a scribe region;
a base insulating film formed over the semiconductor substrate;
a capacitor formed of a lower electrode, a capacitor dielectric film made of a ferroelectric material, and an upper electrode in this order over the base insulating film in a circuit forming region of the chip region;
an uppermost interlayer insulating film formed over the capacitor;
a seal ring formed over the semiconductor substrate in a peripheral region of the chip region, the seal ring having a height that reaches at least an upper surface of the interlayer insulating film, and surrounding the circuit forming region;
a block film formed over the seal ring and over the interlayer insulating film in the circumference of the seal ring; and
an electrode conductor pattern formed over the interlayer insulating film and the block film, the electrode conductor pattern extending from the peripheral region to the scribe region, and having an electrode pad in the peripheral region and a test pad in the scribe region, and having a cross-section exposed to a dicing surface,
wherein the block film is separated from the electrode pad.

17. The semiconductor wafer structure according to claim 16, wherein the seal ring is formed by alternately laminating a fence-shaped conductive plug and a ring-shaped conductor pattern and has the fence-shaped conductive plug in an uppermost layer.

18. The semiconductor wafer structure according to claim 16, wherein the block film is a single-layer insulating film formed of any one of a silicon nitride film, a silicon oxynitride film, an alumina film, and a titanium oxide film.

19. The semiconductor wafer structure according to claim 16, wherein the block film is formed by forming a block conductive film and a block insulating film in this order.

20. A method for manufacturing a semiconductor wafer structure, comprising:
forming a base insulating film over a semiconductor substrate having a chip region and a scribe region;
forming a capacitor by stacking a lower electrode, a capacitor dielectric film made of a ferroelectric material, and an upper electrode in this order over the base insulating film in a circuit forming region of the chip region;
forming an uppermost interlayer insulating film over the capacitor;
forming, over the semiconductor substrate in a peripheral region of the chip region, a seal ring which has a height that reaches at least an upper surface of the interlayer insulating film and surrounds the circuit forming region;
forming a block film over the seal ring and over the interlayer insulating film in the circumference the seal ring; and
forming, over the interlayer insulating film and the block film, an electrode conductor pattern that extends from the peripheral region to the scribe region, the electrode conductor pattern having an electrode pad in the peripheral region and a test pad in the scribe region, and having a cross-section exposed to a dicing surface,
wherein the block film is separated from the electrode pad.

* * * * *